US012635583B2

(12) United States Patent
Smith

(10) Patent No.: US 12,635,583 B2
(45) Date of Patent: May 19, 2026

(54) SEQUENTIAL COMPLIMENTARY FET INCORPORATING BACKSIDE POWER DISTRIBUTION NETWORK THROUGH WAFER BONDING PRIOR TO FORMATION OF ACTIVE DEVICES

(71) Applicant: Tokyo Electron Limited, Tokyo (JP)

(72) Inventor: Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 407 days.

(21) Appl. No.: 18/319,823

(22) Filed: May 18, 2023

(65) Prior Publication Data

US 2023/0378138 A1 Nov. 23, 2023

Related U.S. Application Data

(60) Provisional application No. 63/344,141, filed on May 20, 2022.

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/056* (2026.01); *H10W 20/081* (2026.01);
(Continued)

(58) Field of Classification Search
CPC . H10W 90/00; H10W 20/056; H10W 20/081; H10W 20/42; H01L 21/76895
See application file for complete search history.

(56) References Cited

U.S. PATENT DOCUMENTS 8,466,036 B2 6/2013 Brindle et al.
8,481,405 B2 7/2013 Arriagada et al.
(Continued)

FOREIGN PATENT DOCUMENTS

CN 111430356 B * 5/2021 ............. H01L 25/18
CN 119153514 A * 12/2024 ............. H01L 24/08
(Continued)

OTHER PUBLICATIONS

International Search Report and Written Opinion issued on Sep. 20, 2023 in PCT/US2023/022667, 19 pages.

*Primary Examiner* — Laura M Menz
(74) *Attorney, Agent, or Firm* — Oblon, McClelland, Maier & Neustadt, L.L.P.

(57) ABSTRACT

A semiconductor device includes backside power rails over a bulk semiconductor material, a first bonding dielectric layer over the backside power rails, a first tier of transistors over the first bonding dielectric layer, a second bonding dielectric layer over the first tier of transistors, and a second tier of transistors over the second bonding dielectric layer. The first tier of transistors includes first channel structures having a first epitaxially grown semiconductor material. The second tier of transistors includes second channel structures having a second epitaxially grown semiconductor material. The backside power rails are spaced apart from the first tier of transistors by the first bonding dielectric layer. The first tier of transistors is spaced apart from the second tier of transistors by the second bonding dielectric layer.

13 Claims, 46 Drawing Sheets

(51) Int. Cl.

| | |
|---|---|
| *H10W 20/41* | (2026.01) |
| *H10W 20/42* | (2026.01) |
| *H10P 90/00* | (2026.01) |
| *H10W 10/10* | (2026.01) |
| *H10W 72/00* | (2026.01) |
| *H10W 72/90* | (2026.01) |
| *H10W 90/26* | (2026.01) |

(52) U.S. Cl.

CPC ......... *H10W 20/42* (2026.01); *H10W 20/427* (2026.01); *H10P 90/1914* (2026.01); *H10W 10/181* (2026.01); *H10W 72/0198* (2026.01); *H10W 72/953* (2026.01); *H10W 90/26* (2026.01); *H10W 90/732* (2026.01)

(56) References Cited

U.S. PATENT DOCUMENTS

| | | | | |
|---|---|---|---|---|
| 8,536,021 | B2 | 9/2013 | Arriagada et al. | |
| 8,581,398 | B2 | 11/2013 | Arriagada et al. | |
| 8,765,563 | B2 | 7/2014 | Pillarisetty et al. | |
| 8,835,281 | B2 | 9/2014 | Brindle et al. | |
| 9,064,697 | B2 | 6/2015 | Arriagada et al. | |
| 9,153,434 | B2 | 10/2015 | Brindle et al. | |
| 9,391,173 | B2 | 7/2016 | Fogel et al. | |
| 9,443,854 | B2 | 9/2016 | Greene et al. | |
| 9,515,139 | B2 | 12/2016 | Arriagada et al. | |
| 9,536,879 | B2 | 1/2017 | Greene et al. | |
| 9,553,013 | B2 | 1/2017 | Stuber et al. | |
| 9,558,951 | B2 | 1/2017 | Arriagada et al. | |
| 9,570,558 | B2 | 2/2017 | Brindle et al. | |
| 9,576,806 | B2 | 2/2017 | Fogel et al. | |
| 9,624,096 | B2 | 4/2017 | Stuber | |
| 9,634,007 | B2 | 4/2017 | Pillarisetty et al. | |
| 9,673,197 | B2 | 6/2017 | Greene et al. | |
| 9,741,807 | B2 | 8/2017 | Fogel et al. | |
| 9,754,860 | B2 | 9/2017 | Molin et al. | |
| 9,783,414 | B2 | 10/2017 | Stuber | |
| 9,853,101 | B2 | 12/2017 | Peng et al. | |
| 10,037,912 | B2 | 7/2018 | Hsiao et al. | |
| 10,411,135 | B2 | 9/2019 | Moroz et al. | |
| 10,483,157 | B2 | 11/2019 | Hsiao et al. | |
| 10,535,732 | B2 | 1/2020 | Peng et al. | |
| 10,586,765 | B2 * | 3/2020 | Smith | H01L 23/535 |
| 10,714,391 | B2 | 7/2020 | Smith et al. | |
| 10,727,110 | B2 | 7/2020 | Hsiao et al. | |
| 10,727,298 | B2 | 7/2020 | Peng et al. | |
| 10,741,558 | B2 | 8/2020 | Chiang et al. | |
| 10,770,479 | B2 * | 9/2020 | Smith | H10D 84/907 |
| 10,867,841 | B2 | 12/2020 | Hsiao et al. | |
| 10,896,931 | B1 | 1/2021 | Sekar et al. | |
| 10,910,364 | B2 | 2/2021 | Or-Bach et al. | |
| 10,923,598 | B2 | 2/2021 | Wang et al. | |
| 10,943,934 | B2 * | 3/2021 | Or-Bach | H10F 39/021 |
| 10,950,736 | B2 | 3/2021 | Moroz et al. | |
| 10,978,501 | B1 | 4/2021 | Or-Bach et al. | |
| 10,991,626 | B2 | 4/2021 | Smith et al. | |
| 10,998,374 | B1 * | 5/2021 | Or-Bach | H10F 39/021 |
| 11,004,719 | B1 | 5/2021 | Or-Bach et al. | |
| 11,018,042 | B1 * | 5/2021 | Or-Bach | H10D 88/00 |
| 11,018,133 | B2 | 5/2021 | Or-Bach et al. | |
| 11,018,191 | B1 | 5/2021 | Sekar et al. | |
| 11,024,673 | B1 | 6/2021 | Or-Bach et al. | |
| 11,031,275 | B2 | 6/2021 | Or-Bach et al. | |
| 11,043,506 | B2 | 6/2021 | Huo et al. | |
| 11,043,523 | B1 | 6/2021 | Or-Bach et al. | |
| 11,063,071 | B1 | 7/2021 | Or-Bach et al. | |
| 11,094,576 | B1 | 8/2021 | Or-Bach et al. | |
| 11,101,266 | B2 | 8/2021 | Or-Bach et al. | |
| 11,107,721 | B2 | 8/2021 | Or-Bach et al. | |
| 11,121,021 | B2 | 9/2021 | Or-Bach et al. | |
| 11,133,344 | B2 * | 9/2021 | Or-Bach | H01L 23/544 |
| 11,133,351 | B2 | 9/2021 | Sekar et al. | |
| 11,158,674 | B2 | 10/2021 | Or-Bach et al. | |
| 11,163,112 | B2 | 11/2021 | Or-Bach et al. | |
| 11,164,770 | B1 * | 11/2021 | Or-Bach | H01L 21/6835 |
| 11,164,898 | B2 * | 11/2021 | Or-Bach | H01L 25/167 |
| 11,189,522 | B2 | 11/2021 | Hsiao et al. | |
| 11,211,279 | B2 | 12/2021 | Or-Bach et al. | |
| 11,217,472 | B2 * | 1/2022 | Or-Bach | H10P 72/74 |
| 11,227,897 | B2 | 1/2022 | Sekar et al. | |
| 11,257,867 | B1 | 2/2022 | Sekar et al. | |
| 11,264,274 | B2 * | 3/2022 | Smith | H10D 84/0149 |
| 11,309,385 | B2 | 4/2022 | Peng et al. | |
| 11,315,965 | B2 | 4/2022 | Or-Bach et al. | |
| 11,315,980 | B1 | 4/2022 | Sekar et al. | |
| 11,322,401 | B2 | 5/2022 | Smith et al. | |
| 11,327,227 | B2 | 5/2022 | Or-Bach et al. | |
| 11,335,731 | B1 | 5/2022 | Sekar et al. | |
| 11,342,214 | B1 | 5/2022 | Or-Bach et al. | |
| 11,355,380 | B2 | 6/2022 | Or-Bach et al. | |
| 11,355,381 | B2 | 6/2022 | Or-Bach et al. | |
| 11,374,042 | B1 | 6/2022 | Or-Bach et al. | |
| 11,374,118 | B2 | 6/2022 | Or-Bach et al. | |
| 11,404,466 | B2 | 8/2022 | Or-Bach et al. | |
| 11,443,971 | B2 | 9/2022 | Or-Bach et al. | |
| 11,482,438 | B2 | 10/2022 | Or-Bach et al. | |
| 11,482,439 | B2 | 10/2022 | Or-Bach et al. | |
| 11,482,440 | B2 | 10/2022 | Or-Bach et al. | |
| 11,495,484 | B2 | 11/2022 | Or-Bach et al. | |
| 11,521,888 | B2 | 12/2022 | Or-Bach et al. | |
| 11,605,630 | B2 | 3/2023 | Or-Bach et al. | |
| 11,637,207 | B2 | 4/2023 | Wang et al. | |
| 11,652,141 | B2 | 5/2023 | Peng et al. | |
| 11,769,728 | B2 * | 9/2023 | Park | H01L 21/76898 257/621 |
| 11,984,401 | B2 * | 5/2024 | Xie | H10D 64/017 |
| 12,176,348 | B2 * | 12/2024 | Bao | H10D 84/856 |
| 12,279,452 | B2 * | 4/2025 | Cheng | H10D 30/6757 |
| 2014/0319698 | A1 | 10/2014 | Molin et al. | |
| 2016/0293428 | A1 | 10/2016 | Fogel et al. | |
| 2016/0329428 | A1 | 11/2016 | Greene et al. | |
| 2017/0101309 | A1 | 4/2017 | Stuber | |
| 2017/0162453 | A1 | 6/2017 | Pillarisetty et al. | |
| 2018/0182898 | A1 | 6/2018 | Moroz et al. | |
| 2018/0350685 | A1 | 12/2018 | Or-Bach et al. | |
| 2018/0374791 | A1 * | 12/2018 | Smith | H01L 23/535 |
| 2019/0288004 | A1 * | 9/2019 | Smith | H10D 84/907 |
| 2020/0058653 | A1 | 2/2020 | Chiang et al. | |
| 2020/0135854 | A1 | 4/2020 | Peng et al. | |
| 2020/0303256 | A1 | 9/2020 | Smith et al. | |
| 2020/0357684 | A1 | 11/2020 | Hsiao | |
| 2021/0098294 | A1 | 4/2021 | Smith et al. | |
| 2021/0098306 | A1 * | 4/2021 | Smith | H10D 84/0149 |
| 2021/0104534 | A1 | 4/2021 | Huo et al. | |
| 2021/0125852 | A1 | 4/2021 | Or-Bach et al. | |
| 2021/0159109 | A1 | 5/2021 | Or-Bach et al. | |
| 2021/0159110 | A1 | 5/2021 | Or-Bach et al. | |
| 2021/0167218 | A1 | 6/2021 | Wang et al. | |
| 2021/0193498 | A1 | 6/2021 | Or-Bach et al. | |
| 2021/0217643 | A1 | 7/2021 | Or-Bach et al. | |
| 2021/0242068 | A1 | 8/2021 | Or-Bach et al. | |
| 2021/0249296 | A1 | 8/2021 | Or-Bach et al. | |
| 2021/0257244 | A1 | 8/2021 | Or-Bach et al. | |
| 2021/0272835 | A1 | 9/2021 | Or-Bach et al. | |
| 2021/0272976 | A1 | 9/2021 | Huo et al. | |
| 2021/0296155 | A1 | 9/2021 | Or-Bach et al. | |
| 2021/0320026 | A1 | 10/2021 | Or-Bach et al. | |
| 2022/0130905 | A1 | 4/2022 | Sekar et al. | |
| 2022/0157723 | A1 * | 5/2022 | Park | H01L 21/76898 |
| 2022/0165602 | A1 | 5/2022 | Or-Bach et al. | |
| 2022/0173213 | A1 * | 6/2022 | Lan | H10D 30/62 |
| 2022/0181186 | A1 | 6/2022 | Or-Bach et al. | |
| 2022/0181187 | A1 | 6/2022 | Or-Bach et al. | |
| 2022/0208594 | A1 | 6/2022 | Or-Bach et al. | |
| 2022/0406715 | A1 * | 12/2022 | Xie | H10D 64/017 |
| 2023/0377983 | A1 * | 11/2023 | Smith | H10D 84/038 |
| 2023/0377985 | A1 * | 11/2023 | Smith | H10D 84/83 |
| 2023/0377998 | A1 * | 11/2023 | Smith | H01L 23/5286 |
| 2023/0378138 | A1 * | 11/2023 | Smith | H01L 23/5286 |
| 2023/0378170 | A1 * | 11/2023 | Smith | H10D 30/6757 |
| 2024/0379551 | A1 * | 11/2024 | Chien | H10D 64/017 |

(56) References Cited

U.S. PATENT DOCUMENTS

2025/0366032 A1* 11/2025 Chen .................. H10D 30/6713
2025/0366161 A1* 11/2025 Wang .................. H10D 30/019

FOREIGN PATENT DOCUMENTS

| | | | | | |
|---|---|---|---|---|---|
| CN | 119522486 | A | * | 2/2025 | ....... H01L 21/76897 |
| CN | 119604019 | A | * | 3/2025 | ......... H10D 84/0188 |
| EP | 4300561 | A1 | * | 1/2024 | ......... H10D 30/0198 |
| JP | 2025517426 | A | * | 6/2025 | ....... H01L 21/76897 |
| KR | 20250011924 | A | * | 1/2025 | ....... H01L 21/76897 |
| TW | 202412180 | A | * | 3/2024 | ....... H01L 21/76897 |
| TW | 202501783 | A | * | 1/2025 | ............ H01L 25/50 |
| TW | I888157 | B | * | 6/2025 | ............ H01L 25/50 |
| WO | WO-2023225155 | A1 | * | 11/2023 | ....... H01L 21/76897 |

* cited by examiner

200A 219a
213a
231a 206
209a 241a
201
241b 219b
213b
231b

209b

Z
X
Y

200B

200B

300

Start

Bond a first wafer to a second wafer ⟿ S310

Form a first tier of transistors ⟿ S320

Bond a third wafer to the second wafer ⟿ S330

Form a second tier of transistors ⟿ S340

Form a power delivery network including buried power rails ⟿ S350

End

400

Start

↓

Form a first tier of transistors and a second tier of transistors over the first tier of transistors ~S410

↓

Form first via openings ~S420

↓

Form first local interconnect openings ~S430

↓

Form second via openings ~S440

↓

Form second local interconnect openings ~S450

↓

End

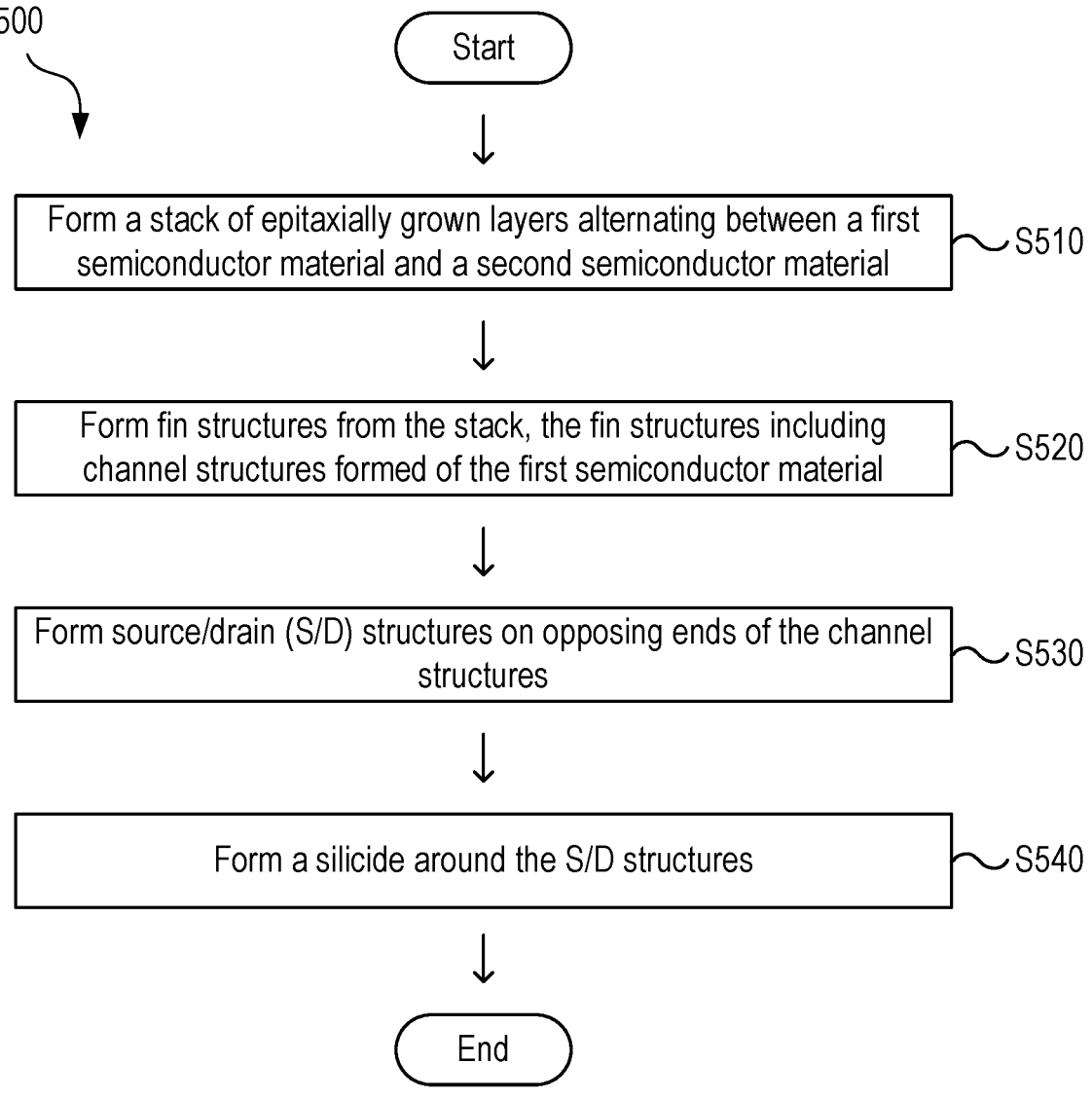

500

Start

↓

Form a stack of epitaxially grown layers alternating between a first semiconductor material and a second semiconductor material ~S510

↓

Form fin structures from the stack, the fin structures including channel structures formed of the first semiconductor material ~S520

↓

Form source/drain (S/D) structures on opposing ends of the channel structures ~S530

↓

Form a silicide around the S/D structures ~S540

↓

End

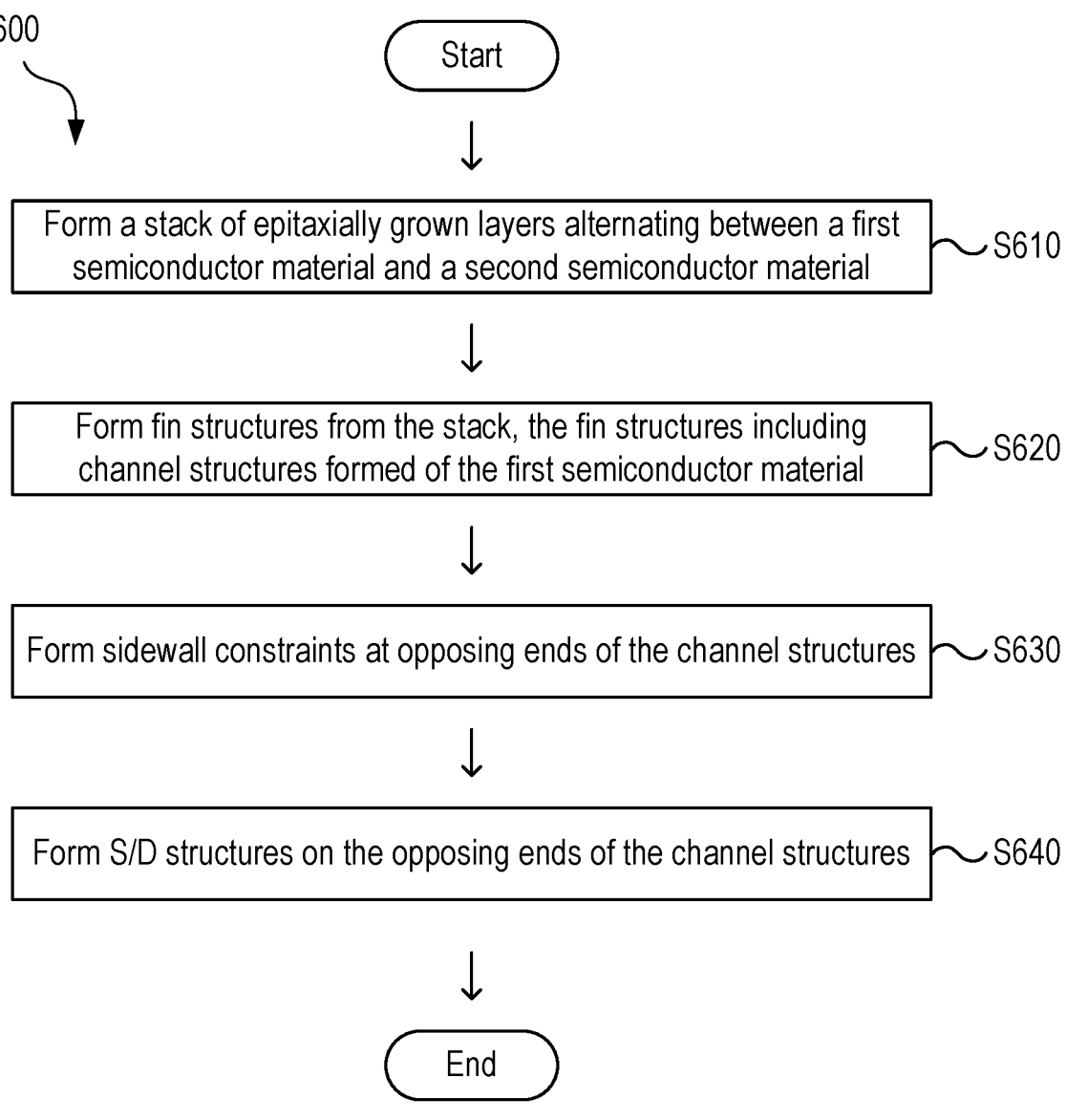

Start

↓

Form a stack of epitaxially grown layers alternating between a first semiconductor material and a second semiconductor material ∽S610

↓

Form fin structures from the stack, the fin structures including channel structures formed of the first semiconductor material ∽S620

↓

Form sidewall constraints at opposing ends of the channel structures ∽S630

↓

Form S/D structures on the opposing ends of the channel structures ∽S640

↓

End

Figure 6

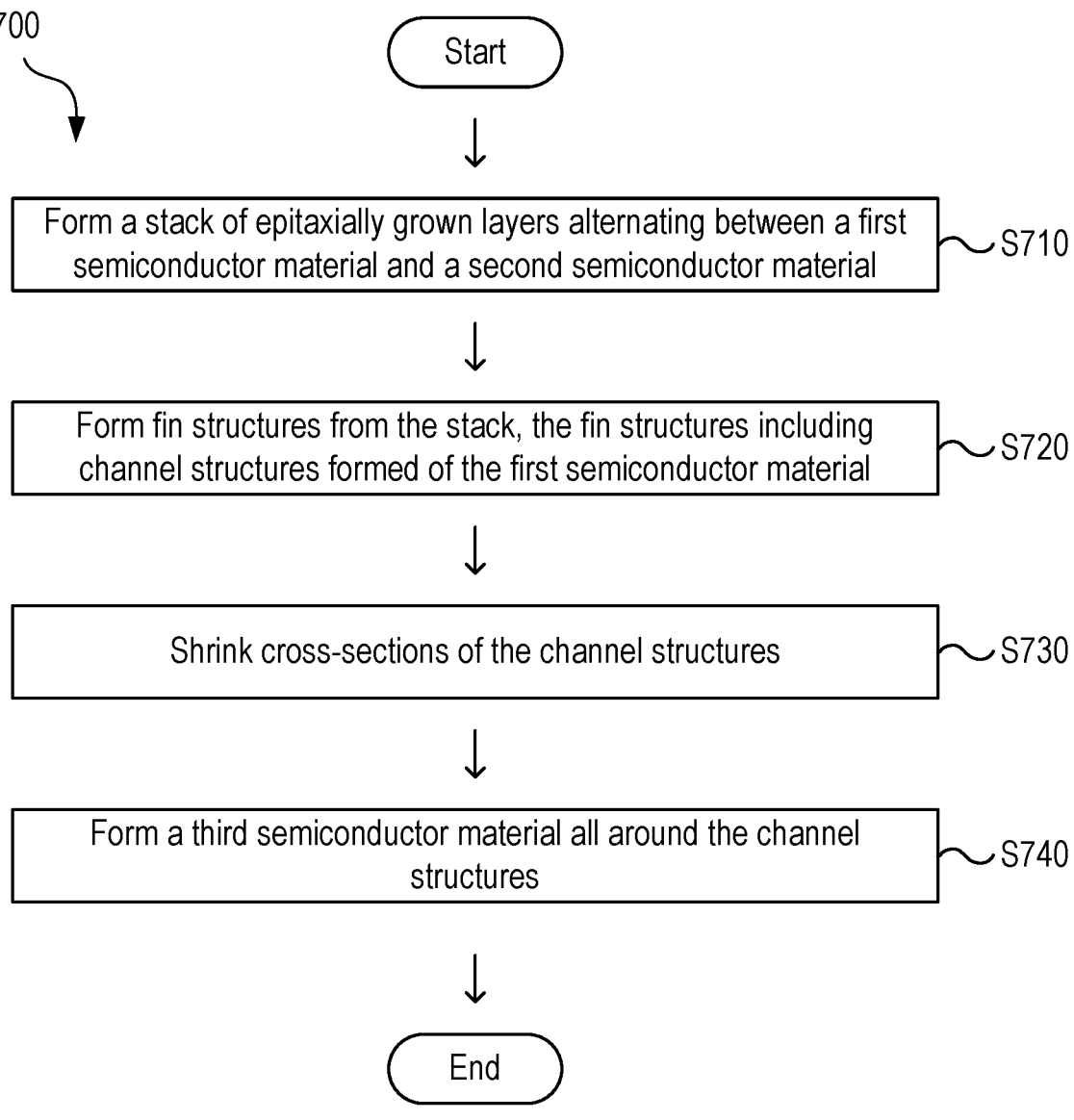

700

Start

↓

Form a stack of epitaxially grown layers alternating between a first semiconductor material and a second semiconductor material ~S710

↓

Form fin structures from the stack, the fin structures including channel structures formed of the first semiconductor material ~S720

↓

Shrink cross-sections of the channel structures ~S730

↓

Form a third semiconductor material all around the channel structures ~S740

↓

End

Figure 7

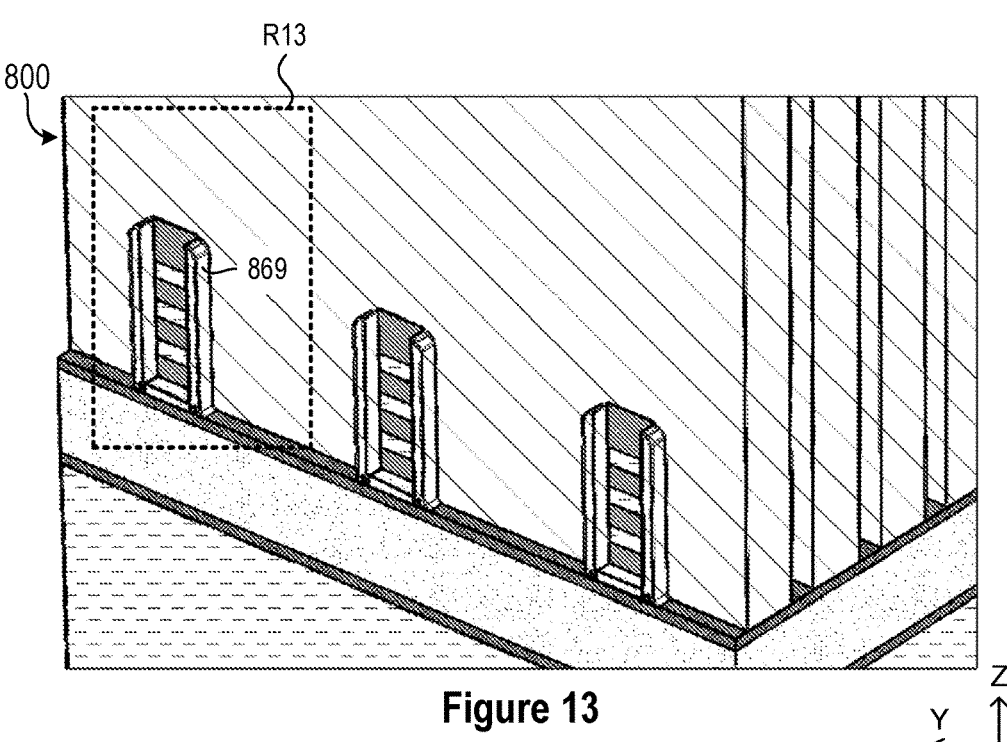
Figure 13
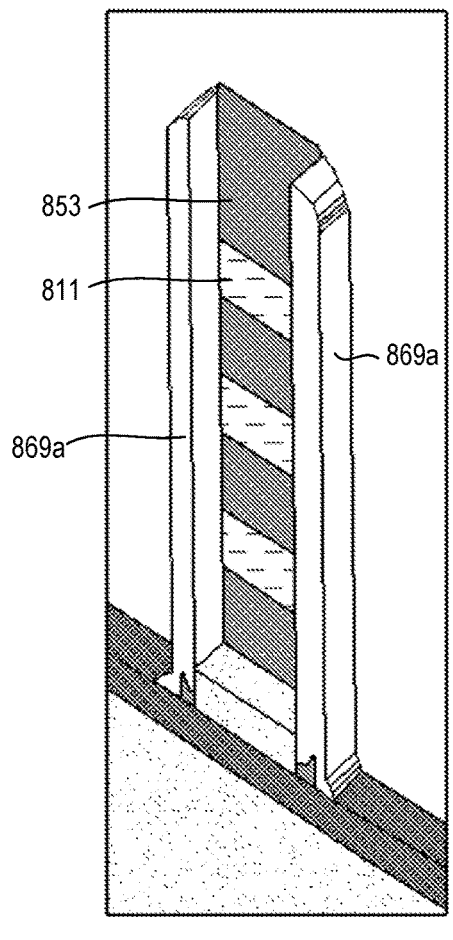
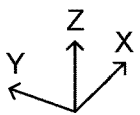
Figure 13B

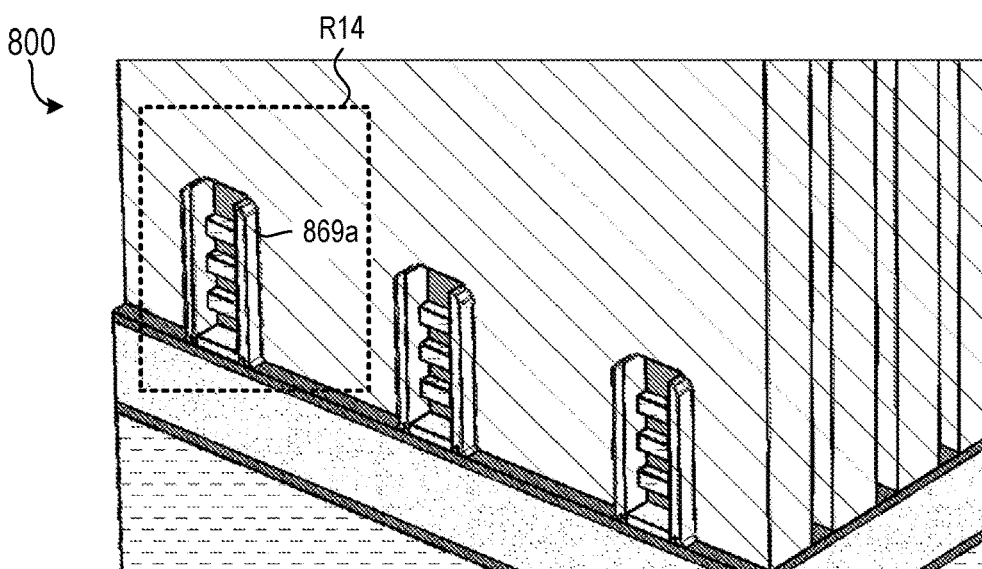
800
R14
869a
Figure 14
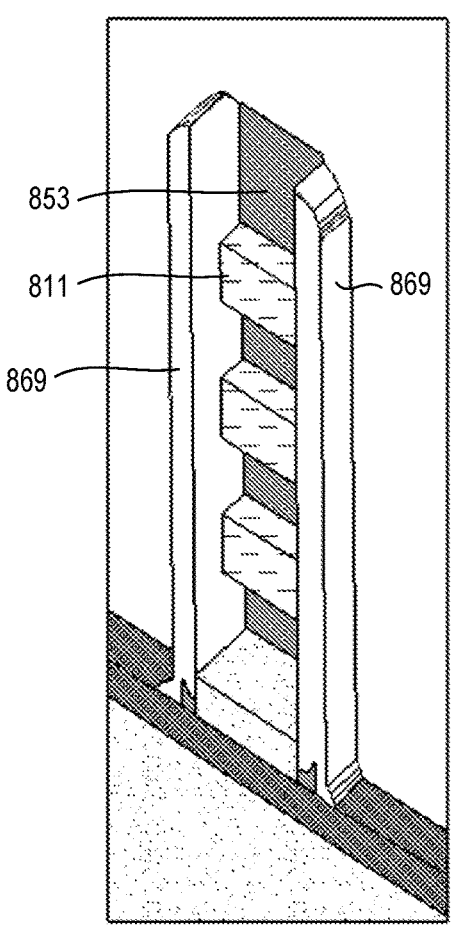
853
811
869
869
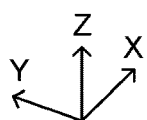
Figure 14B

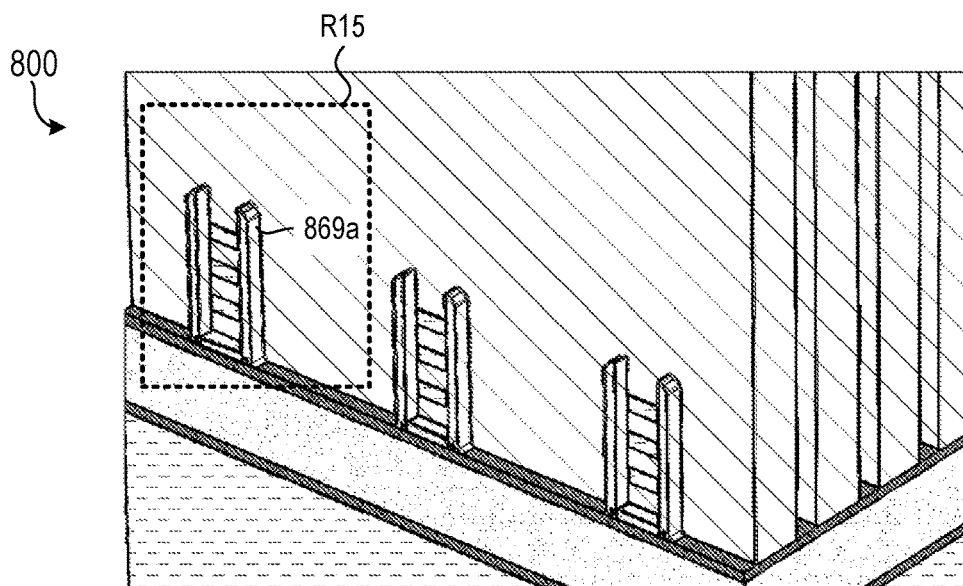
Figure 15
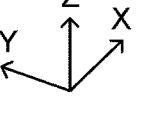
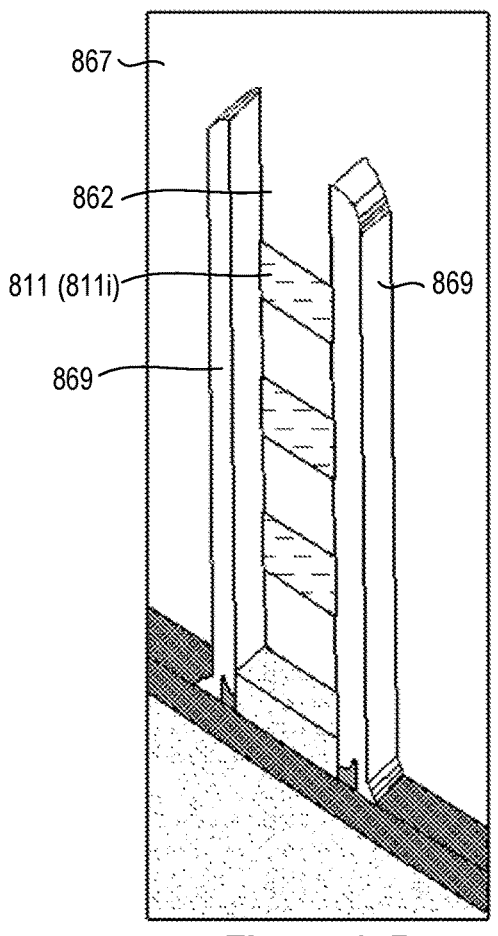
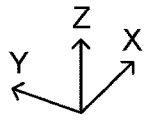
Figure 15B

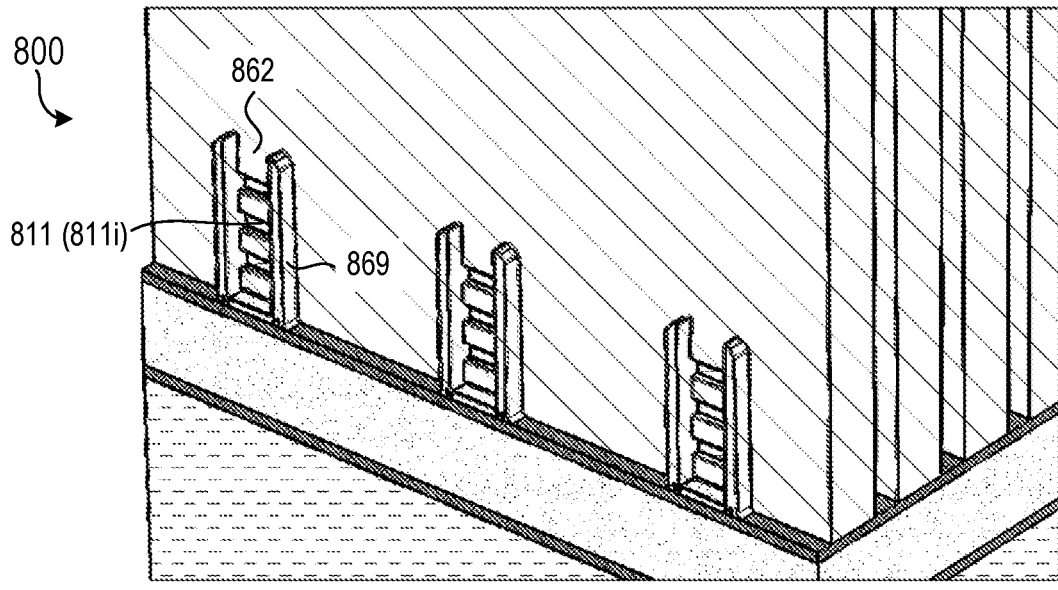
Figure 16
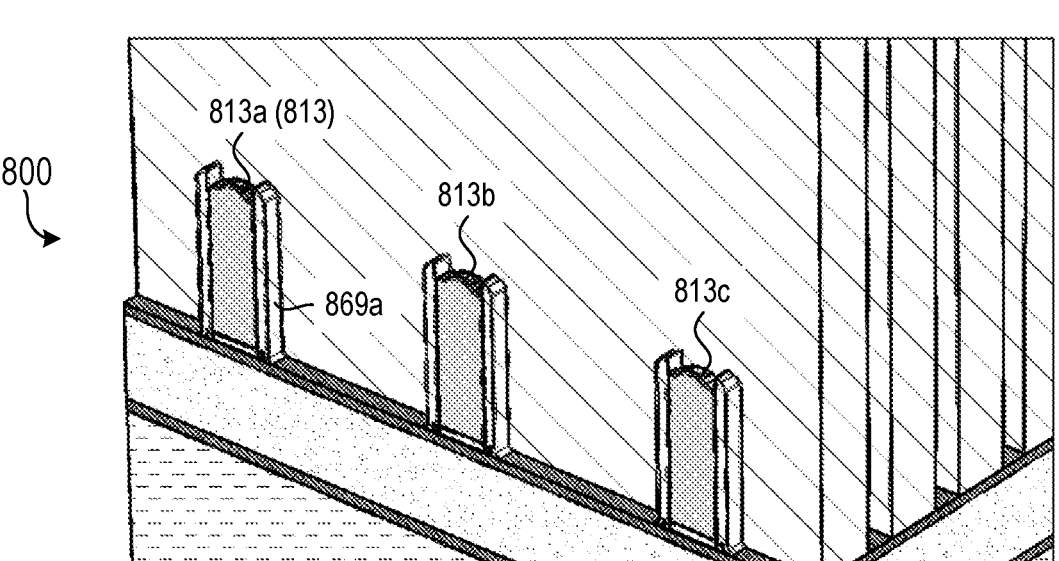
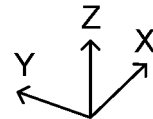
Figure 17

800
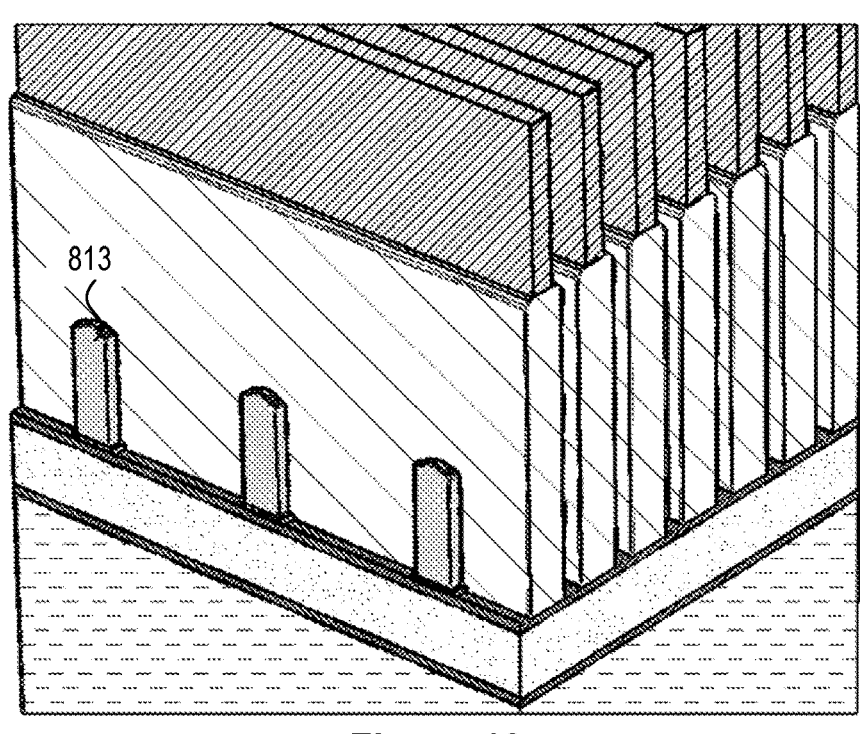
813
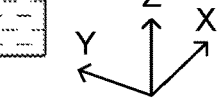
Figure 18
800
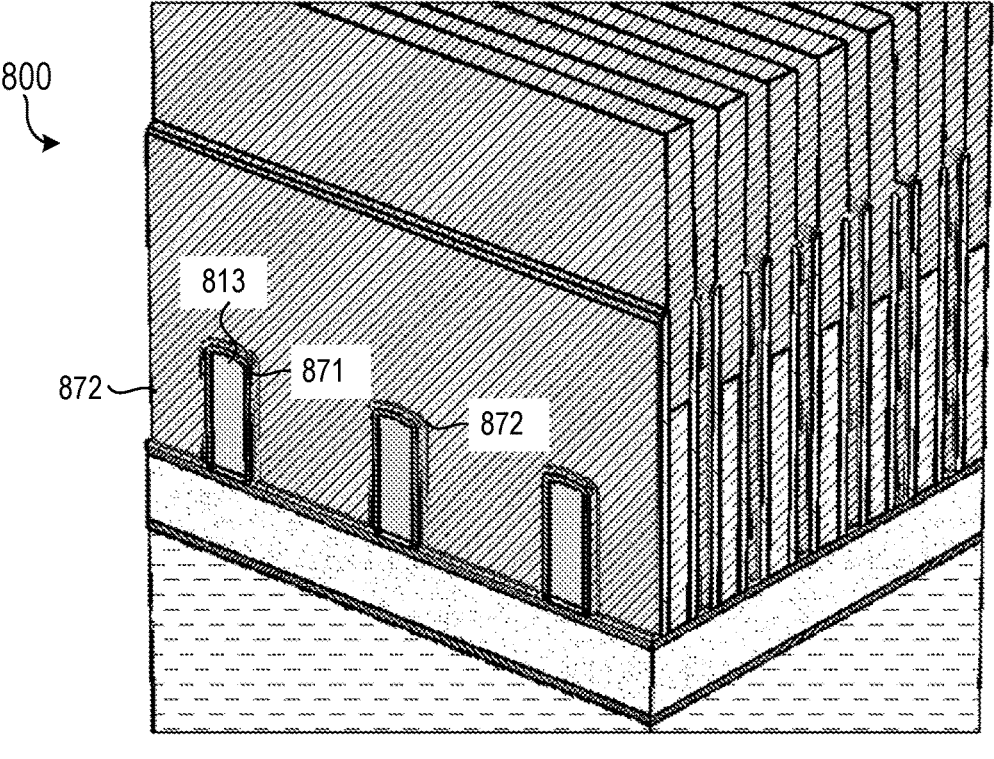
813
871
872
872
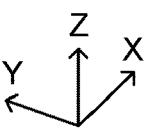
Figure 19

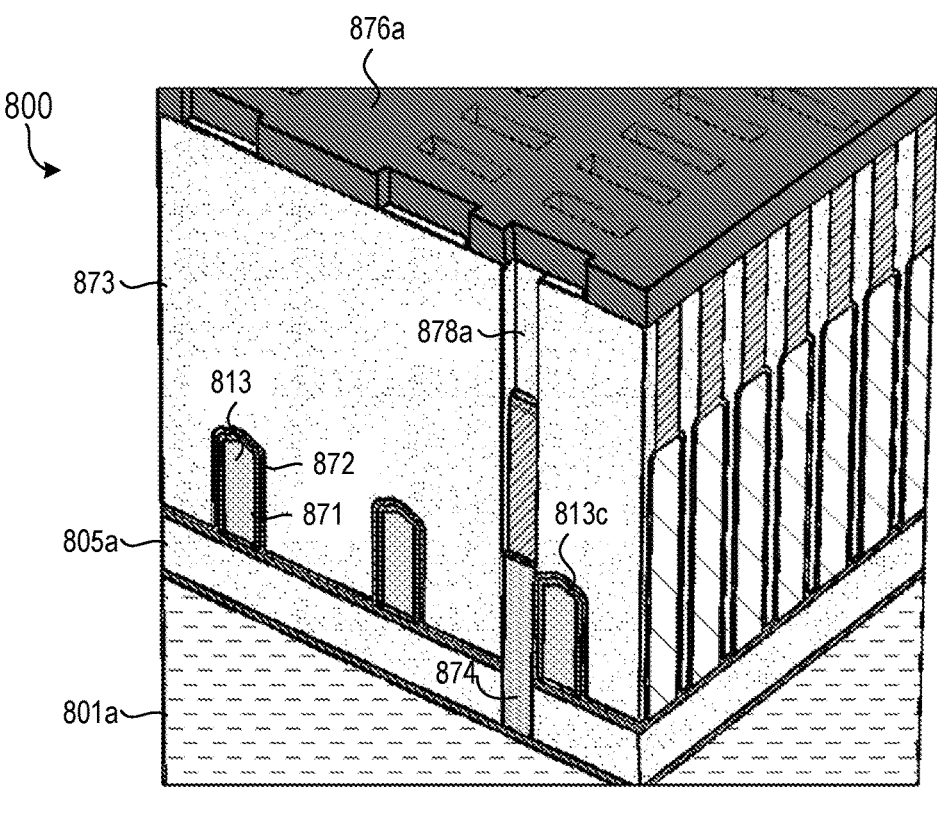
Figure 20
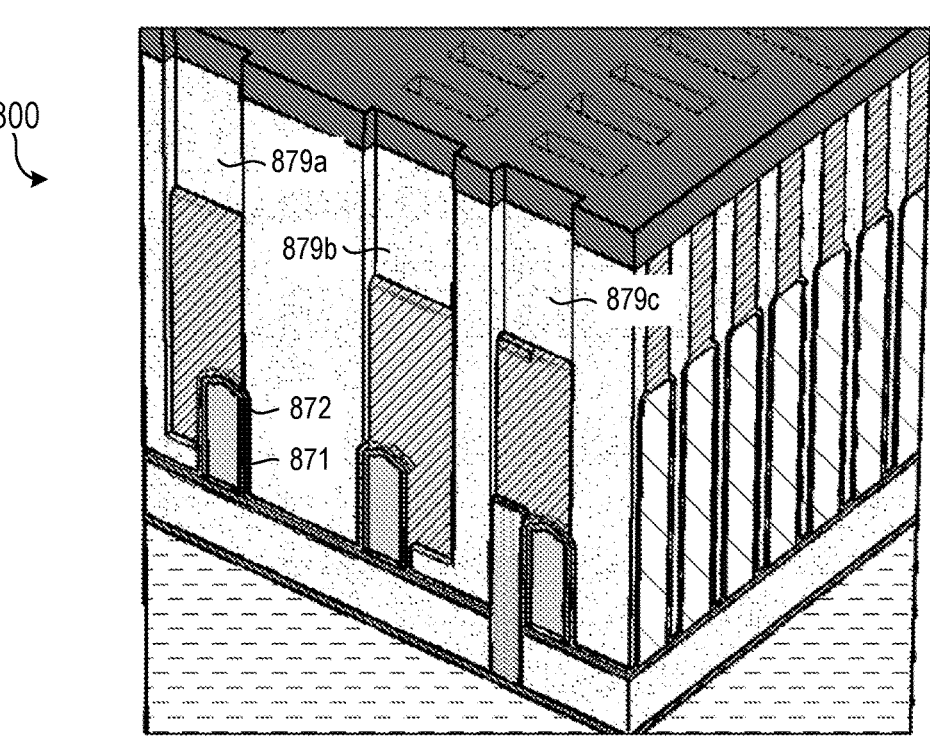
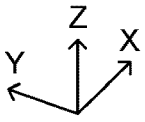
Figure 21

800
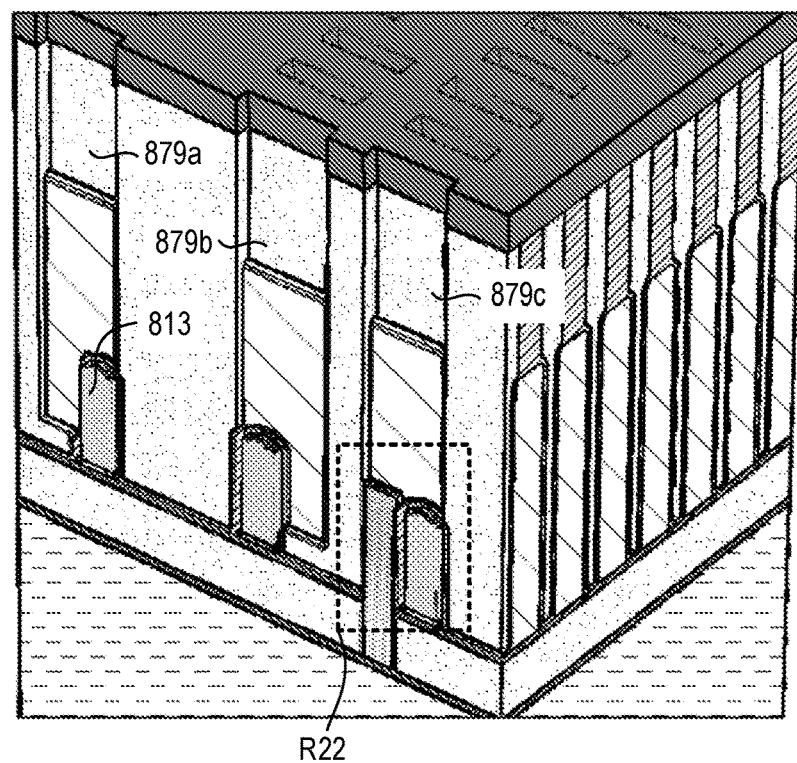
879a
879b
879c
813
R22
Figure 22
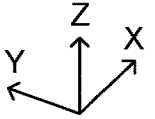
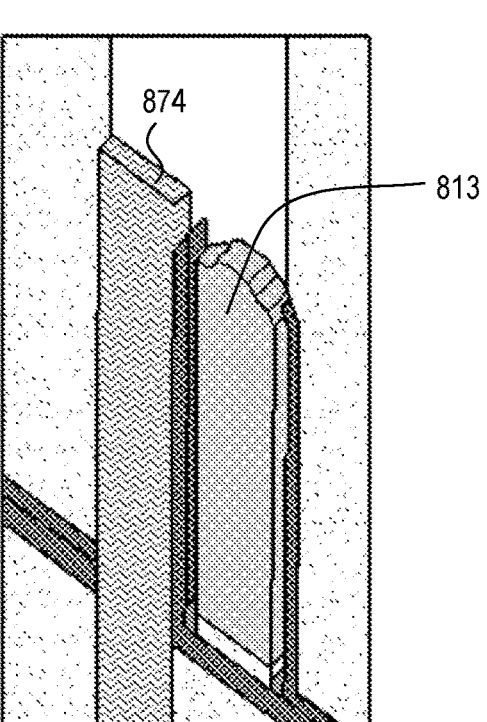
874
813
Figure 22B
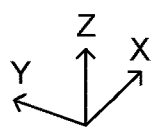

800
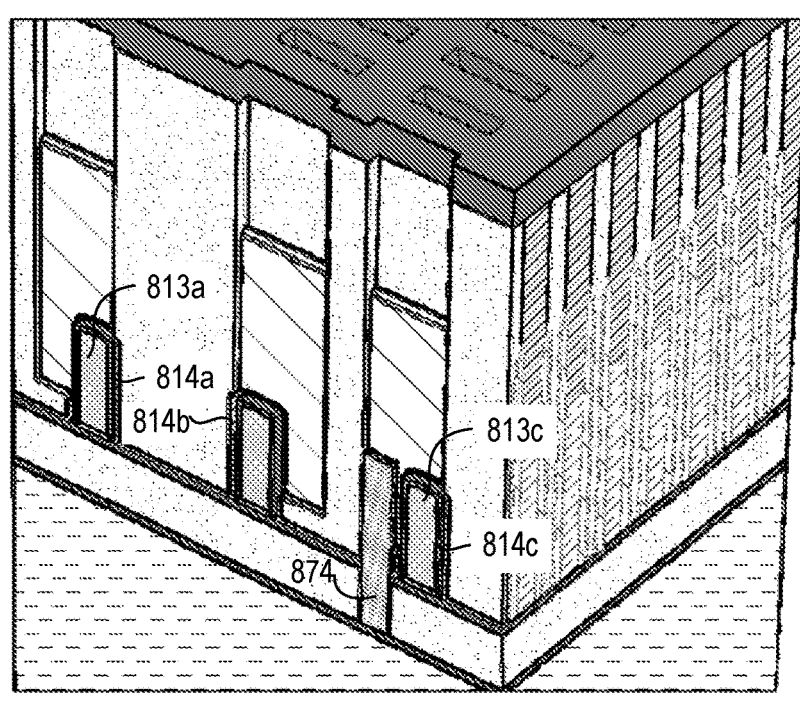
813a
814a
814b
813c
814c
874
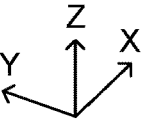
Figure 23
800
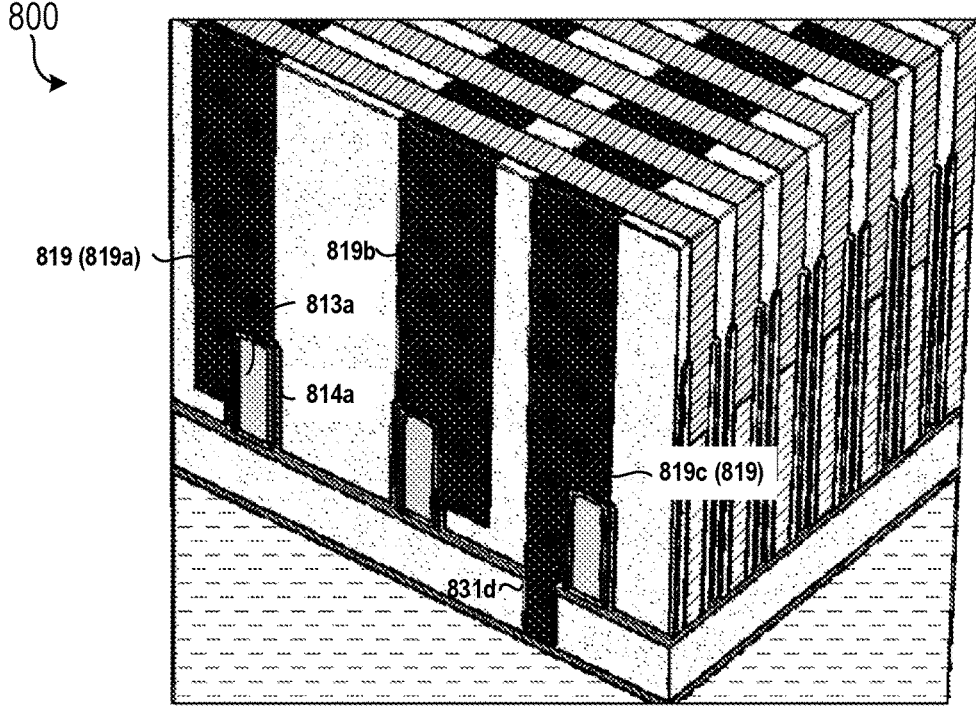
819 (819a)
819b
813a
814a
819c (819)
831d
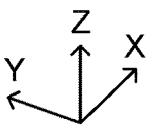
Figure 24

800
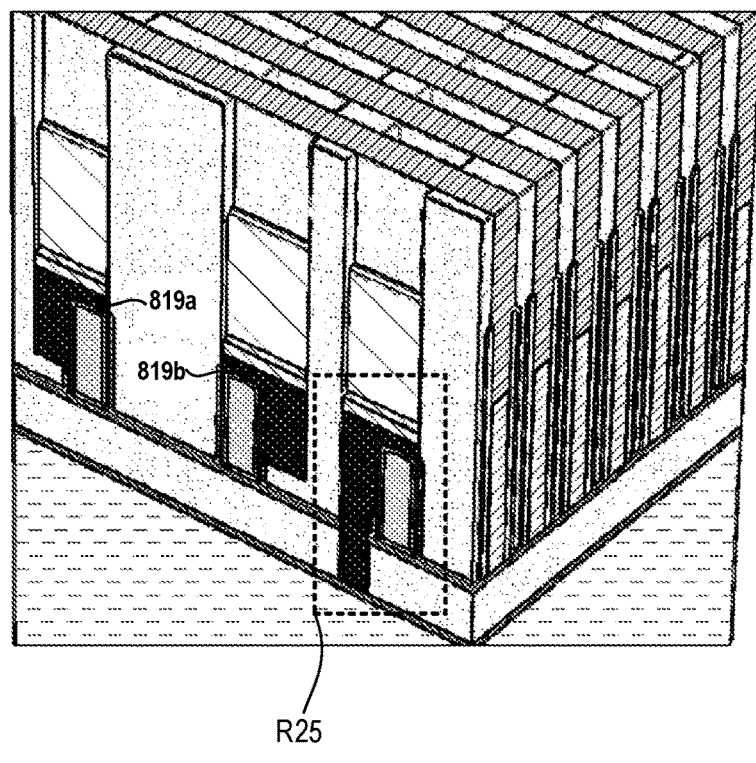
819a
819b
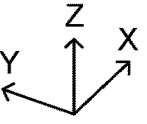
R25
Figure 25
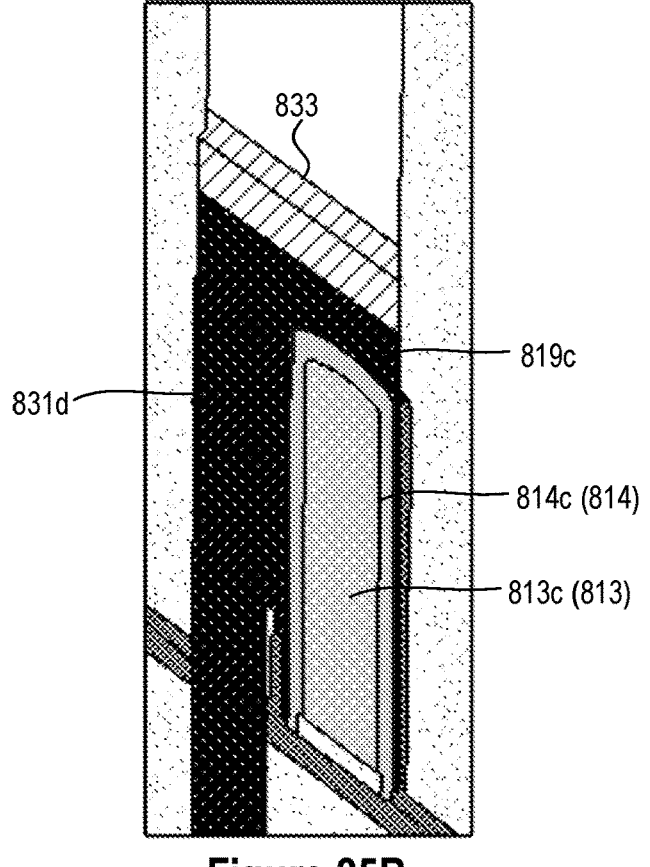
833
831d
819c
814c (814)
813c (813)
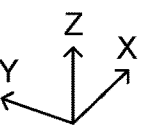
Figure 25B

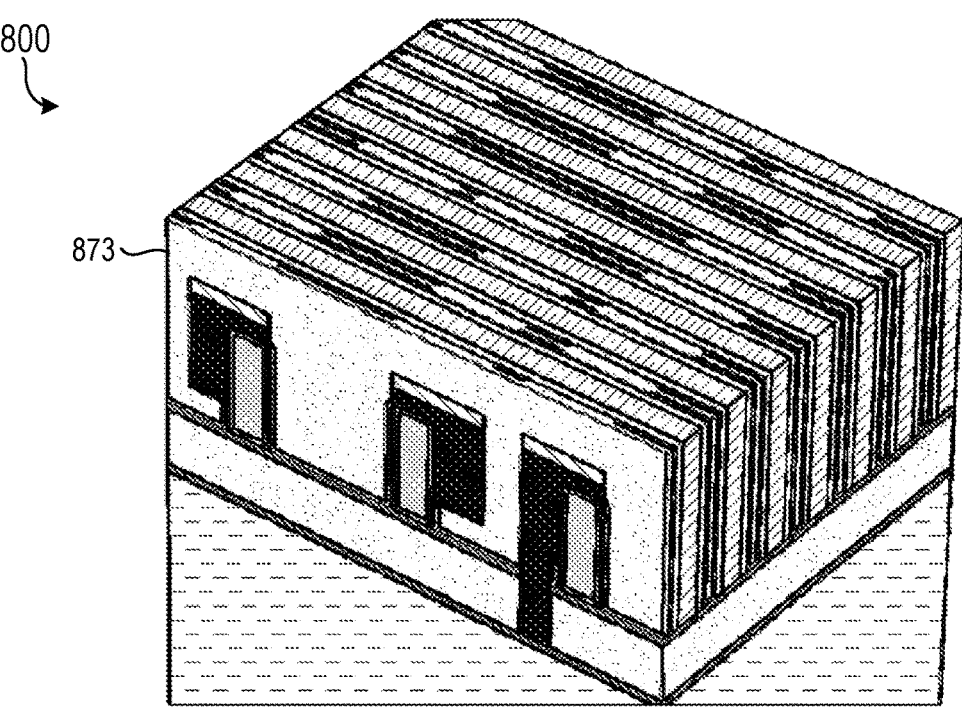
800
873
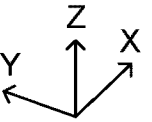
Figure 26
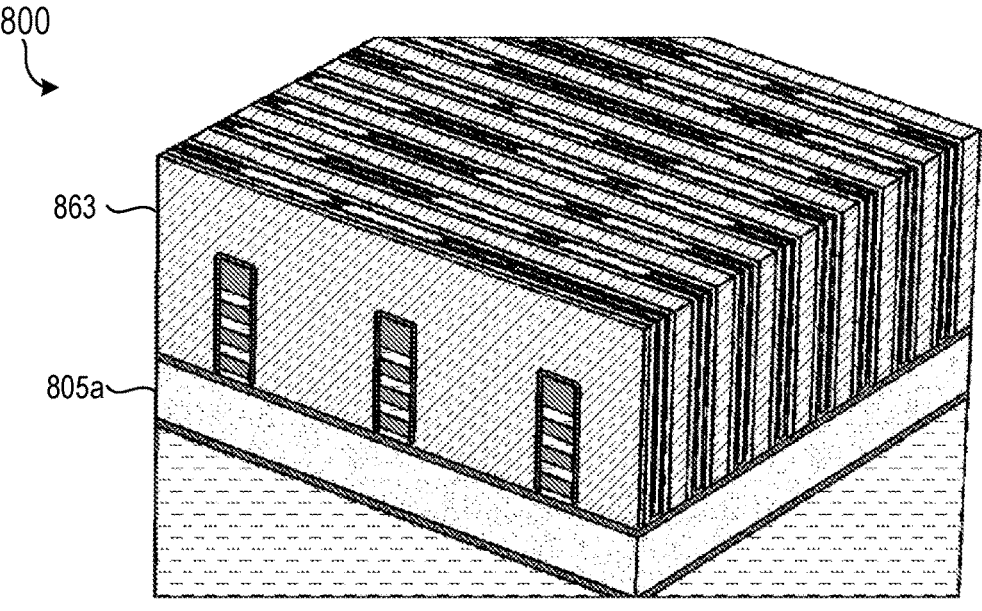
800
863
805a
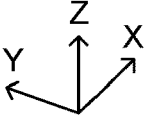
Figure 27

800
867
861
851
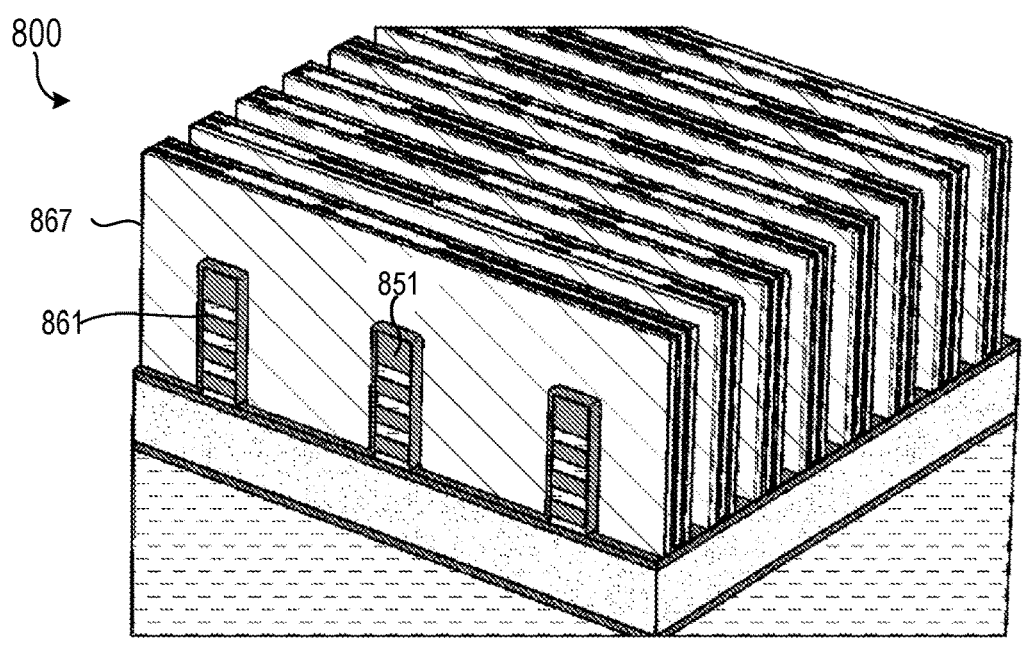
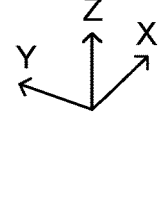
Figure 28
800
867
853
811
851
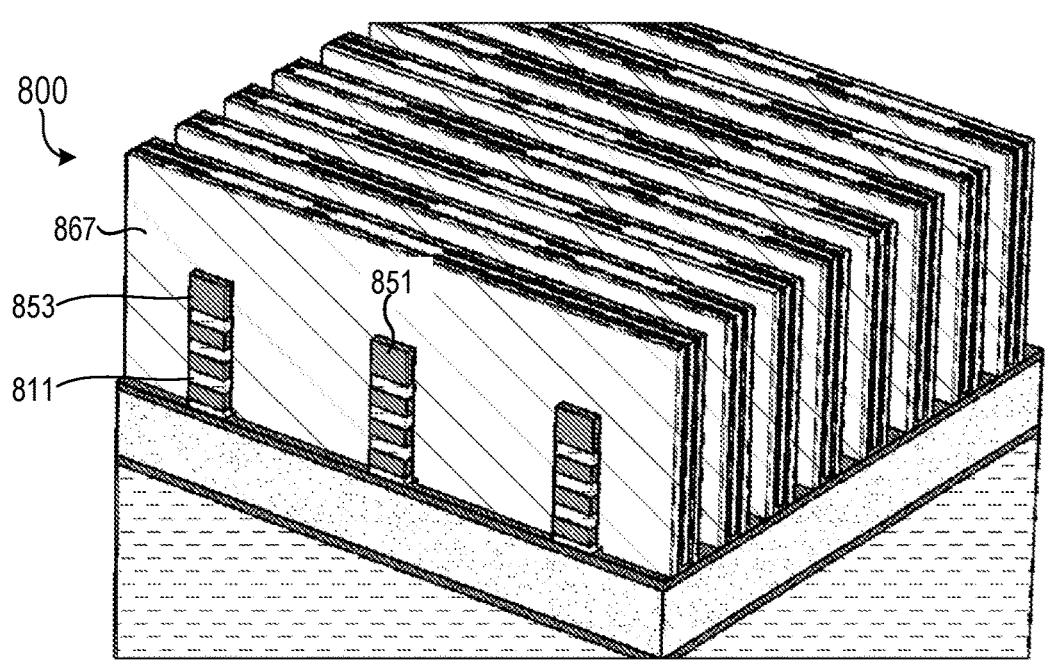
Figure 29

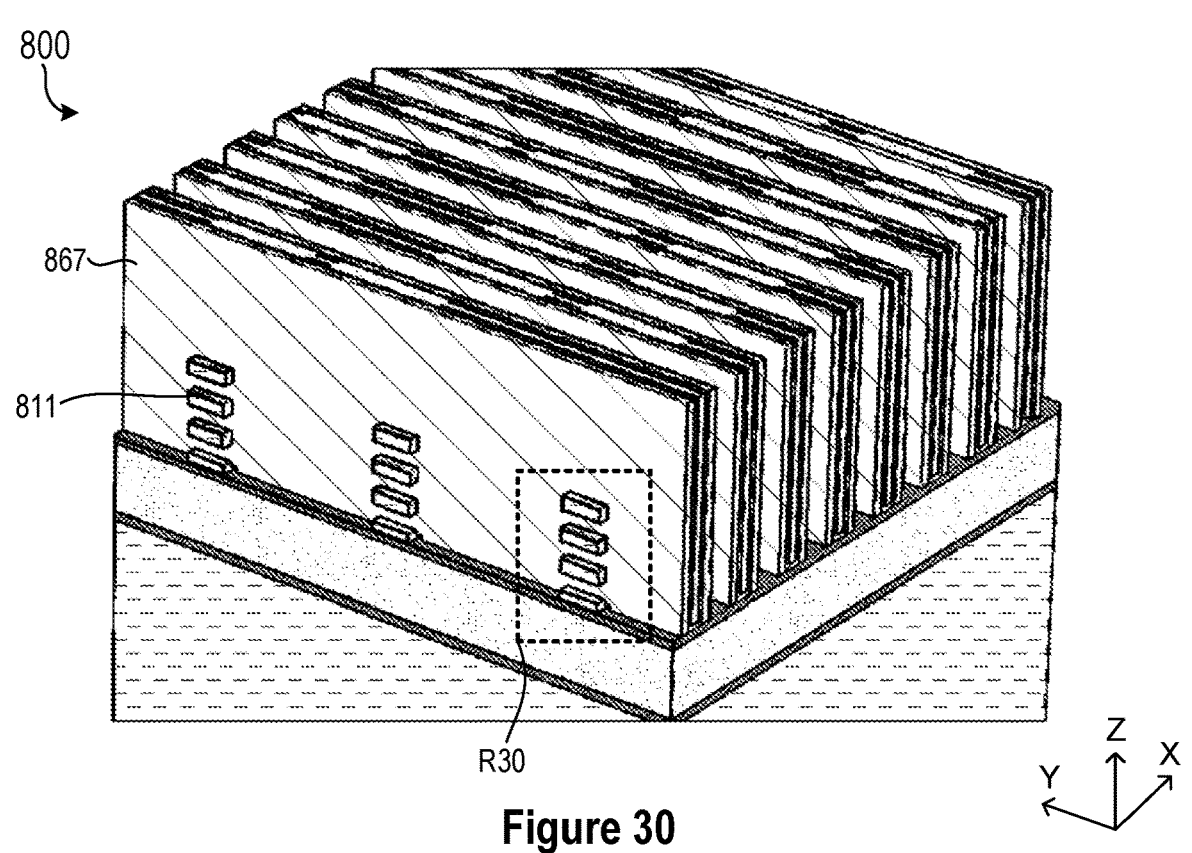
Figure 30
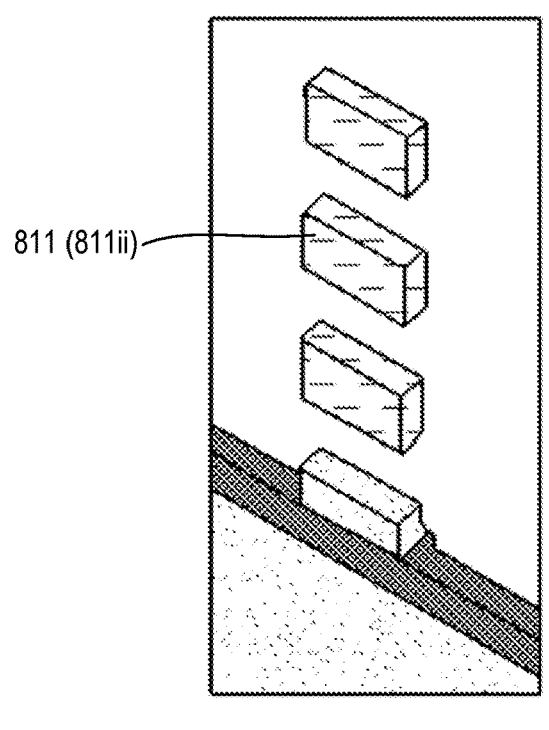
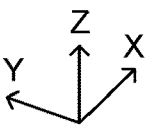
Figure 30B

800
811
R31
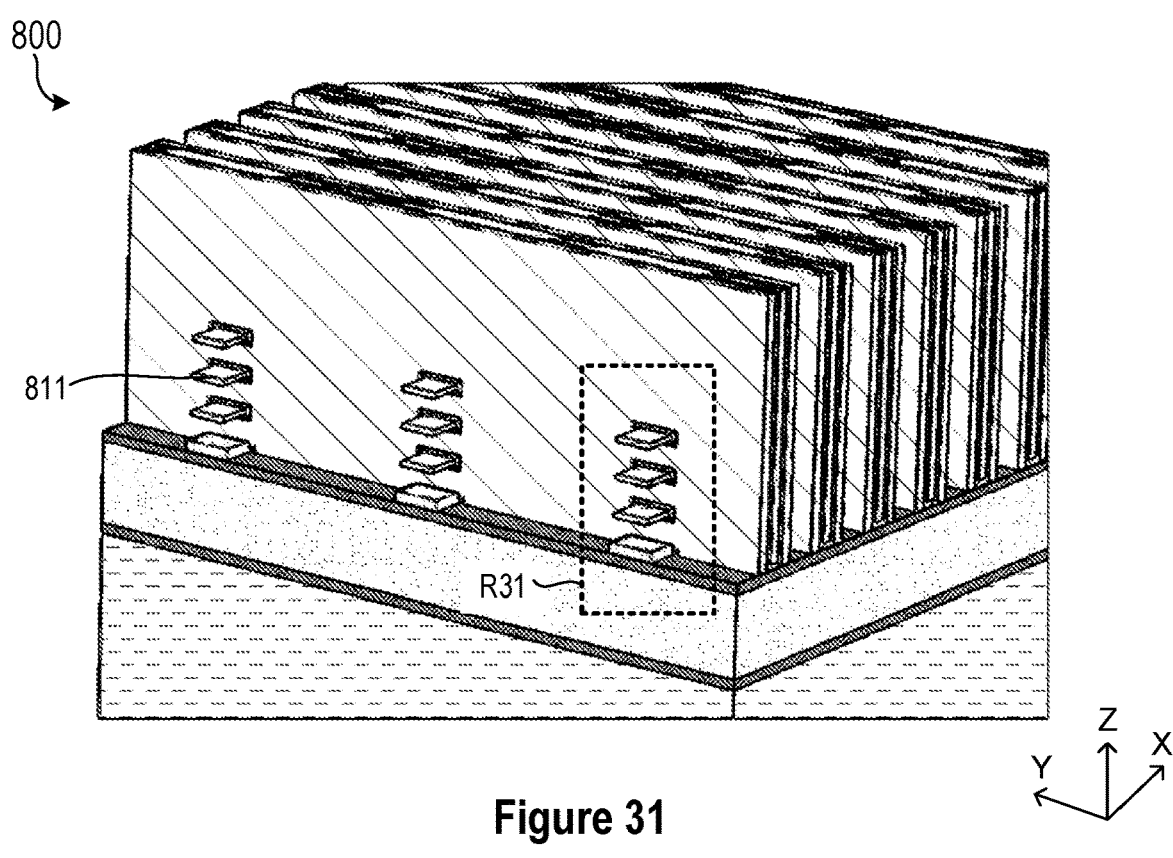
Figure 31
811ii
811i
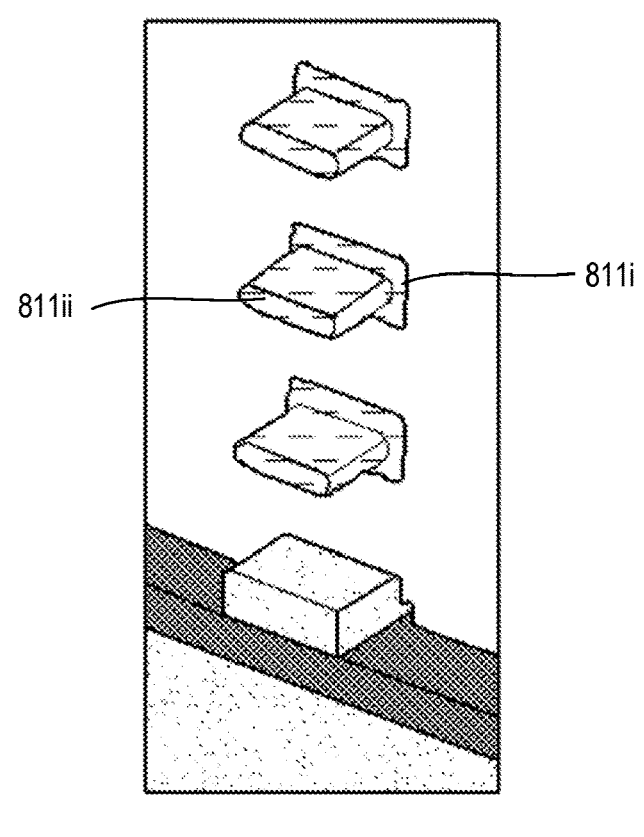
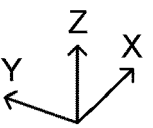
Figure 31B

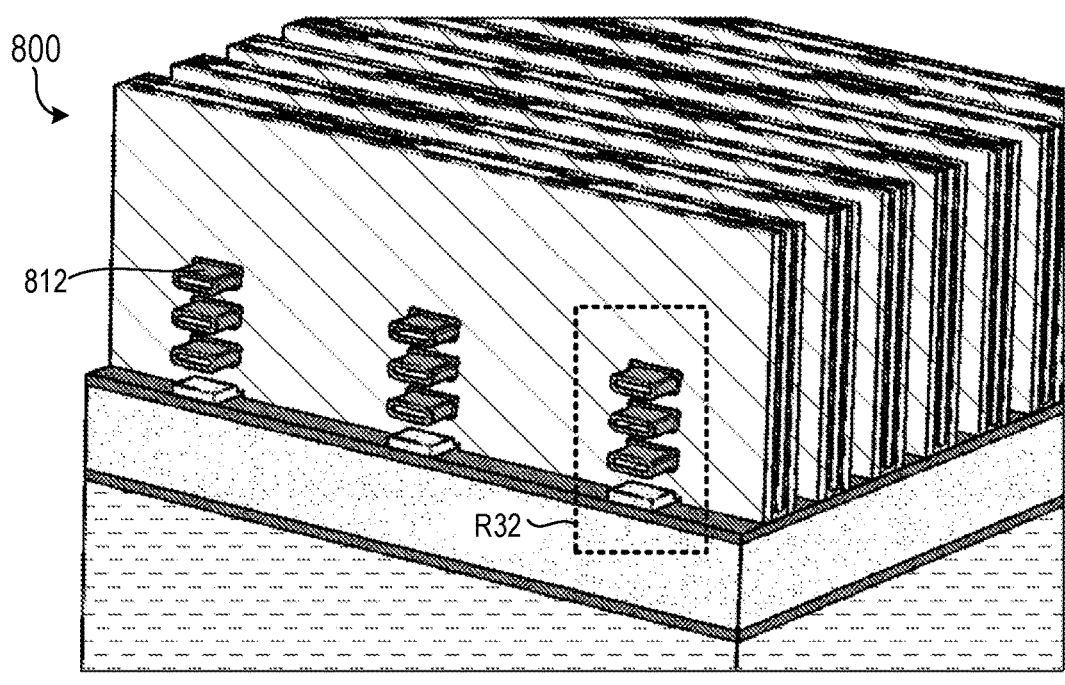
800
812
R32
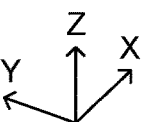
Figure 32
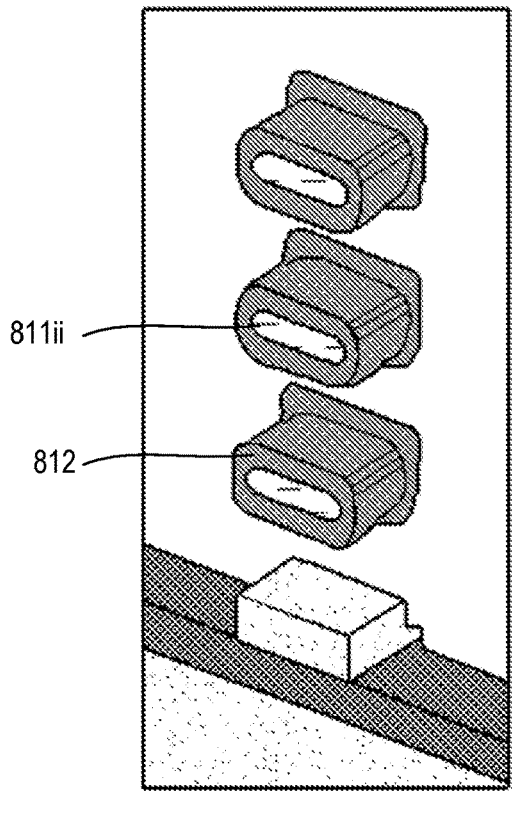
811ii
812
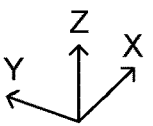
Figure 32B

800
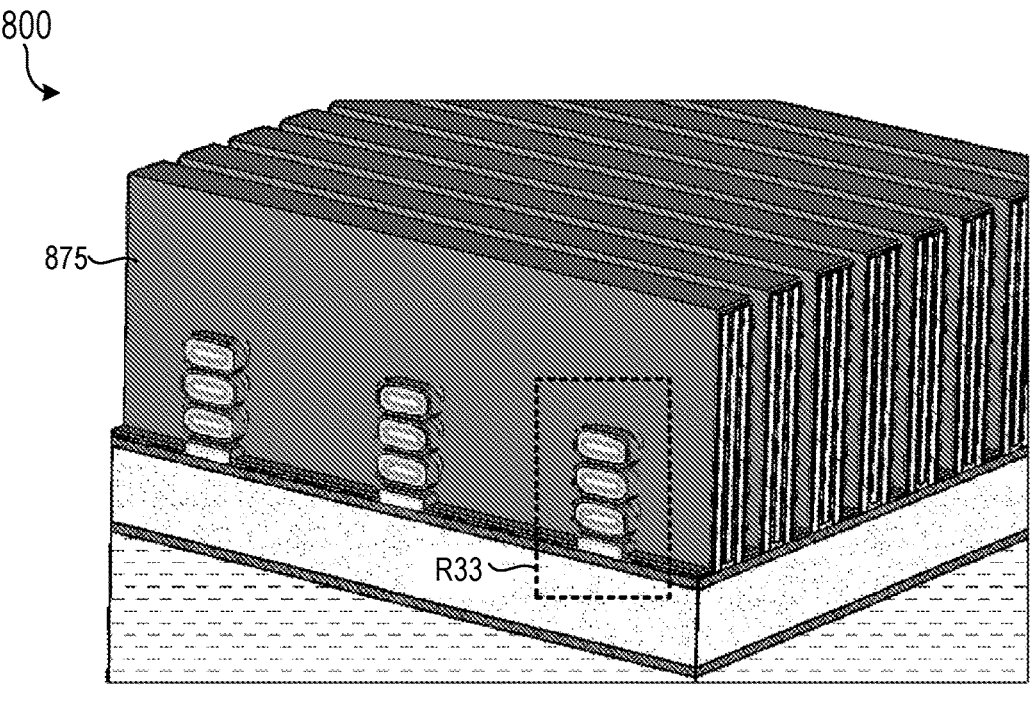
Figure 33
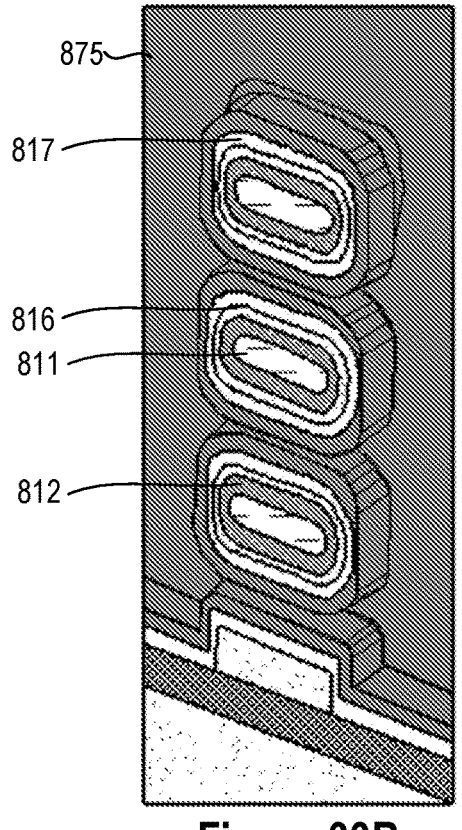
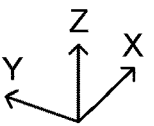
Figure 33B

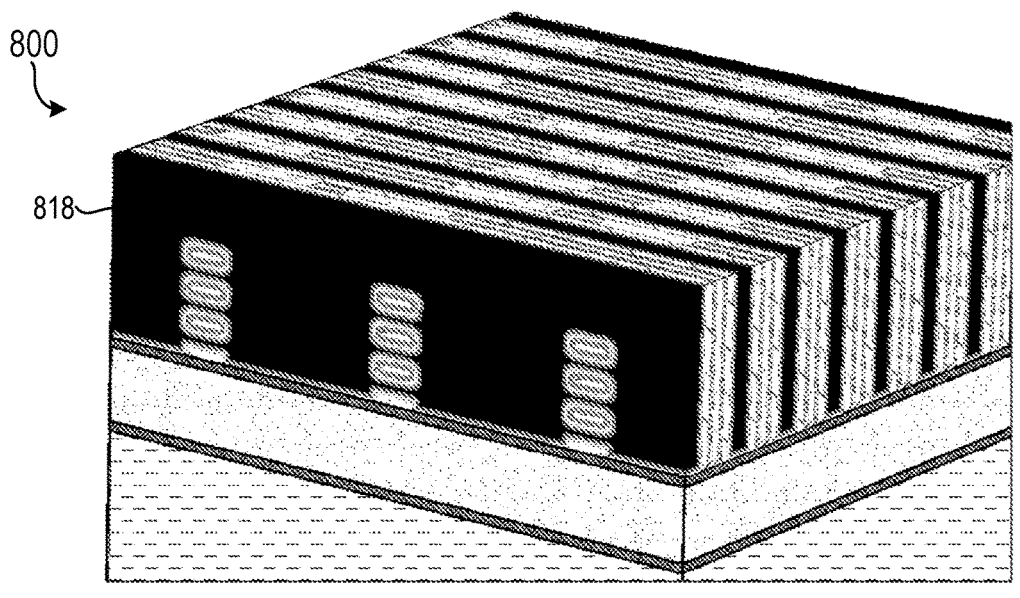
800
818
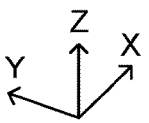
Z
Y X
Figure 34
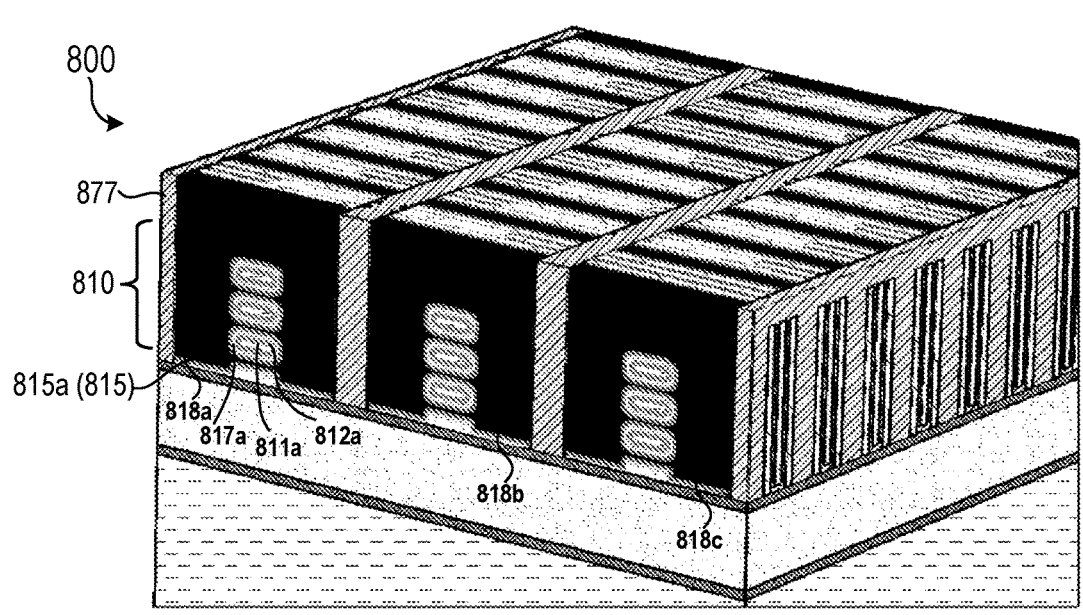
800
877
810
815a (815)
818a
817a  811a  812a
818b
818c
Z
Y X
Figure 35

800

877

800

805b'

803

805a

W2

W1

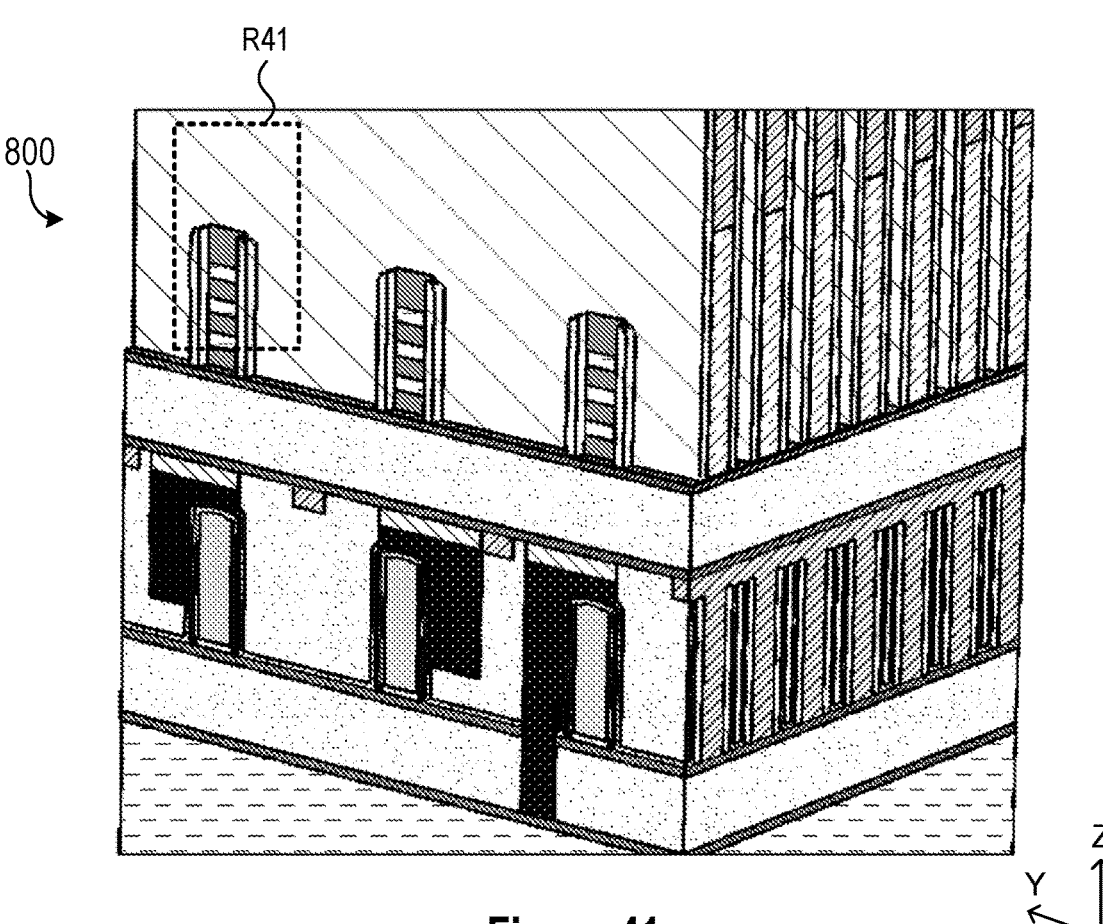
Figure 41
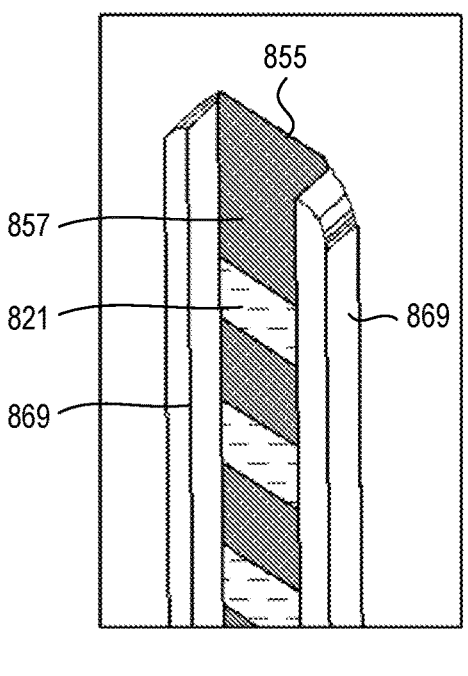
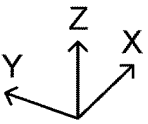
Figure 41B

800
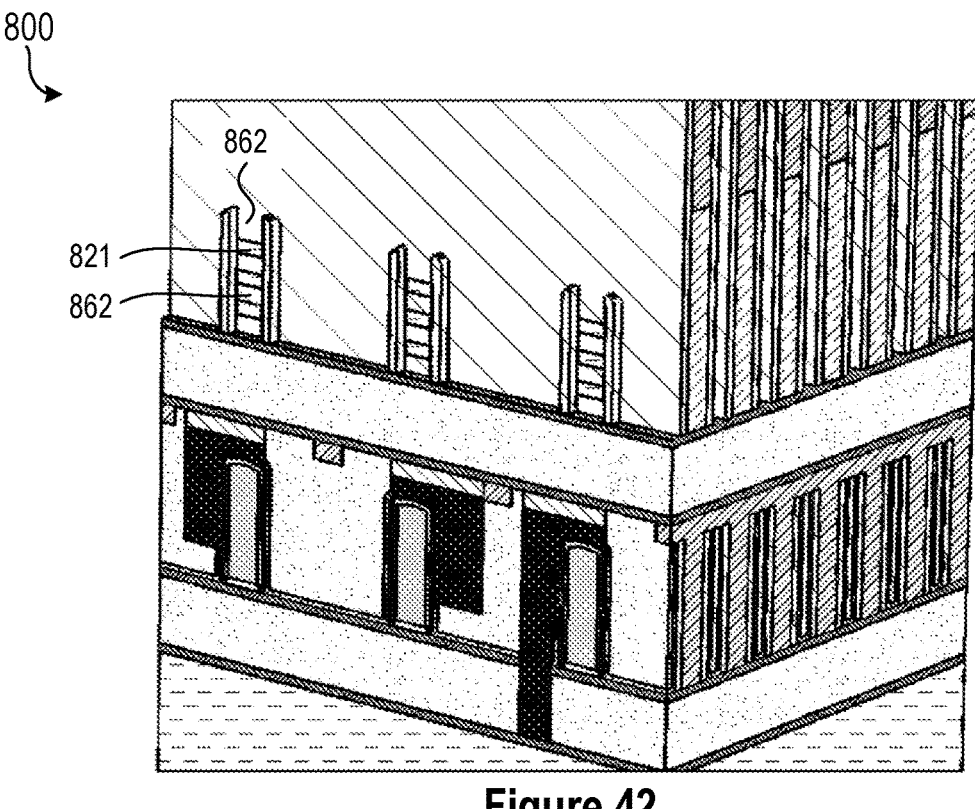
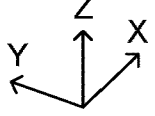
Figure 42
800
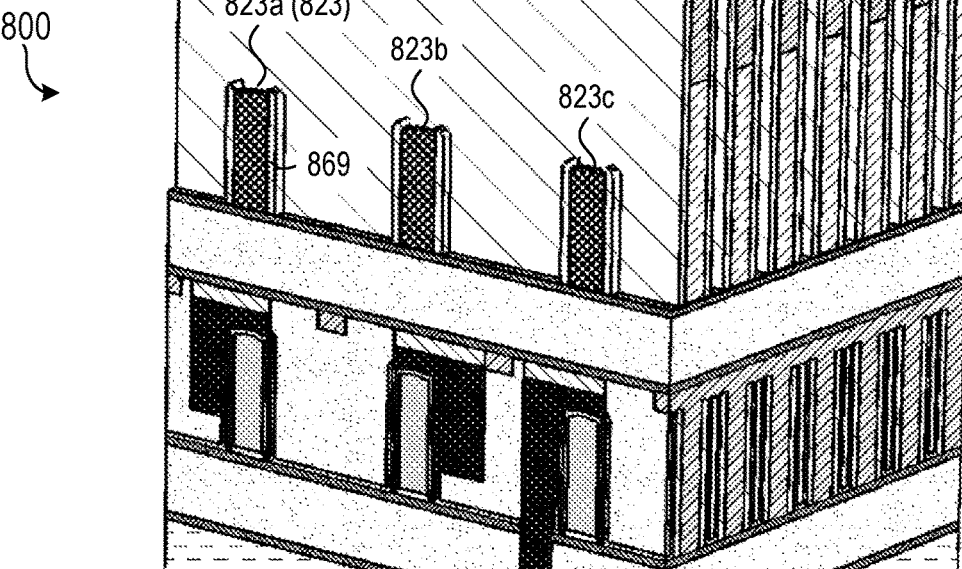
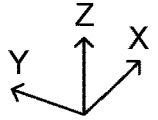
Figure 43

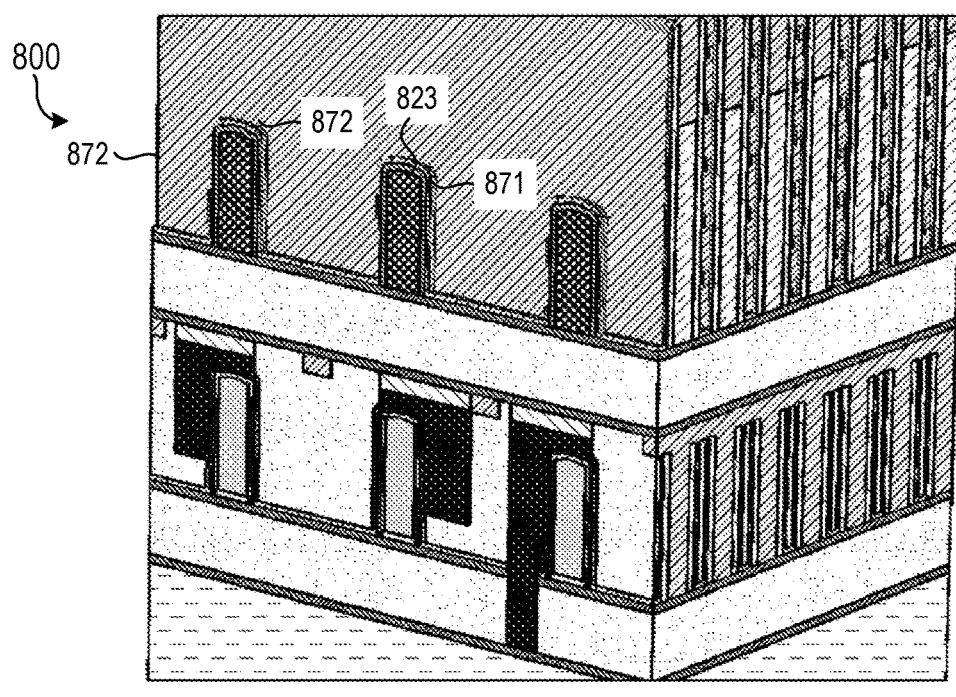
Figure 44
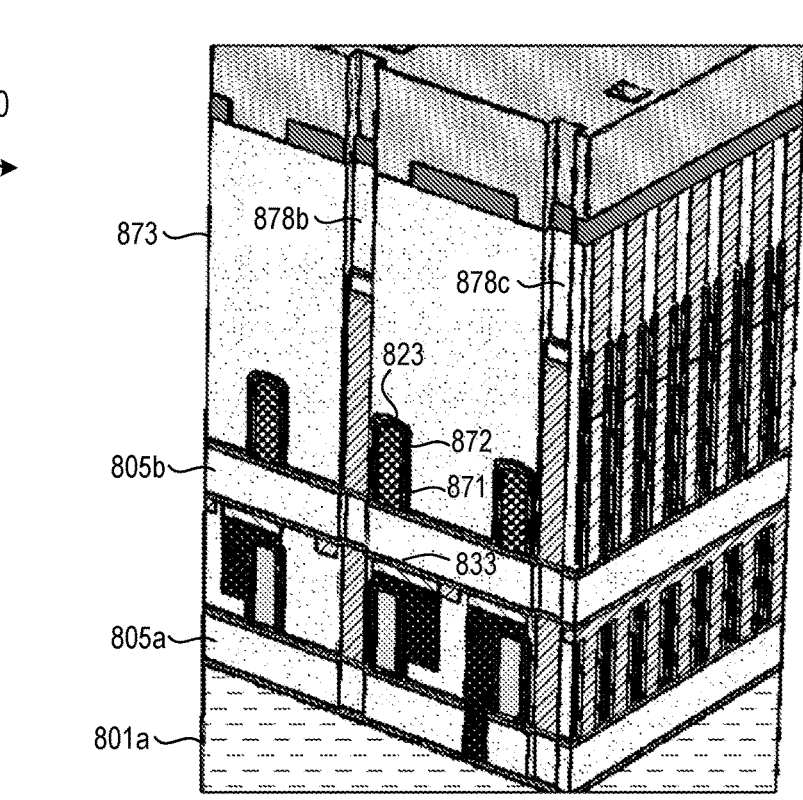
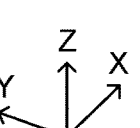
Figure 45

800
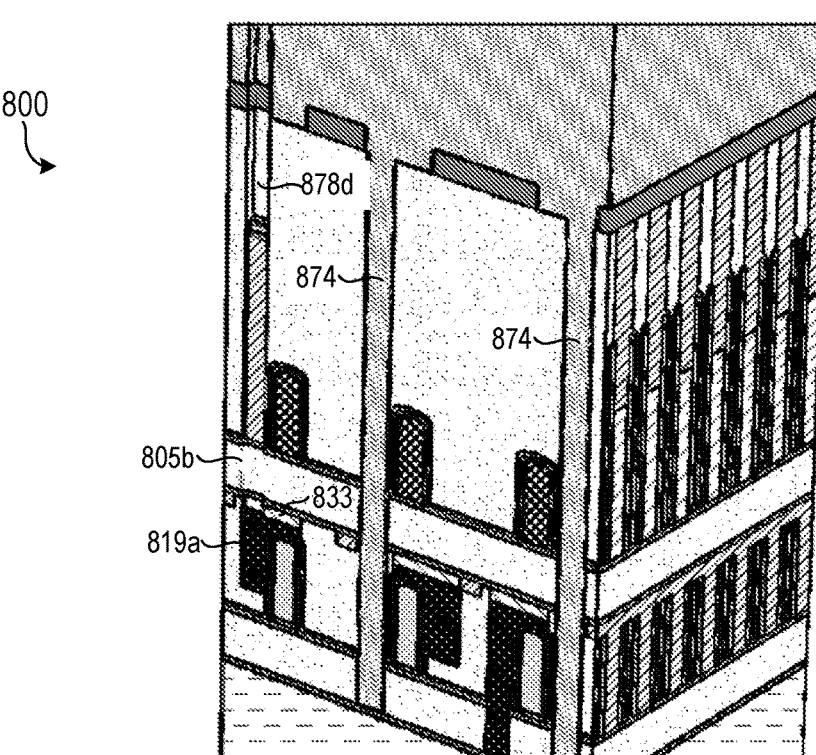
Figure 46
800
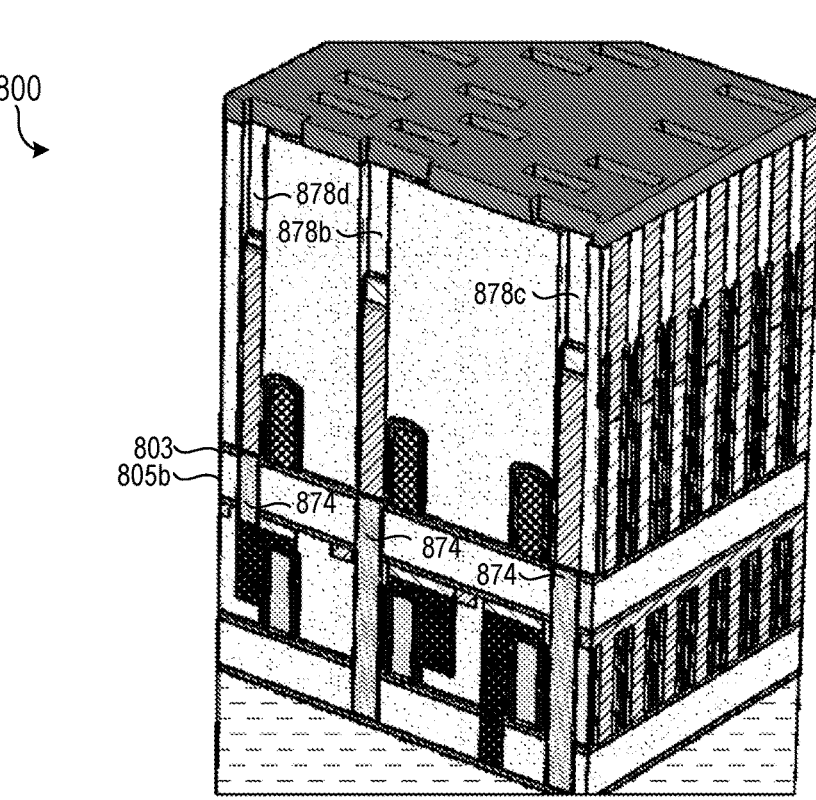
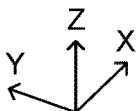
Figure 47

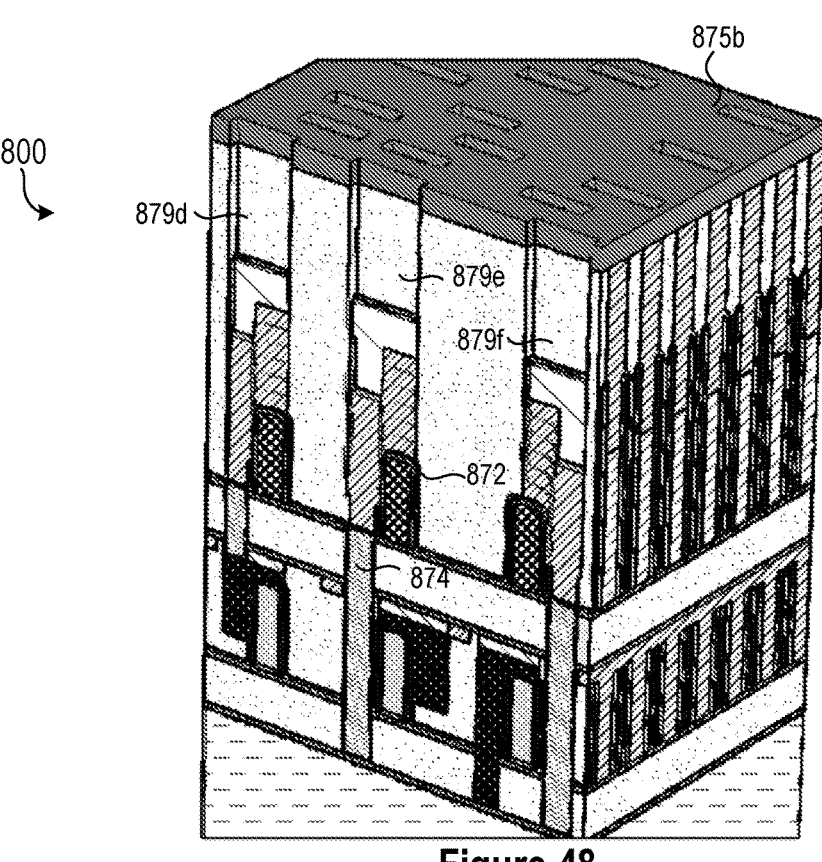
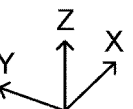
Figure 48
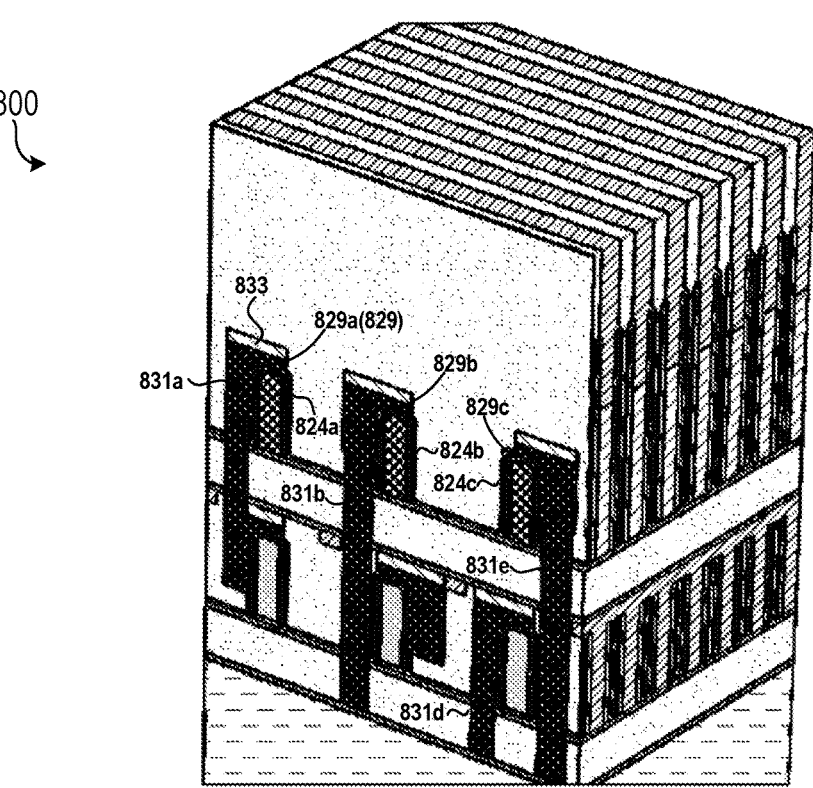
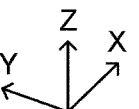
Figure 49

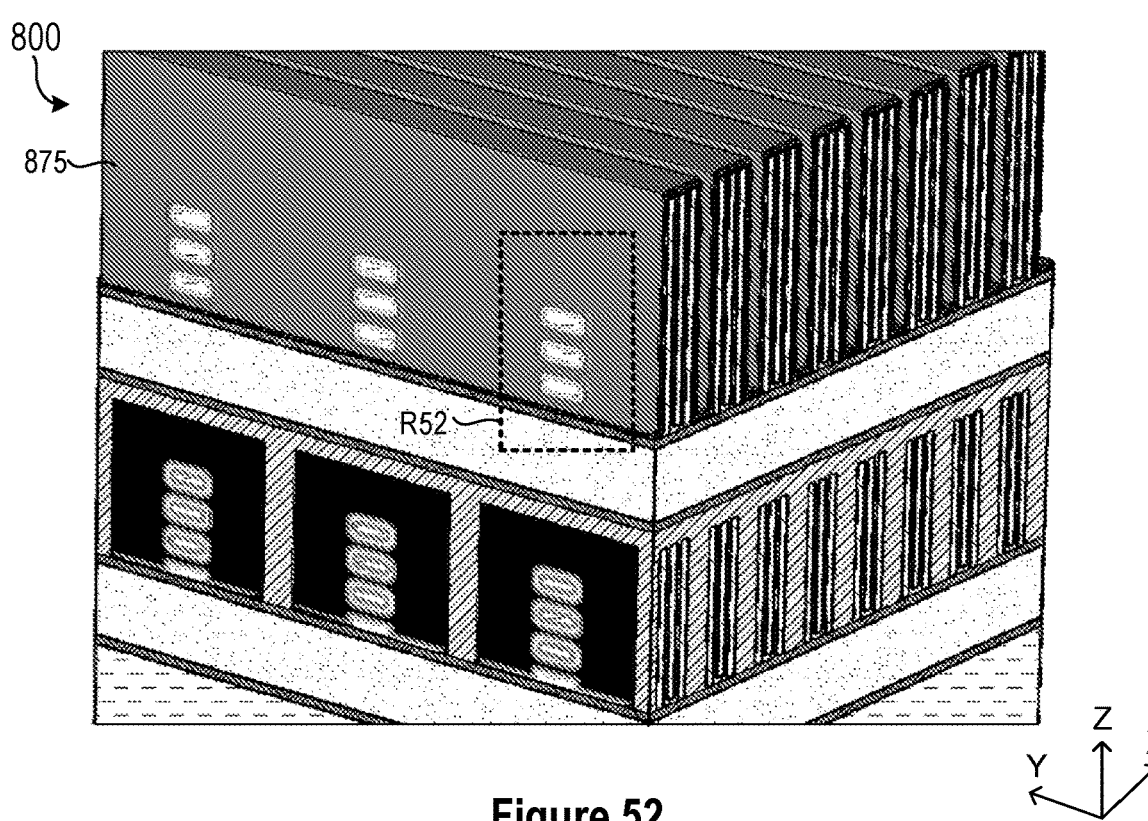
Figure 52
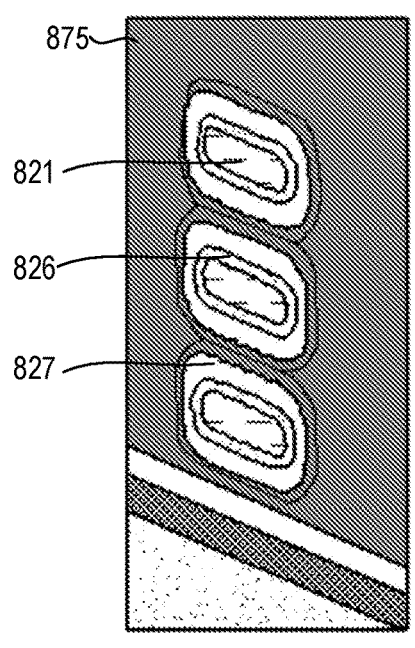
Figure 52B
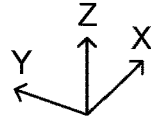

800

800

800
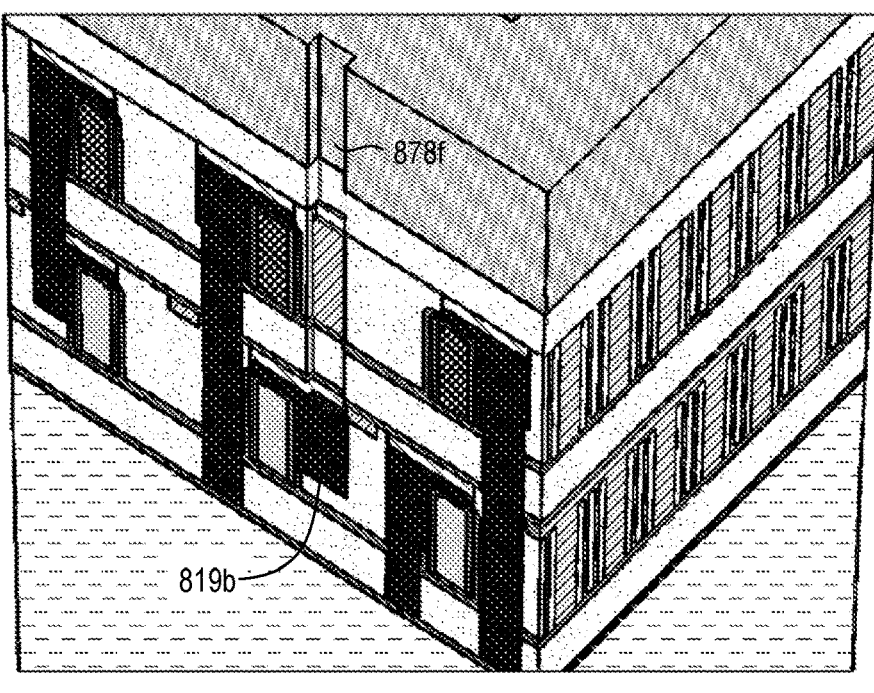
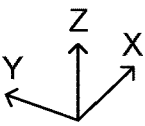
Figure 57
800
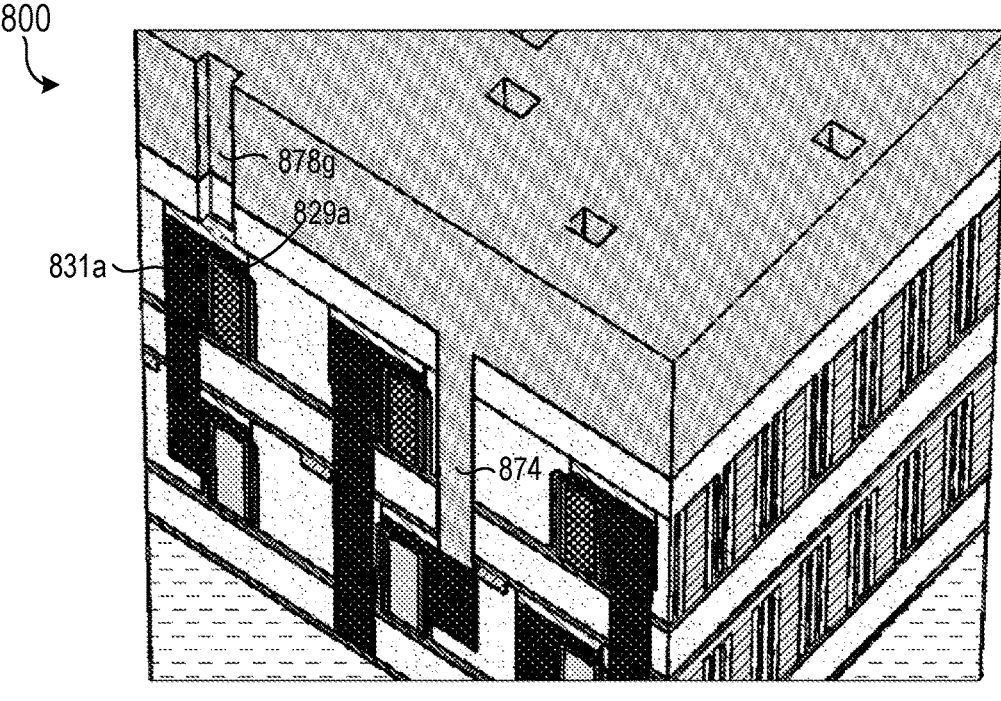
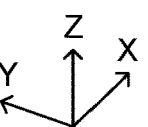
Figure 58

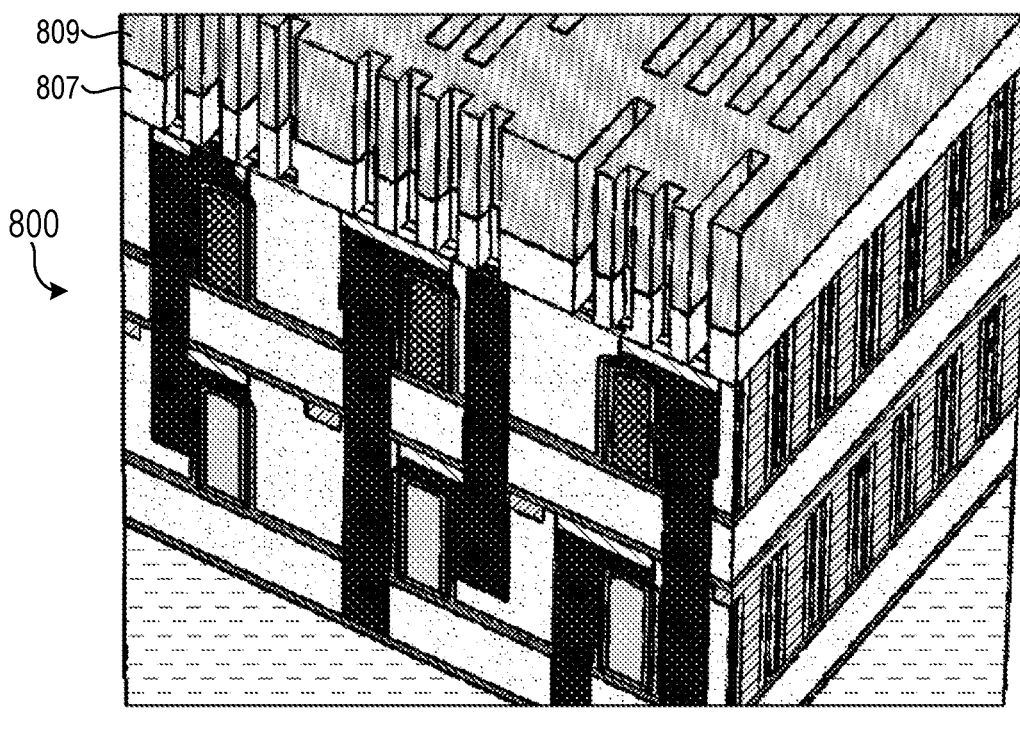
809
807
800
Figure 63
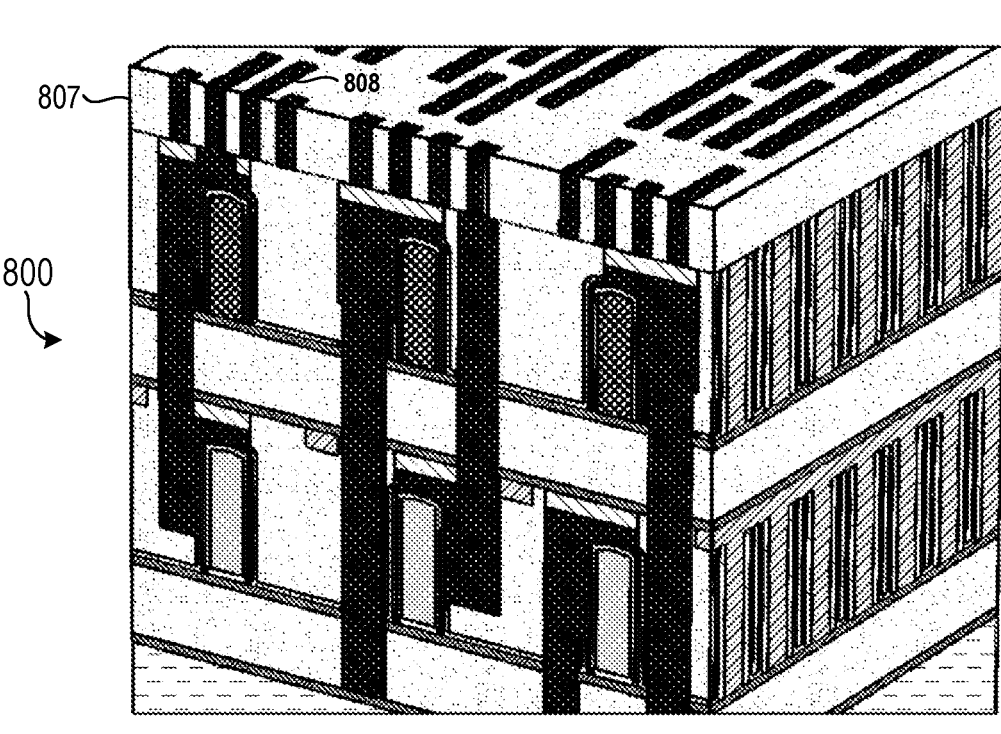
807
808
800
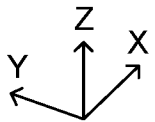
Figure 64

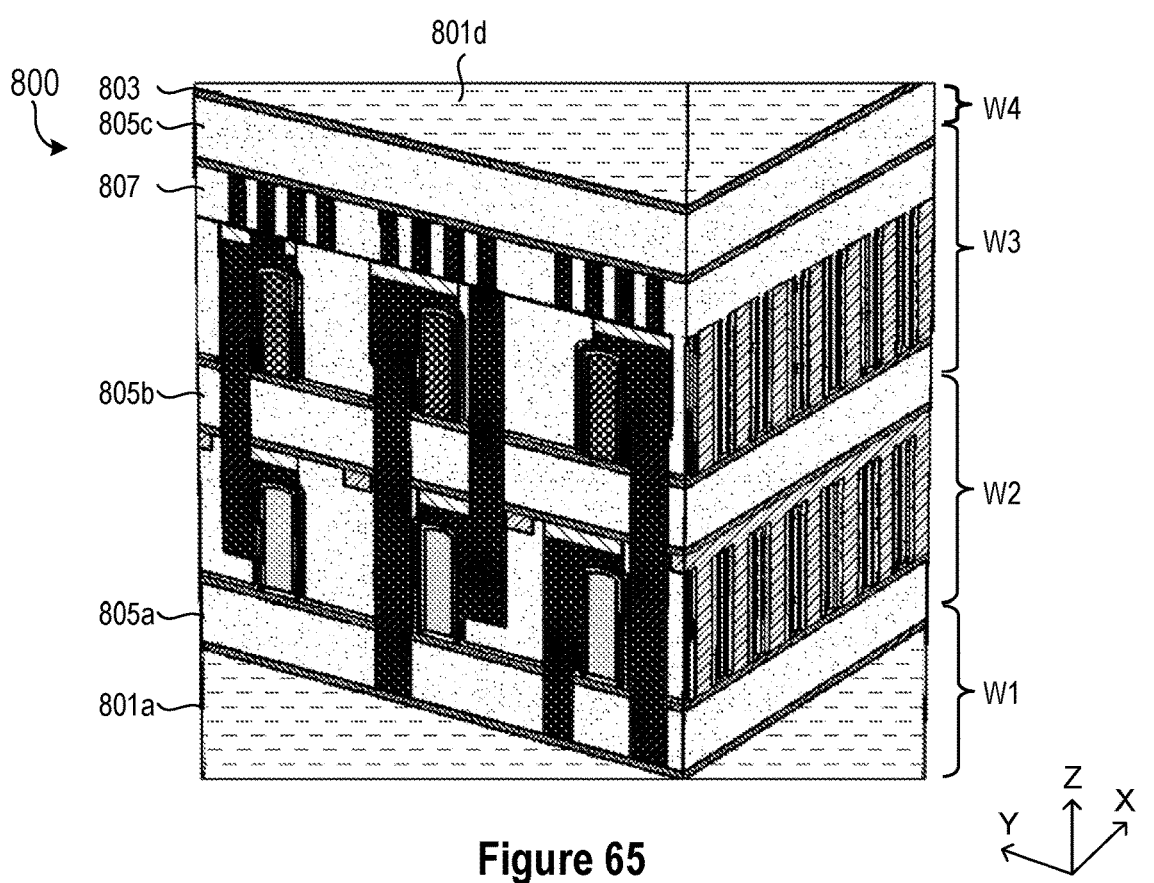
Figure 65
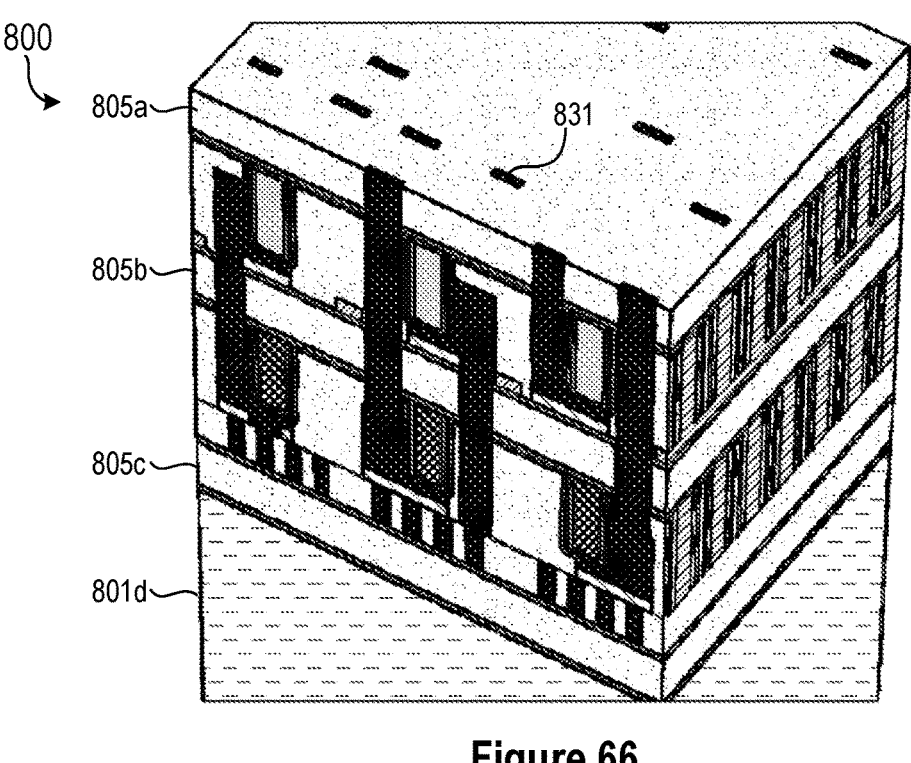
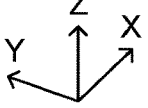
Figure 66

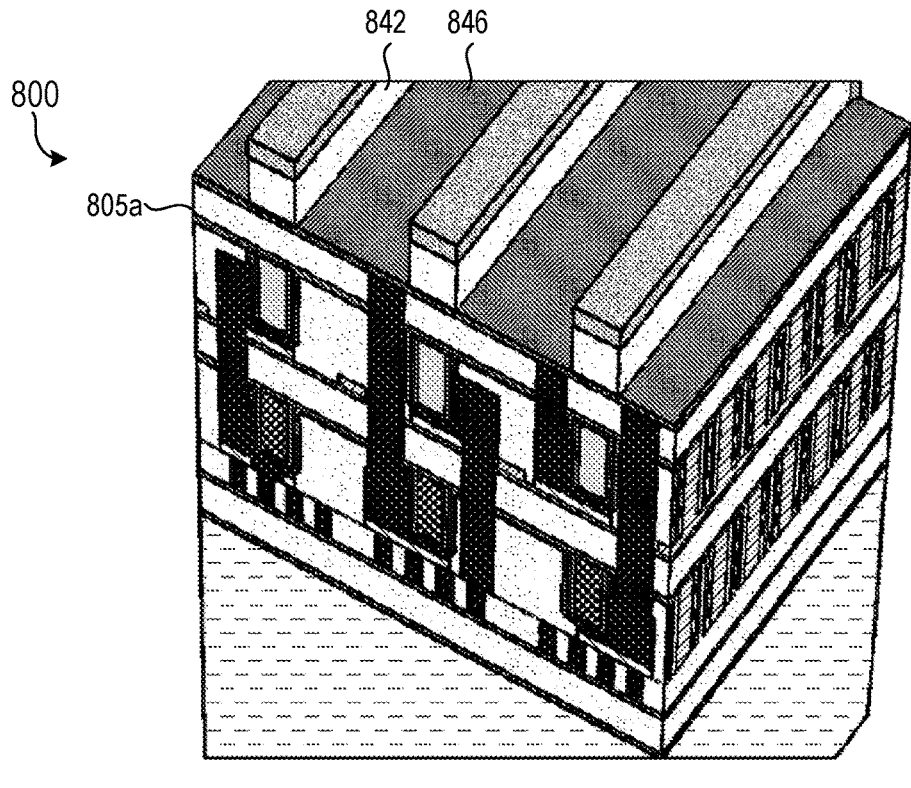
Figure 67
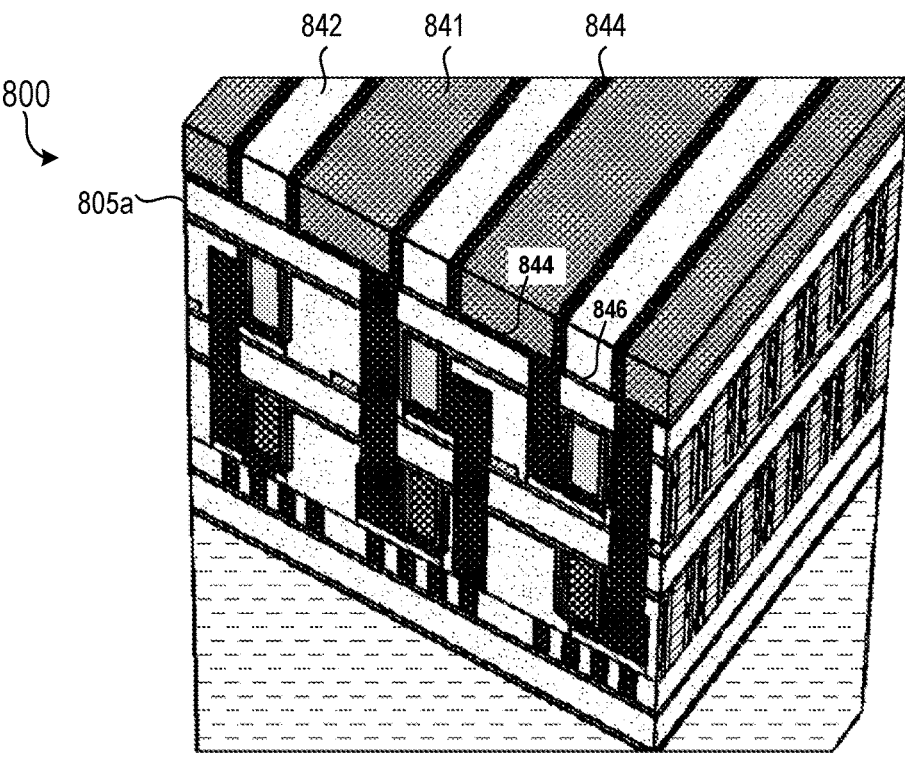
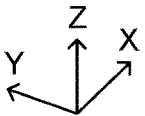
Figure 68

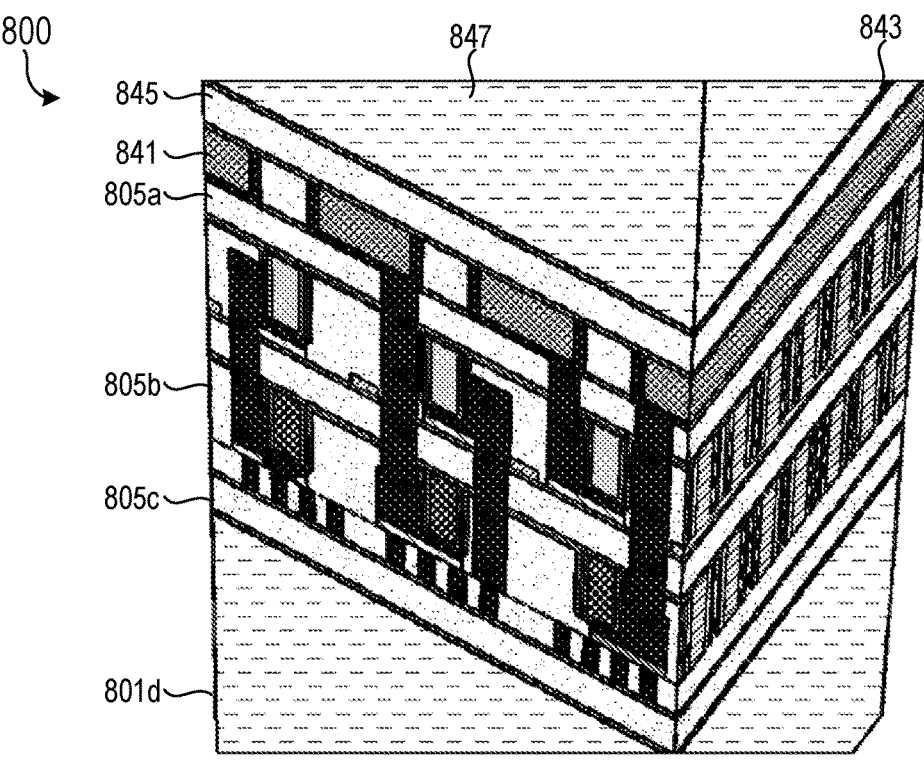
Figure 69
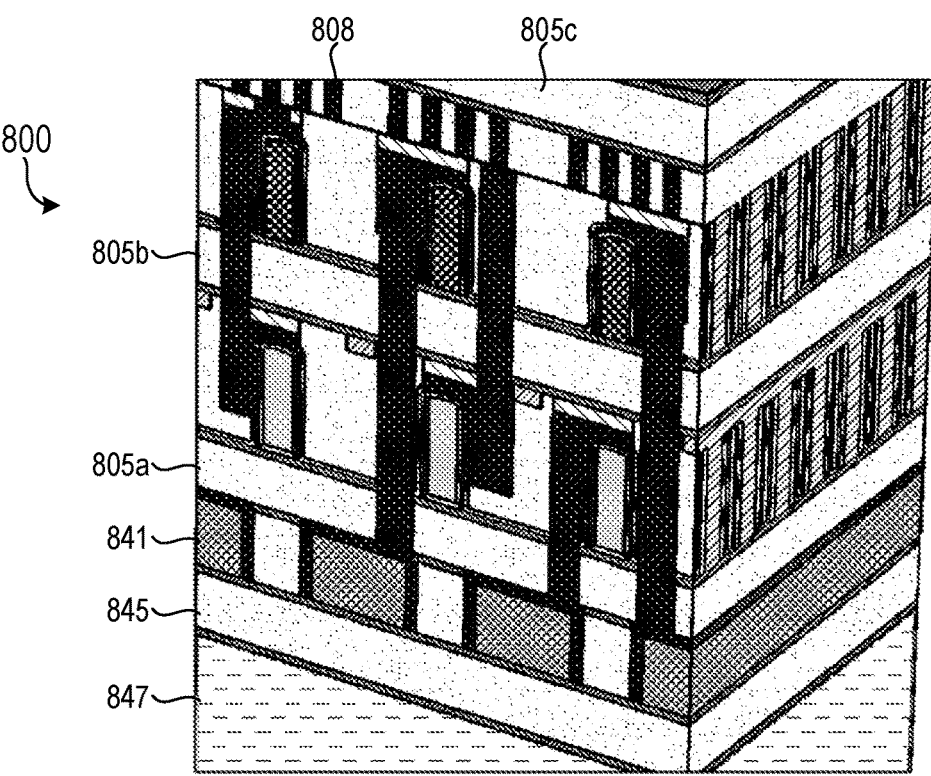
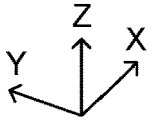
Figure 70

SEQUENTIAL COMPLIMENTARY FET INCORPORATING BACKSIDE POWER DISTRIBUTION NETWORK THROUGH WAFER BONDING PRIOR TO FORMATION OF ACTIVE DEVICES

INCORPORATION BY REFERENCE

This present disclosure claims the benefit of U.S. Provisional Application No. 63/344,141, filed on May 20, 2022, which is incorporated herein by reference in its entirety. Aspects of the present disclosure are related to Applicant's U.S. Pat. Nos. 10,586,765 and 10,770,479 and Applicant's patent applications titled "Method to Form Silicon-Germanium Nanosheet Structures", "Method for Wrap-Around Contact Formation Through the Incorporation of Cladding of an Etch-Selective Semiconductor Material", "Method of Forming Confined Growth S/D Contact with Selective Deposition of Inner Spacer for CFET", and "Method to Reduce Parasitic Resistance for CFET Devices Through Single Damascene Processing of Vias", all of which are incorporated herein by reference in their entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of forming the semiconductor device.

According to a first aspect of the disclosure, a method of manufacturing a semiconductor device is provided. The method includes bonding a first wafer to a second wafer via a first bonding dielectric layer. The first wafer includes a first bulk semiconductor material. The second wafer includes a first stack of alternating layers of epitaxially grown semiconductor layers formed over a second bulk semiconductor material. The second bulk semiconductor material is removed to uncover the first stack. A first tier of transistors is formed from the first stack. A third wafer is bonded to the second wafer via a second bonding dielectric layer. The third wafer includes a second stack of alternating layers of epitaxially grown semiconductor layers formed over a third bulk semiconductor material. The third bulk semiconductor material is removed. A second tier of transistors is formed from the second stack. The first bulk semiconductor material is removed to uncover the first bonding dielectric layer. A power delivery network in contact with the first bonding dielectric layer is formed. The power delivery network includes backside power rails in contact with vias that extend through the first bonding dielectric layer.

In some embodiments, the backside power rails are formed after forming the first tier of transistors and the second tier of transistors.

In some embodiments, before the third wafer is bonded to the second wafer, local interconnect (LI) structures connected to source/drain (S/D) structures of the first tier of transistors are formed. At least one via is formed that connects to a respective LI structure and extends through the first bonding dielectric layer.

In some embodiments, a respective backside power rail in contact with the at least one via is formed.

In some embodiments, at least one via opening is formed to uncover the first bulk semiconductor material. The at least one via opening is partially filled with a filler material. LI openings are formed, which include a respective LI opening that connects to the at least one via opening. The filler material is removed. The LI openings and the at least one via opening are filled with a conductive material to form the LI structures and the at least one via.

In some embodiments, after the third wafer is bonded to the second wafer, LI structures connected to S/D structures of the second tier of transistors are formed. At least one via is formed that connects to a respective LI structure and extends through the second bonding dielectric layer and the first bonding dielectric layer.

In some embodiments, a respective backside power rail in contact with the at least one via is formed.

In some embodiments, at least one via opening is formed to uncover the first bulk semiconductor material. The at least one via opening is partially filled with a filler material. LI openings are formed, which include a respective LI opening that connects to the at least one via opening. The filler material is removed. The LI openings and the at least one via opening are filled with a conductive material to form the LI structures and the at least one via.

In some embodiments, at least one via is formed that extends through the second bonding dielectric layer and is configured to electrically connect a first S/D structure of the first tier of transistors to a second S/D structure of the second tier of transistors.

In some embodiments, a signal wiring layer is formed over the second tier of transistors.

In some embodiments, vias are formed that connect the signal wiring layer to the first tier of transistors and the second tier of transistors.

In some embodiments, before the first bulk semiconductor material is removed to uncover the first bonding dielectric layer, a carrier wafer is bonded to the third wafer.

In some embodiments, after the power delivery network is formed, a carrier wafer is bonded to the backside power rails or forming a fourth bulk semiconductor material to cover the backside power rails.

According to a second aspect of the disclosure, a semiconductor device is provided. The semiconductor device includes backside power rails over a bulk semiconductor material, a first bonding dielectric layer over the backside power rails, a first tier of transistors over the first bonding dielectric layer, a second bonding dielectric layer over the first tier of transistors, and a second tier of transistors over the second bonding dielectric layer. The first tier of transistors includes first channel structures having a first epitaxially grown semiconductor material. The second tier of transistors includes second channel structures having a second epitaxially grown semiconductor material. The backside power rails are spaced apart from the first tier of transistors by the first bonding dielectric layer, and the first tier of transistors are spaced apart from the second tier of transistors by the second bonding dielectric layer.

In some embodiments, at least one backside power rail overlaps with a respective S/D structure of the first tier of transistors along a thickness direction of the bulk semiconductor material.

In some embodiments, there is no semiconductor material between the backside power rails.

In some embodiments, there is no semiconductor material between the first tier of transistors and the backside power rails.

In some embodiments, the semiconductor device further includes a signal wiring layer over the second tier of transistors.

In some embodiments, the semiconductor device further includes a first via that extends through the first bonding dielectric layer and is configured to electrically connect a first backside power rail to a respective S/D structure of the first tier of transistors. A second via extends through the first bonding dielectric layer and the second bonding dielectric layer and is configured to electrically connect a second backside power rail to a respective S/D structure of the second tier of transistors.

In some embodiments, the first tier of transistors includes gate-all-around transistors.

According to a third aspect of the disclosure, a method of manufacturing a semiconductor device is provided. The method includes forming a first tier of transistors and a second tier of transistors over the first tier of transistors. The first tier of transistors is formed on a first bonding dielectric layer on a first bulk semiconductor material. The second tier of transistors is formed on a second bonding dielectric layer. The second bonding dielectric layer separate the first tier of transistors from the second tier of transistors. The first tier of transistors and the second tier of transistors have gate-all-around transistors. First via openings are formed that extend through the first tier of transistors and the first bonding dielectric layer. Subsequent to forming the first via openings, first local interconnect (LI) openings are formed that connect with the first via openings. Second via openings are formed that extend through the second tier of transistors, the second bonding dielectric layer, the first tier of transistors and the first bonding dielectric layer. Subsequent to forming the second via openings, second LI openings are formed that connect with the second via openings.

In some embodiments, the first via openings and the first LI openings are filled with conductive metal material in a first metallization process to form first vias and first LI structures.

In some embodiments, third LI openings are formed that are separated from the first via openings and configured to be electrically connect to S/D structures of the first tier of transistors.

In some embodiments, the first LI openings and the third LI openings are formed in a same etch process. The third LI openings are filled in the first metallization process to form third LI structures.

In some embodiments, third via openings are formed, which extend through the second tier of transistors and the second bonding dielectric layer, to uncover the third LI structures.

In some embodiments, after forming the third via openings, fourth LI openings are formed that connect with the third via openings.

In some embodiments, the third via openings and the fourth LI openings are filled with a conductive metal material in a second metallization process to form third vias and fourth LI structures.

In some embodiments, each of the third vias connects a respective third LI structure to a respective fourth LI structure.

In some embodiments, the second via openings and the second LI openings are filled in a second metallization process to form second vias and second LI structures.

In some embodiments, third LI openings are formed that are separated from the second via openings and configured to be electrically connect to S/D structures of the second tier of transistors.

In some embodiments, the second LI openings and the third LI openings are formed in a same etch process. The third LI openings are filled in the second metallization process to form third LI structures.

In some embodiments, the second via openings are partially filled with a second filler material, before forming the second LI openings. The second filler material is removed, before forming the second vias and the second LI structures.

In some embodiments, the first via openings are partially filled with a first filler material, before forming the first LI openings. The first filler material is removed, before forming the first vias and the first LI structures.

In some embodiments, backside power rails are formed so that the backside power rails and the first tier of transistors are positioned on opposing sides of the first bonding dielectric layer.

In some embodiments, the backside power rails are formed after forming the first via openings and forming the second via openings.

In some embodiments, the first via openings and the second via openings are filled with conductive metal material to form first vias and second vias. The first bulk semiconductor material is removed to uncover the first bonding dielectric layer, the first vias and the second vias.

In some embodiments, backside power rails are formed that are in contact with at least one via selected from the group consisting of the first vias and the second vias.

In some embodiments, a signal wiring layer is formed over the second tier of transistors.

In some embodiments, third vias are formed that are configured to electrically connect the signal wiring layer to the first tier of transistors. Fourth vias are formed that are configured to electrically connect the signal wiring layer to the second tier of transistors.

In some embodiments, the signal wiring layer is formed, after forming the first via openings, the second via openings, the third vias and the fourth vias.

According to a fourth aspect of the disclosure, a method of manufacturing a semiconductor device is provided. The method includes forming a stack of epitaxially grown layers alternating between a first semiconductor material and a second semiconductor material that is etch selective to the first semiconductor material. Fin structures are formed from the stack. The fin structures include channel structures formed of the first semiconductor material. Source/drain (S/D) structures are formed on opposing ends of the channel structures by epitaxially growing a third semiconductor material. A silicide is formed around the S/D structures.

In some embodiments, before forming the silicide around the S/D structures, a sacrificial film is formed around the S/D structures by epitaxially growing a fourth semiconductor material that is etch selective to the third semiconductor material.

In some embodiments, the sacrificial film is covered with a dielectric film. Openings are formed in the stack. The sacrificial film is removed around the S/D structures.

In some embodiments, at least one via opening is formed in the stack to uncover a bulk semiconductor material below the stack. The at least one via opening is partially filled with a filler material before forming the silicide.

In some embodiments, a contact etch stop layer (CESL) is formed around the sacrificial film. Local interconnect (LI) openings are formed to uncover the CESL. The CESL is removed to uncover the sacrificial film.

In some embodiments, the filler material is removed, after forming the silicide. The LI openings and the at least one via opening are filled with conductive metal material.

In some embodiments, the filler material covers the bulk semiconductor material and a sidewall of the CESL while forming the silicide.

In some embodiments, a metal capping material is formed around the silicide.

In some embodiments, a protective film is formed over the fin structures. A dummy gate is formed over the protective film. The dummy gate is patterned while the protective film protects the fin structures.

In some embodiments, the dummy gate is patterned in a direction orthogonal to the fin structures.

In some embodiments, a hardmask material is formed over the dummy gate.

In some embodiments, a constraint material is formed to cover the fin structures. The constraint material includes sidewall constraints and top constraints covering S/D regions.

In some embodiments, the top constraints are removed to uncover top surfaces of the fin structures while keeping the sidewall constraints covering sidewalls of the fin structures.

In some embodiments, exposed portions of the fin structures between the sidewall constraints are removed.

In some embodiments, the S/D structures are formed between the sidewall constraints.

In some embodiments, recesses are formed in the second semiconductor material. Inner spacers are formed in the recesses.

In some embodiments, an uppermost layer of the second semiconductor material of the stack is formed with a sufficient thickness so as to avoid protrusion shape of the S/D structures.

In some embodiments, a first wafer is bonded to a second wafer via a first bonding dielectric layer. The first wafer includes a first bulk semiconductor material. The second wafer includes the stack formed over a second bulk semiconductor material. The second bulk semiconductor material is removed to uncover the stack before forming the fin structures from the stack.

In some embodiments, the first bulk semiconductor material is removed to uncover the first bonding dielectric layer. A power delivery network is formed in contact with the first bonding dielectric layer. The power delivery network includes backside power rails in contact with vias that extend through the first bonding dielectric layer.

In some embodiments, bonding a third wafer is bonded to the second wafer via a second bonding dielectric layer. The third wafer includes another stack of alternating layers of epitaxially grown semiconductor layers formed over a third bulk semiconductor material. The third bulk semiconductor material is removed. A tier of transistors is formed from another stack.

According to a fifth aspect of the disclosure, a method of manufacturing a semiconductor device is provided. The method includes forming a stack of epitaxially grown layers alternating between a first semiconductor material and a second semiconductor material that is etch selective to the first semiconductor material. forming fin structures are formed from the stack, the fin structures including channel structures formed of the first semiconductor material, the channel structures having opposing ends that are uncovered. Sidewall constraints are formed at the opposing ends of the channel structures. Each pair of the sidewall constraints laterally bound a respective source/drain (S/D) region at a respective end of the channel structures while having a respective top opening for accessing the respective S/D region. S/D structures are formed on the opposing ends of the channel structures by epitaxially growing a third semiconductor material between each pair of the sidewall constraints.

In some embodiments, exposed portions of the fin structures between each pair of the sidewall constraints are removed via the respective top opening.

In some embodiments, recesses are formed in the second semiconductor material. Inner spacers are formed in the recesses.

In some embodiments, the first semiconductor material is recessed after forming the inner spacers.

In some embodiments, the inner spacers are deposited on the second semiconductor material selectively, relative to the first semiconductor material, to form the inner spacers.

In some embodiments, a constraint material is formed to cover the fin structures. The constraint material includes the sidewall constraints and top constraints covering S/D regions.

In some embodiments, the top constraints of the constraint material are removed selectively, relative to the sidewall constraints, to uncover the S/D regions.

In some embodiments, the constraint material is formed conformally over the fin structures.

In some embodiments, the sidewall constraints laterally confine the third semiconductor material when epitaxially growing the third semiconductor material.

In some embodiments, the third semiconductor material is epitaxially grown to a height below a top of the sidewall constraints.

In some embodiments, an uppermost layer of the second semiconductor material of the stack is formed with a sufficient thickness so as to avoid protrusion shape of the S/D structures.

In some embodiments, a protective film is formed over the fin structures. A dummy gate is formed over the protective film. The dummy gate is patterned while the protective film protects the fin structures.

In some embodiments, the dummy gate and the protective film are removed to uncover the fin structures in gate regions. The second semiconductor material in the gate regions is removed.

In some embodiments, gate structures are formed all around the channel structures.

In some embodiments, the dummy gate is patterned in a direction orthogonal to the fin structures.

In some embodiments, a hardmask material is formed over the dummy gate.

In some embodiments, the sidewall constraints are removed after forming the S/D structures.

In some embodiments, a first wafer is bonded to a second wafer via a first bonding dielectric layer. The first wafer includes a first bulk semiconductor material. The second wafer includes the stack formed over a second bulk semiconductor material. The second bulk semiconductor material is removed to uncover the stack before forming the fin structures from the stack.

In some embodiments, the first bulk semiconductor material is removed to uncover the first bonding dielectric layer. A power delivery network is formed in contact with the first bonding dielectric layer. The power delivery network includes backside power rails in contact with vias that extend through the first bonding dielectric layer.

In some embodiments, a third wafer is bonded to the second wafer via a second bonding dielectric layer. The third wafer includes another stack of alternating layers of epitaxially grown semiconductor layers formed over a third bulk semiconductor material. The third bulk semiconductor material is removed. A tier of transistor is formed from the another stack.

According to a sixth aspect of the disclosure, a method of manufacturing a semiconductor device is provided. The method includes forming a stack of epitaxially grown layers alternating between a first semiconductor material and a second semiconductor material that is etch selective to the first semiconductor material. Fin structures are formed from the stack. The fin structures include channel structures formed of the first semiconductor material. Cross-sections of the channel structures are shrunk. A third semiconductor material is formed all around the channel structures. The third semiconductor material has lattice mismatch with the first semiconductor material.

In some embodiments, shrinking the cross-sections of the channel structures includes shrinking the cross-sections of middle portions of the channel structures while leaving opposing ends of the channel structures unshrunk.

In some embodiments, the third semiconductor material is formed all around the middle portions of the channel structures.

In some embodiments, gate structures are formed all around the third semiconductor material.

In some embodiments, source/drain (S/D) structures are formed on the opposing ends of the channel structures by epitaxially growing a fourth semiconductor material.

In some embodiments, portions of the fin structures at the opposing ends of the channel structures are removed to uncover the second semiconductor material and the opposing ends of the channel structures. Recesses are formed in the second semiconductor material. Inner spacers are formed in the recesses.

In some embodiments, shrinking the cross-sections of the channel structures includes executing an isotropic etch process.

In some embodiments, the isotropic etch process and the third semiconductor material are configured to provide strain to the cores of the channel structures.

In some embodiments, the first semiconductor material includes epitaxially grown silicon, and the third semiconductor material includes silicon-germanium.

In some embodiments, sufficient silicon-germanium is deposited to increase hole mobility of the channel structures as compared to an initial silicon channel structure.

In some embodiments, a first wafer is bonded to a second wafer via a first bonding dielectric layer. The first wafer includes a first bulk semiconductor material. The second wafer includes the stack formed over a second bulk semiconductor material. The second bulk semiconductor material is removed to uncover the stack before forming the fin structures from the stack.

In some embodiments, the first bulk semiconductor material is removed to uncover the first bonding dielectric layer. A power delivery network is formed in contact with the first bonding dielectric layer. The power delivery network includes backside power rails in contact with vias that extend through the first bonding dielectric layer.

In some embodiments, a third wafer is bonded to the second wafer via a second bonding dielectric layer. The third wafer includes an additional stack of alternating layers of epitaxially grown semiconductor layers formed over a third bulk semiconductor material. The third bulk semiconductor material is removed. Transistors are formed from the additional stack.

According to a seventh aspect of the disclosure, a semiconductor device is provided. The semiconductor device includes a tier of transistors and devices. Each transistor includes a respective channel structure including a first epitaxially grown semiconductor material, a respective shell structure all around a respective middle portion of the respective channel structure, a respective gate structure all around the respective shell structure, and respective source/drain (S/D) structures on respective opposing ends of the respective channel structure. The respective middle portion of each channel structure has a smaller circumference than the respective opposing ends of each channel structure when viewed from a respective current direction in the channel structure. The respective shell structure is formed of a semiconductor material having lattice mismatch with the first epitaxially grown semiconductor material.

In some embodiments, when viewed from the respective current direction in each channel structure, the respective middle portion and the respective opposing ends are co-axial.

In some embodiments, the semiconductor device further includes backside power rails over a bulk semiconductor material, a first bonding dielectric layer over the backside power rails and below the tier of transistors, a second bonding dielectric layer over the tier of transistors, and an additional tier of transistors and devices over the second bonding dielectric layer. The additional tier of transistors includes channel structures including a second epitaxially grown semiconductor material. The backside power rails are spaced apart from the tier of transistors by the first bonding dielectric layer, and the tier of transistors are spaced apart from the additional tier of transistors by the second bonding dielectric layer.

In some embodiments, the semiconductor device further includes a first via that extends through the first bonding dielectric layer and is configured to electrically connect a first backside power rail to the tier of transistors and devices. A second via extends through the first bonding dielectric layer and the second bonding dielectric layer and is configured to electrically connect a second backside power rail to the additional tier of transistors and devices.

In some embodiments, each transistor further includes respective inner spacers positioned between a respective gate structure and respective source/drain (S/D) structures.

In some embodiments, the semiconductor device further includes a signal wiring layer over the tier of transistors and devices.

In some embodiments, the first epitaxially grown semiconductor material includes epitaxially grown silicon. The respective shell structure includes silicon-germanium.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a cross-sectional perspective orthogonal to a metal interconnect structure; and FIG. 1B shows a cross-sectional perspective orthogonal to a metal gate structure.

FIG. 5 shows a flow chart of a process for manufacturing a semiconductor device, in accordance with yet another embodiment of the present disclosure.

FIG. 6 shows a flow chart of a process for manufacturing a semiconductor device, in accordance with yet another embodiment of the present disclosure.

FIG. 7 shows a flow chart of a process for manufacturing a semiconductor device, in accordance with yet another embodiment of the present disclosure.

FIGS. 8-70 show cross-sectional perspective views of a semiconductor device at various intermediate steps of manufacturing, in accordance with some embodiments of the present disclosure.

FIG. 13B shows an expanded view of Rectangle R13 in FIG. 13, in accordance with one embodiment of the present disclosure.

FIG. 14B shows an expanded view of Rectangle R14 in FIG. 14, in accordance with one embodiment of the present disclosure.

FIG. 15B shows an expanded view of Rectangle R15 in FIG. 15, in accordance with one embodiment of the present disclosure.

FIG. 22B shows an expanded view of Rectangle R22 in FIG. 22, in accordance with one embodiment of the present disclosure.

FIG. 25B shows an expanded view of Rectangle R25 in FIG. 25, in accordance with one embodiment of the present disclosure.

FIG. 30B shows an expanded view of Rectangle R30 in FIG. 30, in accordance with one embodiment of the present disclosure.

FIG. 31B shows an expanded view of Rectangle R31 in FIG. 31, in accordance with one embodiment of the present disclosure.

FIG. 32B shows an expanded view of Rectangle R32 in FIG. 32, in accordance with one embodiment of the present disclosure.

FIG. 33B shows an expanded view of Rectangle R33 in FIG. 33, in accordance with one embodiment of the present disclosure.

FIG. 41B shows an expanded view of Rectangle R41 in FIG. 41, in accordance with one embodiment of the present disclosure.

FIG. 52B shows an expanded view of Rectangle R52 in FIG. 52, in accordance with one embodiment of the present disclosure.

DETAILED DESCRIPTION

Figures 1A, 1B:
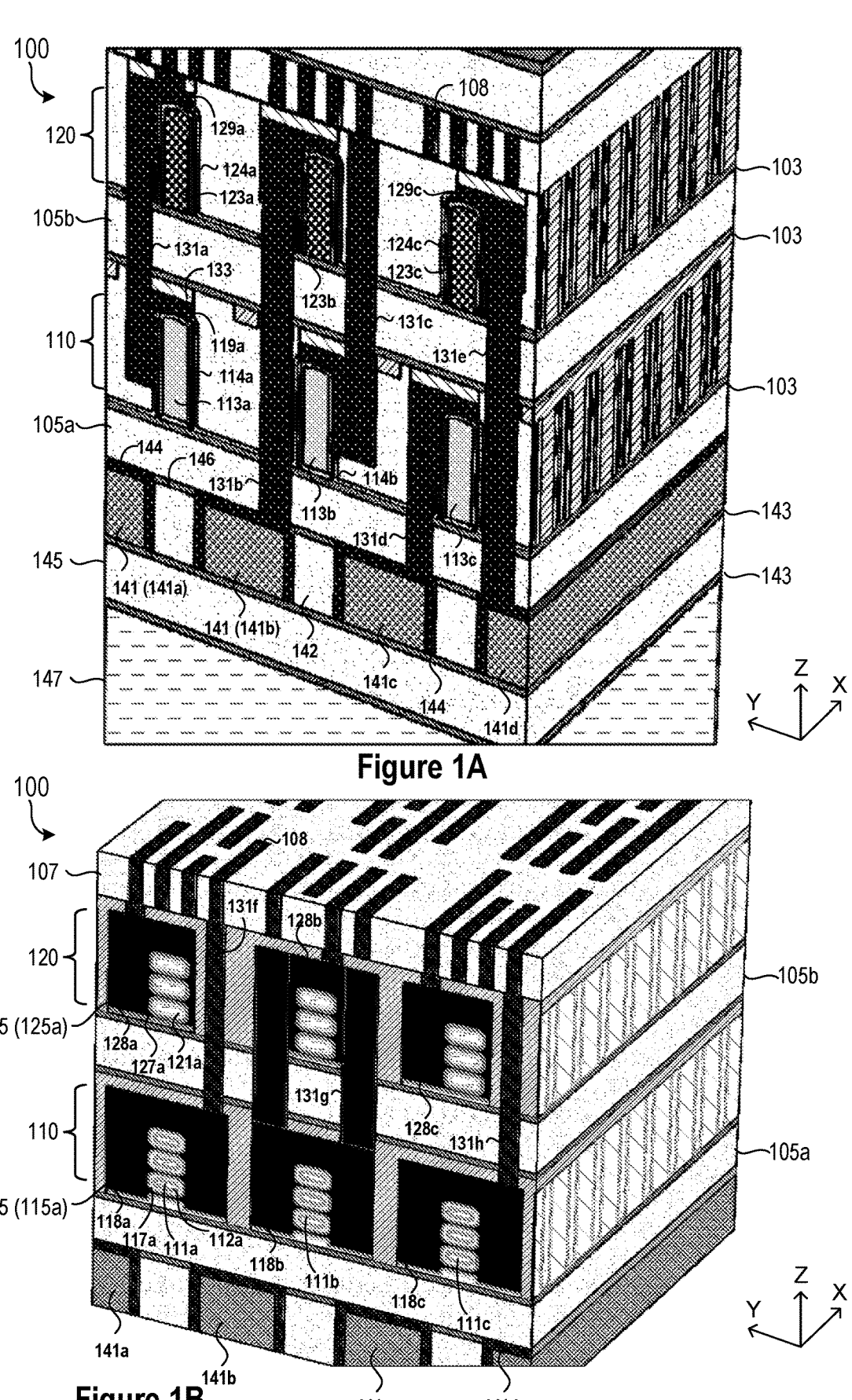
FIGS. 1A and 1B show cross-sectional perspective views of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

The buried power rail (BPR) technology may hold promise for being integrated into new CMOS technology nodes expected to come into high volume manufacturing within the next several years. The buried power rail technology, however, does have some disadvantages, including: (1) width of the buried power rail is constrained by the presence of the residual FIN under the nanosheet stack, (2) metallization of the buried power through a fill and recess etch process leads to significant variability which can negatively impact device performance, (3) difficult to incorporate buried signal lines along with the buried power rails due to the presence of the substrate and residual FIN structures under the nanosheet stack, (4) with wafer backside formation of the buried power rails, making connections to the interconnects connecting to the source and drain contacts become very difficult, as any edge placement error (EPE) driven by misalignment of critical dimension (CD) variability can easily lead to the via unintentionally shorting to the transistor in said etch process.

What is needed is a more flexible backside wiring approach in which the VDD/VSS power can be supplied by very large structures to provide superior IR drop and more interfacial area for connections of vias or dropped interconnect structures to minimize parasitic resistances. Also, what is needed is the ability to incorporate not only backside power, but also backside signal wiring which can be used for a variety of applications such as (a) further reduction of standard cell height through incorporating some tracks of MO on the wafer back-side, (b) incorporating an alternate approach for forming cross-couples for SRAM devices, et cetera.

Techniques disclosed herein include a method of forming stacked field-effect transistor devices. Methods include bonding a wafer with a first layer stack of alternating epitaxial layers to another wafer with a dielectric layer via a first bonding dielectric layer, to form a composite wafer. A first tier of gate-all-around transistors is formed from the first layer stack. A third wafer is bonded to the composite wafer. The third wafer has a second layer stack of alternating epitaxial layers, and a second tier of gate-all-around transistors is formed from this second layer stack after wafer bonding, with the second tier of gate-all-around transistors being complimentary to those of the first tier of gate-all-around transistors. A power distribution network can then be formed at or adjacent to the first bonding dielectric layer, enabling wider power rails.

U.S. Pat. No. 10,586,765, titled "Buried power rails", described a method in which portions of the power distribution network (PDN) could be placed under the active device and transistor of CMOS logic and SRAM to provide significant area scaling in which the large VDD and VSS power rails could be removed from the traditional back-end-of-the-line (BEOL), thus reducing the heights of the standard cells as the power rails could now be accessed through the bottom of the active device and transistors.

Figure 2A:
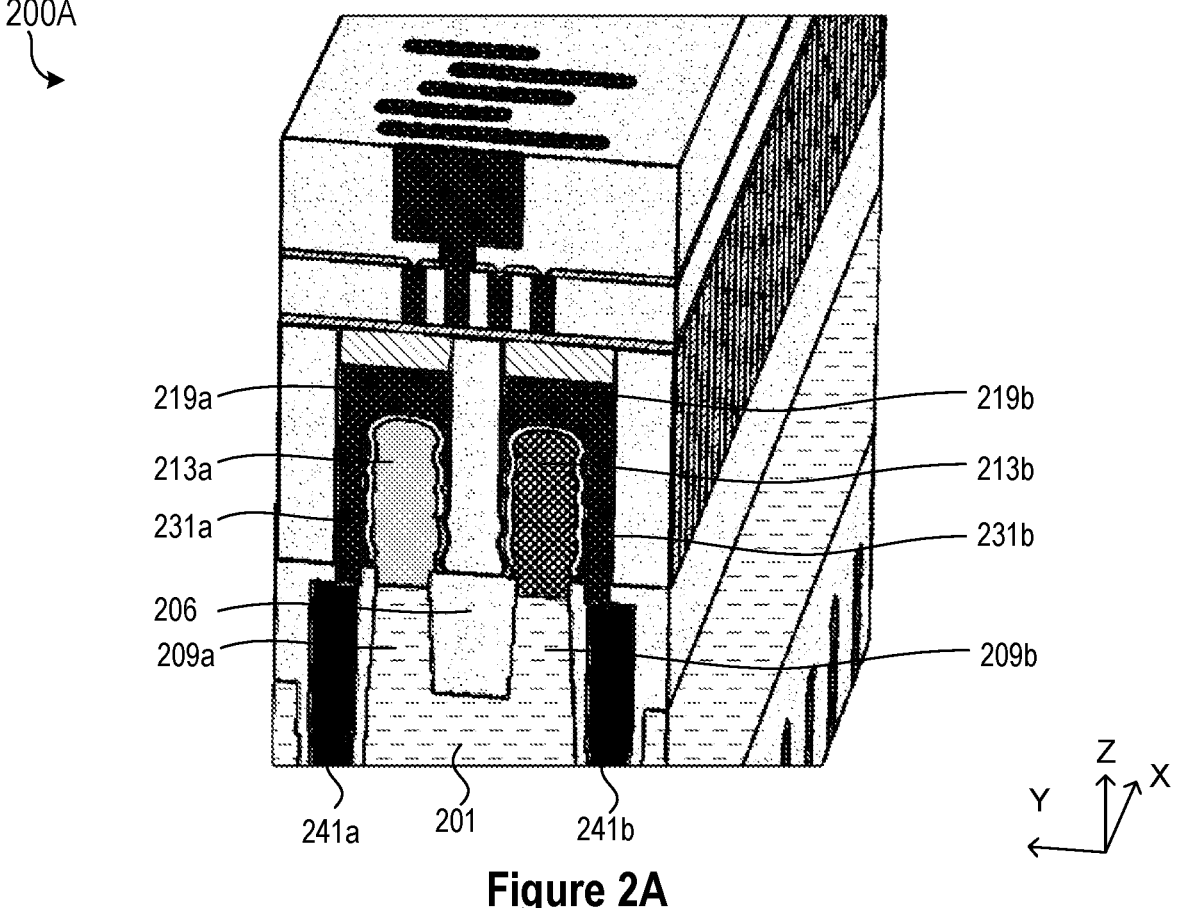
FIG. 2A shows a cross-sectional perspective view of a semiconductor device in related examples.

FIG. 2A shows an illustration of buried power rails or backside power rails. "Buried power rails" as used herein generally refer to power rails that are formed during front-end-of-the-line (FEOL) integrations. "Backside power rails" as used herein generally refer to power rails that are formed after the wafer is flipped to reveal the wafer backside. For example, power rails 241a and 241b are shown in black representing a high refractive and high conductivity metal such as ruthenium, tungsten, molybdenum, or other similar metals. These power rails can be used as buried VDD and VSS rails and can be formed either (1) during front-end-of-the-line (FEOL) integrations, in which case the metal choice will be critical given the number of high temperature processes incorporated this early in the conventional CMOS device manufacturing process, or (2) alternatively after the BEOL processing has been done (also called backside power rails), in which case the wafer is simply flipped over to reveal the wafer backside where the bulk silicon substrate can be grinded down to a point where the backside power rails can be formed. In the latter case, this allows for a greater selection of metals which do not have high thermal processing restrictions and potentially better conductivity at the given rail sizes, such as copper.

The power rails 241a and 241b need to connect to source and drain contacts (also referred to as source and drain structures or S/D structures) 213a and 213b of a CMOS device, and this can be accomplished through multiple techniques such as, but not limited to, (a) extending the metal interconnect down past the shallow trench isolation (STI) 206 to make direct contact to the buried power rails, (b) incorporation of vias 231a and 231b which will extend down from metal interconnects 219a and 219b down past the STI 206 to make direct contact to the power rails 241a and 241b, (c) or the inverse of (b) where the vias are formed as part of the back-side power rail formation process and the vias effectively are formed in a way where the power rails connect upward to either the contact directly or to an interconnect metal which is in contact with the source and drain contacts.

In most applications of incorporating a buried power rail, the power rail (e.g. 241a or 241b) is effectively constrained to a trench which has been transferred into a bulk substrate (e.g. 201). This places some restrictions on the buried power rail (e.g. 241a or 241b) in terms of its width, and as a result, its IR drop, as well as how much space is available to make a connection between VSS/VDD and its corresponding interconnect or source and drain contact. For any given standard cell height, the width of the buried power rails (e.g. 241a and 241b) will now impact what width of the nanosheets can be used as well as the minimum space between NMOS and PMOS. Optimization is done for a given device to optimize power, performance, and area, however this is a constrained optimization. The reason for these constraints is because residual FIN structure 209a or 209b used in the nanosheet generation process is still present in the current integrations and this prevents any width increases in the power rails (e.g. 241a and 241b).

However, with a backside processing approach to backside power rails, the residual FIN structures 209a and 209b will no longer connect to bulk (e.g. 201), as the bulk substrate (e.g. 201) has been grinded down to the STI oxide (e.g. 206). The residual FIN structures e.g. 209 and 209b under the nanosheet device, however, will remain. The repercussion of this approach is that the (backside) power rails 241a and 241b can be increased in width to improve IR drop, however in this case the (backside) power rails 241a and 241b will need to be formed below the bottom of the residual silicon FIN 209a and 209b, meaning that the vias 231a and 231b connecting to interconnect metals (e.g. 219a and 219b) will now need to be much taller, leading to higher parasitic resistance. For the case of CFET integrations in which NMOS and PMOS devices are stacked overtop of one another, this parasitic resistance is already one of the primary drivers impacting power and performance, so any increase in the height of these vias is discouraged without any parallel increases in width of the vias to offset the added resistance resulting from the taller vias.

Figure 2B:
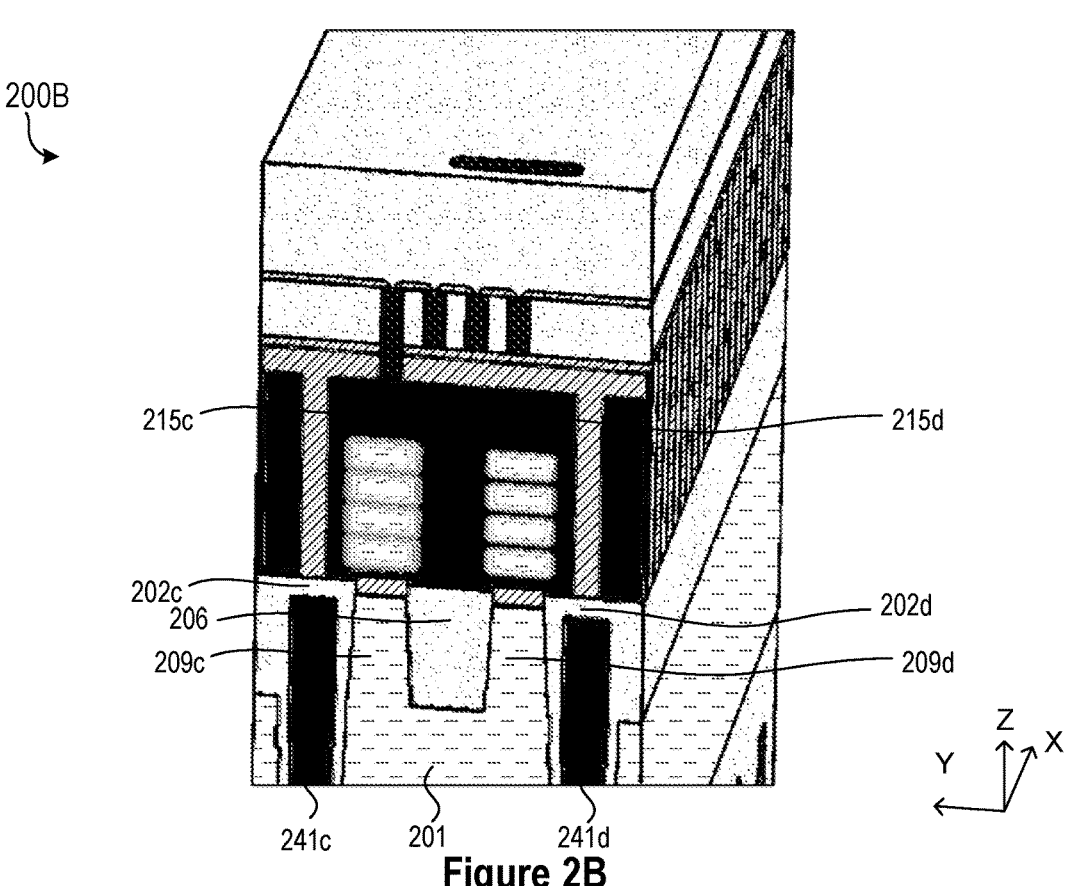
FIGS. 2B and 2C show cross-sectional perspective views of a semiconductor device in related examples.
Figure 2C:
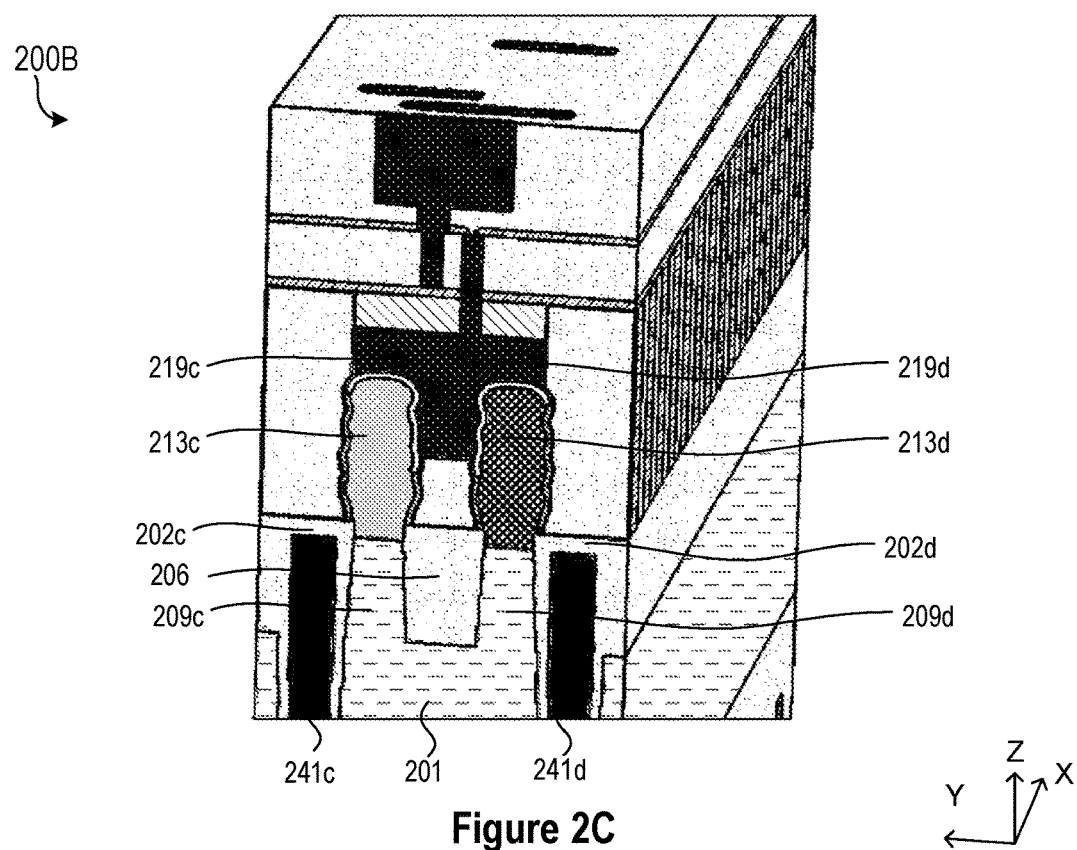

Buried or backside power rails may need to be well isolated from the transistors as well as the source and drain contacts which are pulling up to signal wires in the BEOL. This can be shown in FIGS. 2B and 2C. In this particular example, power rails 241c and 241d are filled with metal and then recessed down through, for example, a metal etch process or through a bottom-up metal filling process, and then the top of the power rails 241c and 241d are back-filled with either oxide or another dielectric or form a type of etch-selective dielectric cap (e.g. 202c and 202d) over the metallized power rails 241c and 241d.

The buried power rail technology may hold promise for being integrated into new CMOS technology nodes expected to come into high volume manufacturing within the next several years. The buried power rail technology, however, does have some disadvantages, including: (1) width of the buried power rail is constrained by the presence of the residual FIN under the nanosheet stack, (2) metallization of the buried power through a fill and recess etch process leads to significant variability which can negatively impact device performance, (3) difficult to incorporate buried signal lines along with the buried power rails due to the presence of the substrate and residual FIN structures under the nanosheet stack, (4) with wafer backside formation of the buried power rails, making connections to the interconnects connecting to the source and drain contacts become very difficult, as any edge placement error (EPE) driven by misalignment of critical dimension (CD) variability can easily lead to the via unintentionally shorting to the transistor in said etch process.

What is needed is a more flexible backside wiring approach in which the VDD/VSS power can be supplied by very large structures to provide superior IR drop and more interfacial area for connections of vias or dropped interconnect structures to minimize parasitic resistances. Also, what is needed is the ability to incorporate not only backside power, but also backside signal wiring which can be used for a variety of applications such as (a) further reduction of standard cell height through incorporating some tracks of MO on the wafer back-side, (b) incorporating an alternate approach for forming cross-couples for SRAM devices, et cetera.

FIGS. 1A and 1B show cross-sectional perspective views of a semiconductor device 100, in accordance with some embodiments of the present disclosure. The semiconductor device 100 includes backside power rails 141 (for example as shown by 141a, 141b, 141c and 141d) over a bulk semiconductor material 147. A first bonding dielectric layer 105a is disposed over the backside power rails 141. A first tier 110 of transistors is disposed over the first bonding dielectric layer 105a. A second bonding dielectric layer 105b is disposed over the first tier 110 of transistors. A second tier 120 of transistors is disposed over the second bonding dielectric layer 105b. A signal wiring layer 107 having signal lines 108 is disposed over the second tier 120 of transistors.

Herein, the backside power rails 141 are spaced apart from the first tier 110 of transistors by the first bonding dielectric layer 105a while the first tier 110 of transistors is spaced apart from the second tier 120 of transistors by the second bonding dielectric layer 105b. The backside power rails 141 can be separated from each other by a dielectric material 142. A backside power rail metal liner or barrier 144 may be disposed on top of and on sidewalls of the backside power rails 141. In another embodiment, a silicon-on-insulator (SOI) wafer is used, in which the first tier 110 of transistors can be made from a top portion of the SOI wafer. Accordingly, 105a represents an insulator of the SOI wafer. The benefit of the sequential bonding approach to the formation of the backside power distribution network over the incorporation of SOI wafers is that this can incorporate etch-stop layers (ESL) into the bonding dielectric which is not feasible for simple SOI wafers. The incorporation of the etch-stop layers (ESL) is important for advanced processing where it may be desirable to have an interconnect connect to the backside power directly under the actual source/drain contact.

Note that in the examples of FIGS. 1A and 1B, there is no semiconductor material between the backside power rails 141, in contrast to conventional devices such as the semiconductor device 200A where residual bulk semiconductor material (e.g. 201) and/or residual FIN structures (e.g. 209a and 209b) exist between neighboring buried power rails (e.g. 241a and 241b). Moreover, there is no semiconductor material between the first tier 110 of transistors and the backside power rails 141. Particularly, there is no semiconductor material within the first bonding dielectric layer 105a which is disposed between the first tier 110 of transistors and the backside power rails 141.

As a result, the backside power rails 141 herein can be wider than conventional buried power rails (e.g. 241a and 241b) in the Y direction. For instance, while not shown, at least one backside power rail (e.g. 141a) may overlap with a respective S/D structure (e.g. 113a) in the Z direction, which cannot be achieved in conventional devices such as the semiconductor device 220A where the residual FIN structure 209a and 209b preclude conventional buried power rails 241a and 242b from overlapping with the S/D structures 213a and 213b in the Z direction. In other words, the residual FIN structure 209a and 209b limit lateral dimensions of conventional buried power rails 241a and 242b.

The semiconductor device 100 can also include vias 131 (for example as shown by 131a, 131b, 131c, 131d, 131e, 131f, 131g and 131h) that are configured to electrically connect transistors to the backside power rails 141 or the signal wiring layer 107. For example, at least one first via (e.g. 131d) extends through the first bonding dielectric layer 105a and is configured to electrically connect a first backside power rail (e.g. 141c) to a respective source/drain (S/D) structure (e.g. 113c) of the first tier 110 of transistors. At least one second via (e.g. 131b and 131e) extends through the first bonding dielectric layer 105a and the second bonding dielectric layer 105b and is configured to electrically connect a second backside power rail (e.g. 141b and 141d) to a respective S/D structure (e.g. 123b and 123c) of the second tier 120 of transistors. At least one third via (e.g. 131c) extends through the second bonding dielectric layer 105b and is configured to electrically connect a respective S/D structure (e.g. 113b) of the first tier 110 of transistors to the signal wiring layer 107. At least one fourth via (e.g. 131a) extends through the second bonding dielectric layer 105b and is configured to electrically connect a respective S/D structure (e.g. 113a) of the first tier 110 of transistors to a respective S/D structure (e.g. 123a) of the second tier 120 of transistors. At least one fifth via (e.g. 131f) extends through the second bonding dielectric layer 105b and is configured to electrically connect a respective gate structure (e.g. 115a) of the first tier 110 of transistors to the signal wiring layer 107.

The semiconductor device 100 can further include local interconnect (LI) structures 119 and 129 (for example as shown by 119a, 129a and 129c) that are configured to electrically connect S/D structures of transistors to the vias 131. For example, an LI structure 119a is configured to electrically connect an S/D structure 113a to a via 131a.

Still referring to FIGS. 1A and 1B, the first tier 110 of transistors includes first channel structures 111 (for example as shown by 111a, 111b and 111c) and first gate structures 115 (for example as shown by 115a). The first tier 110 of transistors may include one or more (e.g. three) first transistors, n-type or p-type, arranged in the Y direction. Each of the first transistors may include one or more (e.g. three) first channel structures 111 stacked in the Z direction. As a result, each of the first set of channels/nanosheets (e.g. 111a) are connected within the same metal gate structure (e.g. 115a). That is, the metal gate metal (e.g. 115a) can be disposed all around the channel structures (e.g. 111a) stacked in the Z direction.

Likewise, the second tier 120 of transistors includes second channel structures 121 (for example as shown by 121a) and second gate structures 125 (e.g. 125a). The second tier 120 of transistors may include one or more (e.g. three) second transistors, n-type or p-type, arranged in the Y direction. Each of the second transistors may include one or more (e.g. three) second channel structures 121 stacked in the Z direction. As a result, each of the second set of channels/nanosheets (e.g. 121a) are connected within the same metal gate structure (e.g. 125a). That is, the metal gate metal (e.g. 125a) can be disposed all around the channel structures (e.g. 121a) stacked in the Z direction.

Further, it should be understood that the semiconductor device 100 can include any number of tiers of transistors (e.g. 110 and 120) disposed in the Z direction over the bulk semiconductor material 147.

Note that the first channel structures 111 can be formed of a first epitaxially grown semiconductor material (e.g. silicon) while the second channel structures 121 can be formed of a second epitaxially grown semiconductor material. "Epitaxial growth", "epitaxial deposition", "epitaxially grown", "epitaxially formed" or "epitaxy" as used herein generally refers to a type of crystal growth or material deposition in which a crystalline layer is formed over a seed layer that is crystalline. Crystalline characteristics (e.g. crystal orientation) of the crystalline layer are related to or dictated by crystalline characteristics of the seed layer. Particularly, a semiconductor material can be epitaxially grown on a surface of another semiconductor layer that is crystalline. In some embodiments, epitaxial growth can be selective such that a semiconductor material may only be epitaxially grown on another semiconductor surface and generally do not deposit on exposed surfaces of non-semiconductor materials, such as silicon oxide, silicon nitride, and the like. Epitaxial growth can be accomplished by molecular beam epitaxy, vapor-phase epitaxy, liquid-phase epitaxy, or the like. Si, SiGe, Ge and other semiconductor materials can be doped during epitaxial growth (in situ) by addition of dopants. For example in vapor-phase epitaxy, a dopant vapor can be added to the gas source.

In some embodiments, at least two channel structures can include different chemical compositions from one another. That is, at least two channel structures can include different semiconductor materials, different dopants and/or different dopant concentration profiles. For instance, the first channel structures 111 may include a different chemical composition from the second channel structures 121. In one example, the first channel structures 111 include <100> silicon while the second channel structures 121 include <110> silicon. In another embodiment, the first channel structures 111 include silicon while the second channel structures 121 include silicon germanium. Additionally, the first channel structures 111 and while the second channel structures 121 can have various shapes or geometry, e.g. nanosheets.

In some embodiments, the first gate structures 115 each include at least one gate dielectric 117 (for example as shown by 117a), such as a high-k dielectric, and at least one gate metal 118 (for example as shown by 118a, 118b and 118c), such as a work function metal (WFM). Similarly, the second gate structures 125 each include at least one gate dielectric 127 (for example as shown by 127a), such as a high-k dielectric, and at least one gate metal 128 (for example as shown by 128a, 128b and 128c), such as a WFM. As can be appreciated, gate metals 118 and 128 which function as the gate conductors may be the same as or different from each other, and gate dielectrics 117 and 127 may also be the same as or different from each other, depending on respective channel structures (e.g. 111a and 121a), design requirements (e.g. gate threshold voltage), etc. In this example, the at least one gate metal 118 is disposed all around the first channel structures 111 while the at least one gate metal 128 is disposed all around the second channel structures 121. Therefore, the first gate structure 115 and the second gate structure 125 can both be configured to function as common gate structures for multiple channel structures. In other examples (not shown), the first gate structures 115 and/or the second gate structures 125 may each be disposed all around a single channel structure. While the gate metals 118 and 128 are both as shown by a single material, the gate metals 118 and 128 may each be made up of two or more layers of metals having different work functions. Similarly, gate dielectrics 117 and 127 may each be made up of two or more layers of dielectric materials.

In some embodiments, a silicide (for example as shown by 114a, 114b, 124a and 124c) can be disposed all around a respective S/D structure to form a wrap-around S/D contact. In this example, first S/D structures 113 (e.g. 113a, 113b and 113c) and second S/D structures 123 (e.g. 123a, 123b and 123c) are each configured to electrically connect to one or more (e.g. three) channel structures. In alternative embodiments, the first S/D structures 113 and/or the second S/D structures 123 may be in direct contact with only one respective channel structure. Accordingly, the semiconductor device 100 can include one or more single-channel transistors.

In one embodiment, the first bonding dielectric layer 105a is formed by fusion bonding of silicon oxide, or any other suitable bonding dielectrics, and may have one or more bonding defects (not shown) at a bonding interface. As one having ordinary skill in the art would understand, such bonding defects at the bonding interface can include, but are not limited to, a non-bonded area, a void (e.g. a vacuum or air bubble), a trapped particle, a crack, etc. Such bonding defects can be characteristic of the semiconductor device 100. In other words, the first bonding dielectric layer 105a may not be a unitary piece and thus can be different from a dielectric layer conventionally formed by a deposition technique as the bonding interface can be different from an interface between two layers where one layer is deposited or formed over the other layer. Such bonding defects can be characterized or detected by known techniques such as acoustic micro-imaging, infrared transmission spectrometry, the double cantilever beam test, the (micro) Chevron test, bonding strength measurement, white light interferometry, etc. In another embodiment, there is no bonding defect at the bonding interface. Accordingly, the first bonding dielectric layer 105a can be a unitary piece. Similarly, the second bonding dielectric layer 105b may or may not have one or more bonding defects.

In this embodiment, the first bonding dielectric layer 105*a* is formed by fusion bonding, for example, of silicon oxide. In another embodiment (not shown), the first bonding dielectric layer 105*a* can be bonded by another wafer bonding technique, such as surface-activated bonding, plasma-activated bonding, anodic bonding, eutectic bonding, glass frit bonding, adhesive bonding, thermocompression bonding, reactive bonding, transient liquid phase diffusion bonding or the like. Accordingly, the first bonding dielectric layer 105*a* may include one or more different dielectric bonding materials. Similarly, the second bonding dielectric layer 105*b* may include one or more different dielectric bonding materials.

In some embodiments, the semiconductor device 100 can include dielectric materials, e.g. as shown by 103, 105*a*, 105*b*, 107, 117, 133, 142, 143, 145 and 146. The dielectric materials may also be referred to as isolation structures, isolation layers, diffusion breaks, inner spacers, gate dielectrics, capping layers, bonding dielectrics, contact etch stop layers (CESL), liners, barriers, etc. depending on functions thereof. For example, the dielectric material 143 can function as liners and as processing etch-stop layers. The dielectric material 133 can function as capping layers for the LI structures (e.g. 119*a* and 129*a*). Additionally, some of the dielectric materials may include identical materials or may include different materials. For example, the dielectric materials 142 and 145 may include a same material such as silicon oxide.

Still referring to FIGS. 1A and 1B, in some embodiments, a shell structure (e.g. 112*a*) can be disposed all around a middle portion of a channel structure (e.g. 111*a*), which will be further explained in FIGS. 32 and 32B. The shell structure (e.g. 112*a*) can be formed of a semiconductor material having lattice mismatch with the first epitaxially grown semiconductor material, for example to form a strained channel. Additionally, the semiconductor device 100 can include inner spacers (not shown) positioned between a respective gate structure and respective source/drain (S/D) structures, which will be shown and further explained in FIGS. 15 and 15B.

In a non-limiting example, FIG. 1A shows a cross-sectional perspective view of a substrate segment perpendicular to the nanosheet and parallel along source and contact plane. FIG. 1A illustrates many embodiments herein, including lack of any residual substrate (e.g. 201 in FIG. 2A) or residual FIN structure (e.g. 209*a* and 209*b* in FIG. 2A) under the source and drain contacts (e.g. 113*a*, 113*b* and 113*c*), relatively (very) wide backside power lines (e.g. 141) which are no longer confined to size based on the presence of any residual FIN or residual substrate, confined source and drain epitaxy profiles, wrap-around silicide (e.g. 114*a*, 124*a* and 124*c*) and metal (e.g. 131*a* and 119*a*) around the source and drain contacts, very wide vias (e.g. 131*e*) connecting backside power (e.g. 141*d*) to source and drain interconnects (e.g. 129*c*) as a means of reducing parasitic resistances, particularly with complimentary FET (CFET) devices, and self-aligned minimum dielectric spacing between the upsized vias and any complimentary metal interconnect.

In a non-limiting example, FIG. 1B shows the finished concept from the perspective of a cross-section perpendicular to the nanosheet and parallel along the transistor plane. From here many of the features of this disclosure are visible. Such features include removal of any residual substrate or residual FIN structure under the devices eliminate the need for any bottom dielectric isolation process (although one is shown in the image). Inter-tier vias (e.g. 131*g*) connecting complimentary transistors to form common NMOS/PMOS gates. Specific treatments to the PMOS channel to enhance hole mobility now that the strain effects from the substrate are negated due to the removal of the substrate. In this case, the silicon germanium cladding (e.g. 112*a*) over the PMOS silicon channel (e.g. 111*a*) is shown, but likewise note that this can be replaced by a pure silicon germanium or even germanium channel, as well as placement of the PMOS channel on the upper device tier in which the final wafer bonding of the PMOS active device stack is composed of a bulk silicon wafer of preferred crystal orientation to promote hole mobility. Vias (e.g. 131*f* and 131*h*) connecting BEOL input signal lines (e.g. 108) to bottom-tier transistors (e.g. 110) can now likewise be oversized to improve resistance, in which these vias (e.g. 131*f* and 131*h*) are patterned incorporating a single damascene process relative to the initial signal wires in the BEOL. While not shown, it should be understood that the inter-gate vias (e.g. 131*g*) can likewise be extended down to connect to backside power (e.g. 141*b* and/or 141*c*) to form gate tie-downs, if necessary.

Figure 3:
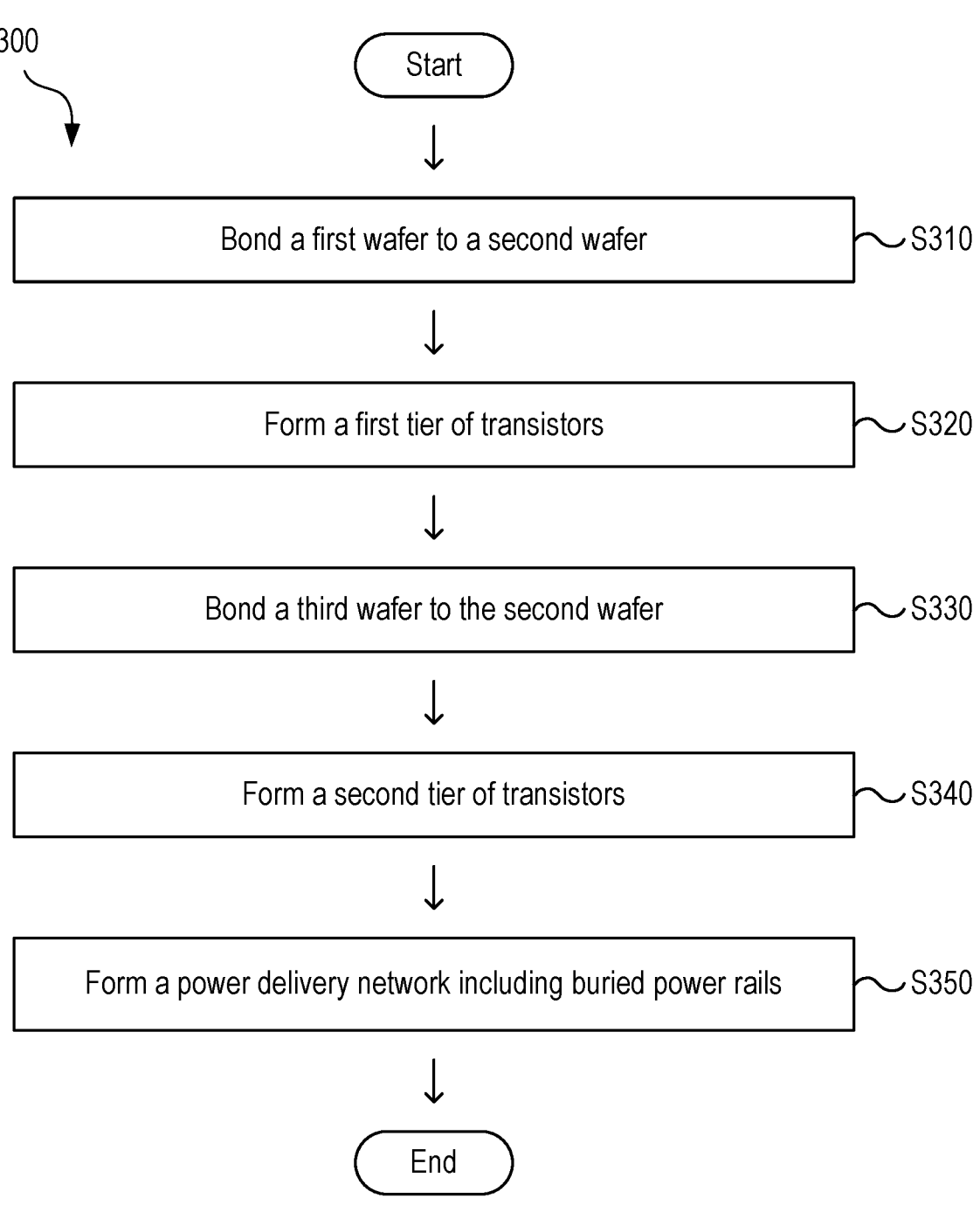
FIG. 3 shows a flow chart of a process for manufacturing a semiconductor device, in accordance with one embodiment of the present disclosure.

FIG. 3 shows a flow chart of a process 300 for manufacturing a semiconductor device, such as the semiconductor device 100, in accordance with one embodiment of the present disclosure. The process 300 begins with Step S310 by bonding a first wafer to a second wafer via a first bonding dielectric layer. The first wafer includes a first bulk semiconductor material. The second wafer includes a first stack of alternating layers of epitaxially grown semiconductor layers formed over a second bulk semiconductor material. The second bulk semiconductor material is removed to uncover the first stack. The process 300 then proceeds to Step S320 where a first tier of transistors is formed from the first stack. At Step S330, a third wafer is bonded to the second wafer via a second bonding dielectric layer. The third wafer can include a second stack of alternating layers of epitaxially grown semiconductor layers formed over a third bulk semiconductor material. The third bulk semiconductor material is removed. At Step S340, a second tier of transistors is formed from the second stack. The first bulk semiconductor material is removed to uncover the first bonding dielectric layer. At Step S350, a power delivery network in contact with the first bonding dielectric layer is formed. The power delivery network includes backside power rails in contact with vias that extend through the first bonding dielectric layer.

Figure 4:
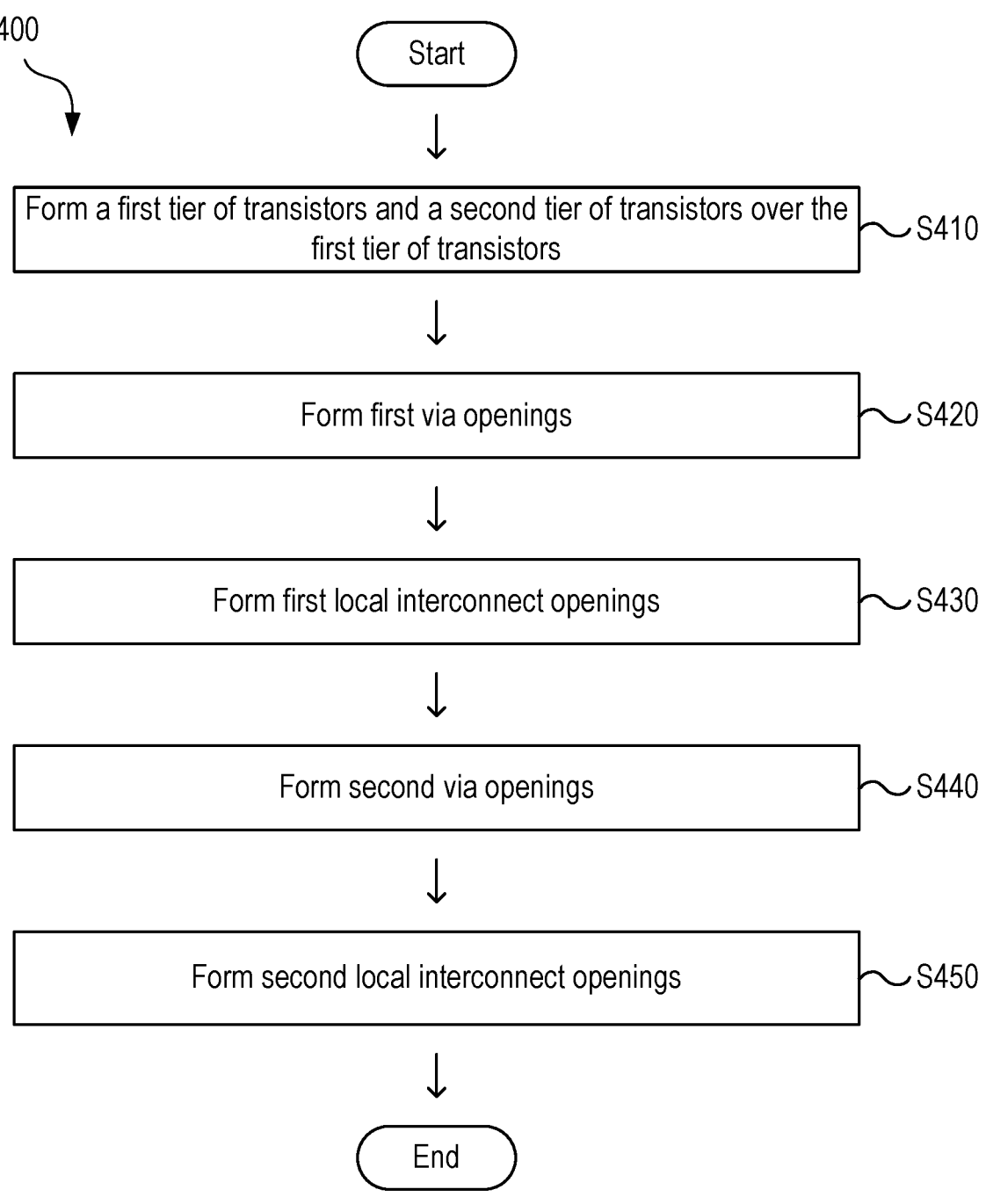
FIG. 4 shows a flow chart of a process for manufacturing a semiconductor device, in accordance with another embodiment of the present disclosure.

FIG. 4 shows a flow chart of a process 400 for manufacturing a semiconductor device, such as the semiconductor device 100, in accordance with another embodiment of the present disclosure. The process 400 begins with Step S410 by forming a first tier of transistors and a second tier of transistors over the first tier of transistors. The first tier of transistors is formed on a first bonding dielectric layer on a first bulk semiconductor material. The second tier of transistors is formed on a second bonding dielectric layer. The second bonding dielectric layer separates the first tier of transistors from the second tier of transistors. The first tier of transistors and the second tier of transistors have gate-all-around transistors. At Step S420, first via openings are formed that extend through the first tier of transistors and the first bonding dielectric layer. At Step S430, after the first via openings are formed, first local interconnect (LI) openings are formed that connect with the first via openings. At Step S440, second via openings are formed that extend through the second tier of transistors, the second bonding dielectric layer, the first tier of transistors and the first bonding dielectric layer. At Step S450, after the second via openings are formed, second LI openings are formed that connect with the second via openings.

FIG. 5 shows a flow chart of a process 500 for manufacturing a semiconductor device, such as the semiconductor device 100, in accordance with yet another embodiment of the present disclosure. The process 500 begins with Step S510 by forming a stack of epitaxially grown layers alternating between a first semiconductor material and a second semiconductor material that is etch selective to the first semiconductor material. At Step S520, fin structures are formed from the stack. The fin structures include channel structures formed of the first semiconductor material. At Step S530, source/drain (S/D) structures are formed on opposing ends of the channel structures by epitaxially growing a third semiconductor material. At Step S540, a silicide is formed around the S/D structures.

FIG. 6 shows a flow chart of a process 600 for manufacturing a semiconductor device, such as the semiconductor device 100, in accordance with yet another embodiment of the present disclosure. The process 600 begins with Step S610 by forming a stack of epitaxially grown layers alternating between a first semiconductor material and a second semiconductor material that is etch selective to the first semiconductor material. At Step S620, fin structures are formed from the stack. The fin structures include channel structures formed of the first semiconductor material. The channel structures have opposing ends that are uncovered. At Step S630, sidewall constraints are formed at the opposing ends of the channel structures. Each pair of the sidewall constraints laterally bounds a respective source/drain (S/D) region at a respective end of the channel structures while having a respective top opening for accessing the respective S/D region. At Step S640, S/D structures are formed on the opposing ends of the channel structures by epitaxially growing a third semiconductor material between each pair of the sidewall constraints.

FIG. 7 shows a flow chart of a process 700 for manufacturing a semiconductor device, such as the semiconductor device 100, in accordance with yet another embodiment of the present disclosure. The process 700 begins with Step S710 by forming a stack of epitaxially grown layers alternating between a first semiconductor material and a second semiconductor material that is etch selective to the first semiconductor material. At Step S720, fin structures are formed from the stack. The fin structures include channel structures formed of the first semiconductor material. At Step S730, cross-sections of the channel structures are shrunk. At Step S740, a third semiconductor material is formed all around the channel structures. The third semiconductor material has lattice mismatch with the first semiconductor material.

Figure 8:
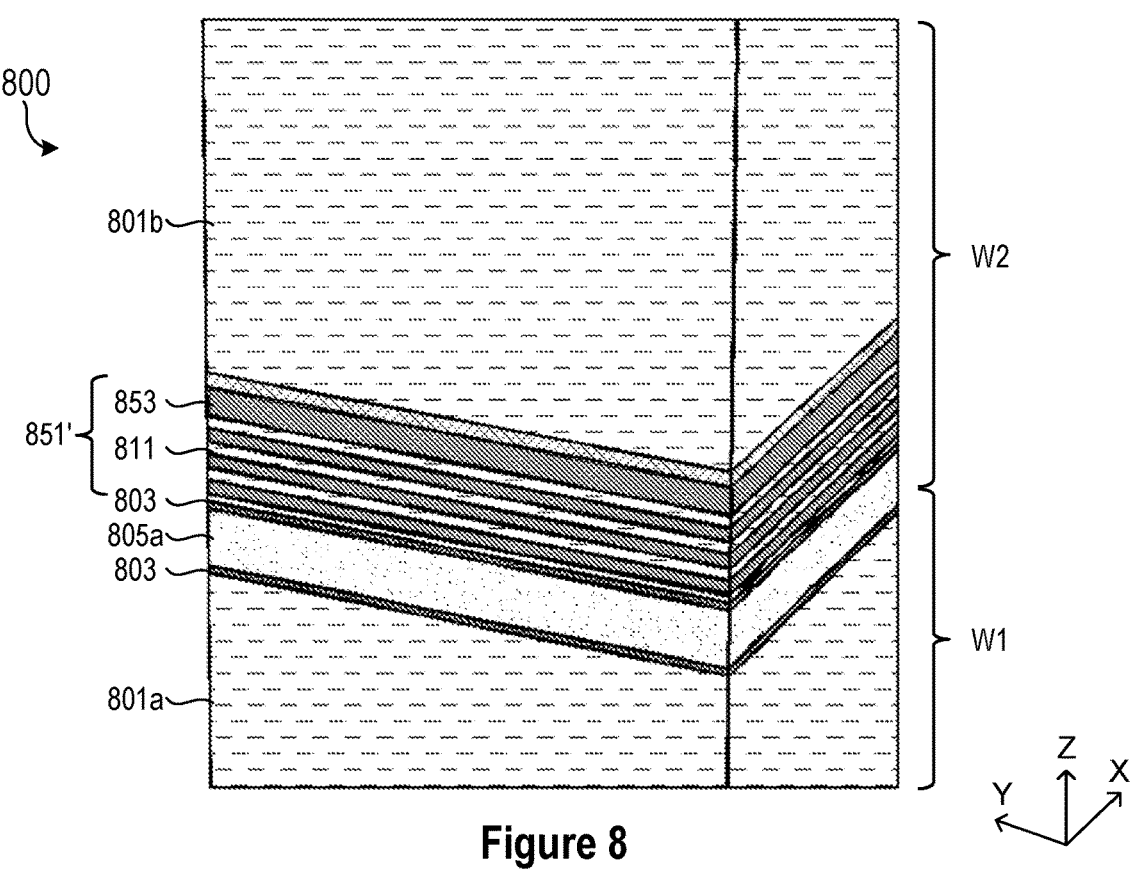

FIGS. 8-70 show cross-sectional perspective views of a semiconductor device 800 at various intermediate steps of manufacturing, in accordance with some embodiments of the present disclosure. For example, a detailed integration can be shown for a sequential CFET device, however for the portions of this disclosure pertaining to only the backside power delivery network, it should be noted that this can be incorporated to monolithic CFET devices as well as conventional gate-all-around (GAA) devices. Note that the semiconductor device 800 may eventually become the semiconductor device 100.

In FIG. 8, the semiconductor device 800 includes a wafer composite, for example provided by a third party or formed by bonding a first wafer W1 to a second wafer W2 via a first bonding dielectric layer 805a. The first wafer W1 includes a first bulk semiconductor material 801a. The second wafer W2 includes a first stack 851' of alternating layers (e.g. 811 and 853) of epitaxially grown semiconductor layers formed over a second bulk semiconductor material 801b.

In some embodiments, a silicon substrate (e.g. 801a) is deposited with suitable bonding dielectric materials such as a liner which can be composed of materials such as silicon nitride or silicon nitride (e.g. 803) with silicon oxide (e.g. 805a) which will become the actual bonding dielectric material.

A second silicon substrate (e.g. 801b) with a gate-all-around nanosheet stack (e.g. 851) (relatively small stack of layers/sheet to form into GAA devices) comprised of silicon (e.g. 811) and various silicon germanium layers (e.g. 853) is likewise deposited with a suitable liner such as SiCN or silicon nitride (e.g. 803), along with a layer of silicon oxide (e.g. 805a) which will be used as a bonding dielectric to bind to the initial wafer (e.g. W1) which also has a top-face composed of silicon oxide.

The second wafer (e.g. W2) is flipped vertically such that the nanosheet active stack (e.g. 851') is not facing downward, and this wafer (e.g. W2) is then placed overtop and bonded to the top of the initial wafer (e.g. W1) as shown below.

In this embodiment, the first wafer W1 and the second wafer W2 are bonded by fusion bonding. In another embodiment (not shown), the first wafer W1 and the second wafer W2 can be bonded by another wafer bonding technique, such as surface-activated bonding, plasma-activated bonding, anodic bonding, eutectic bonding, glass frit bonding, adhesive bonding, thermocompression bonding, reactive bonding, transient liquid phase diffusion bonding or the like. Accordingly, the first bonding dielectric layer 105a may include one or more different dielectric bonding materials.

In an alternative embodiment, a silicon-on-insulator (SOI) approach is used as mentioned earlier. Instead of wafer bonding, the first stack 851' of alternating semiconductor layers (e.g. 811 and 853) are epitaxially grown over an SOI wafer that includes a silicon substrate (e.g. 801a), an insulator (e.g. 805a) and a single-crystalline silicon layer (e.g. 811).

Figure 9:
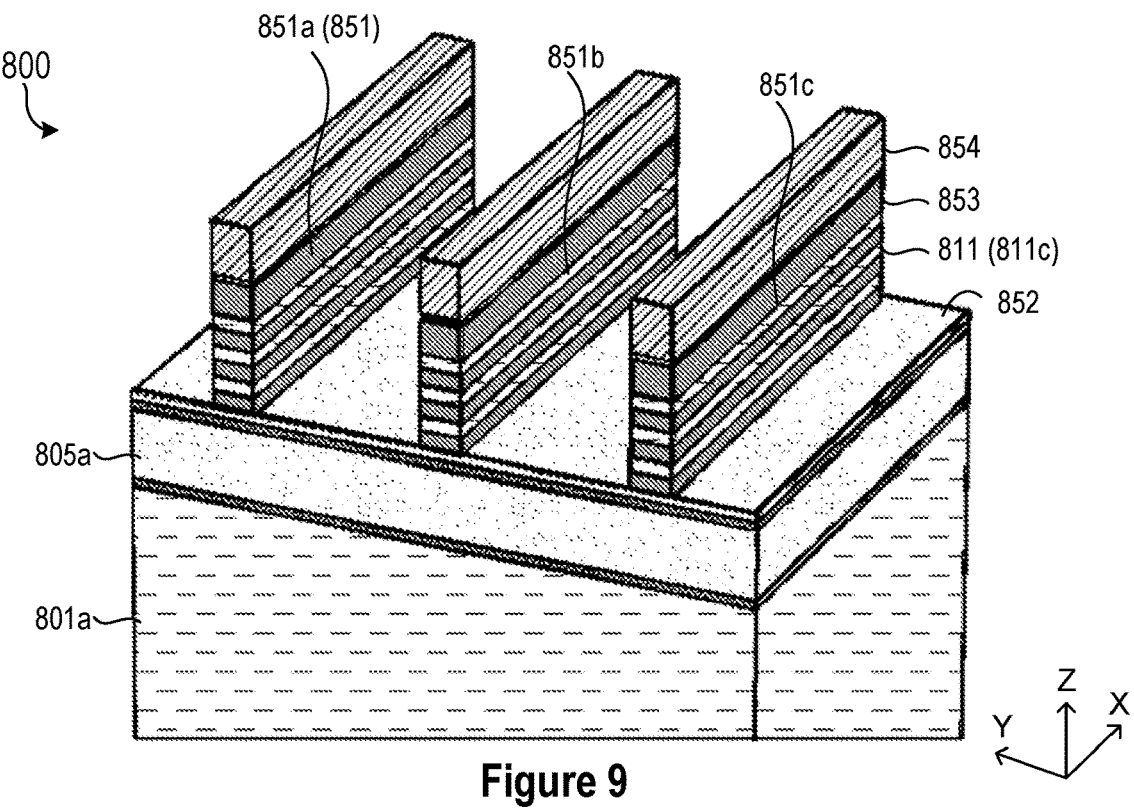

In FIG. 9, the second bulk semiconductor material 801b is removed to uncover the first stack 851', which is then patterned to form independent fin structures 851 (for example as shown by 851a, 851b and 851c). As a result, the fin structures 851 include a first semiconductor material 811 and a second semiconductor material 853 stacked alternatingly over each other in the Z direction. The first semiconductor material 811 will also be referred to as first channel structures 811.

In some embodiments, the silicon substrate (e.g. 801b) of the upper wafer backside can then be removed, for example through a combination of processes including, wafer grinding, polishing, etching, or any combination of the above. Optionally, an epitaxial layer 854 composed of high germanium content silicon germanium, or even germanium, may be used as an etch-stop to protect the active stack (e.g. 851) from damage during the removal of the bulk substrate (e.g. 801b) from the upper wafer (e.g. W2).

The nanosheet active stack (e.g. 851') is then patterned into FIN structures (e.g. 851) and etched such that the silicon (e.g. 811)/silicon germanium (e.g. 853) FINs stop on either the liner (e.g. 803) used for the wafer bonding process, or on another dielectric layer (e.g. 852) over the bonding dielectric liner material (e.g. 803). As an example in this integration, some level of silicon oxide (e.g. 852) is present on top of the SiCN liner (e.g. 803) protecting the silicon oxide bonding dielectric (e.g. 805*a*). As the FIN structures (e.g. 851) now terminate on a dielectric (e.g. 852), there is no longer any presence of any residual silicon FIN under the nanosheet stack (e.g. 851), as what exists in conventional gate-all-around (GAA) processing today. Subsequently, in FIGS. 10-35, a first tier 810 of transistors can be formed from the first stack 851'.

Figures 10, 11:
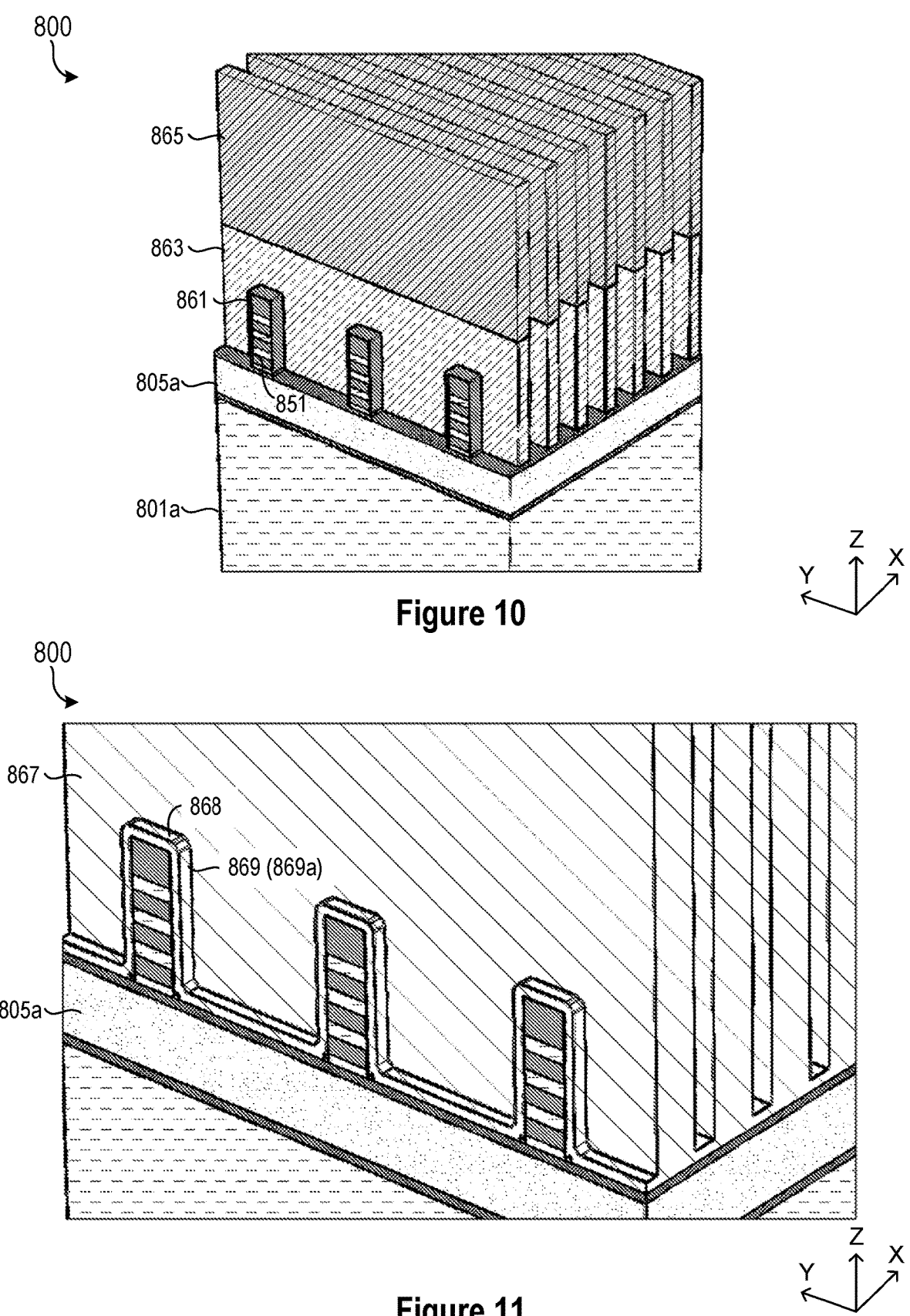

In FIG. 10, a protective film 861 is formed over the fin structures 851. A dummy gate 863 is formed over the protective film 861. A hardmask material 865 is formed over the dummy gate 863. The hardmask material 865 and the dummy gate 863 are then patterned, for example in a direction (e.g. the Y direction) orthogonal to the fin structures, while the protective film 861 protects the fin structures 851.

In some embodiments, a chemical oxide or thermal oxide liner (e.g. 861) can be formed over the silicon/silicon germanium FIN structures (e.g. 851) and protect the FINs (e.g. 851) from any etches in the dummy gate formation process. Following the formation of the oxide liner (e.g. 861) over the FIN structures (e.g. 851), the dummy gate (e.g. 863) is formed through the process of deposition of the dummy gate material, such as amorphous silicon, followed by the deposition of some type of hardmask material (e.g. 865), which in this example is silicon nitride. The dummy gates (e.g. 863) are patterned orthogonal to the FIN structures (e.g. 851), and the pattern is then transferred through the silicon nitride hardmask (e.g. 865), which will now become a cap material overtop the dummy gate structure (e.g. 863), and transferred into the amorphous silicon (e.g. 863) to form the actual dummy gate structure (e.g. 863). The presence of the oxide liner (e.g. 861) over the FIN structures (e.g. 851) prevents any etching of the silicon/silicon germanium FIN structures (e.g. 851) during the pattern transfer of the dummy gate through the amorphous silicon (e.g. 863). These FIN structures (e.g. 851) will run continuous through all of the dummy gate structures (e.g. 863), and a single diffusion break cut process can be used in this integration if desired.

In FIG. 11, a constraint material 867 is formed to cover the fin structures 851. The constraint material 867 includes top constraints 868, which cover the fin structures 851 from above, and sidewall constraints 869, which cover the fin structures 851 from sides and defining future S/D regions. Particularly, the constraint material 867 can be conformally deposited over the fin structures 851. Exposed portions of the protective film 861 may be removed before the formation of the constraint material 867.

In some embodiments, an initial low-k gate spacer material (e.g. 867) is conformally deposited over the dummy gate structures (e.g. 863) and possibly conformally over the surface of the silicon/silicon germanium FIN structures (e.g. 851).

Figure 12:
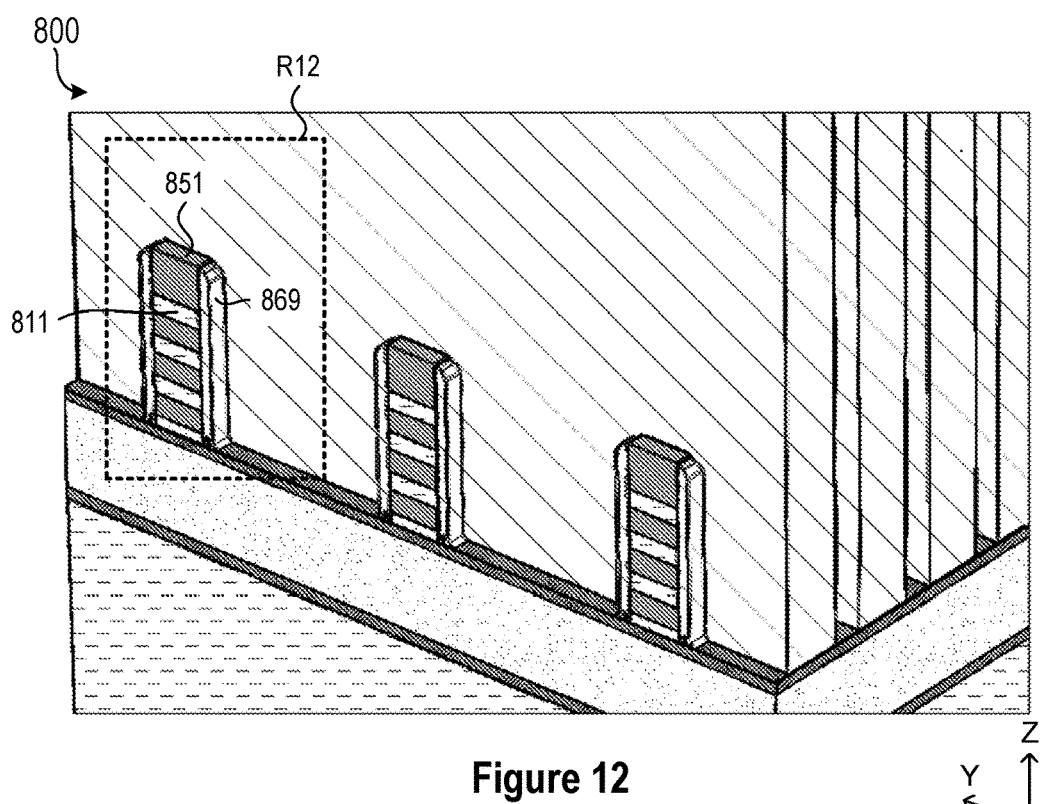
FIG. 12B shows an expanded view of Rectangle R12 in FIG. 12, in accordance with one embodiment of the present disclosure.
Figure 12B:
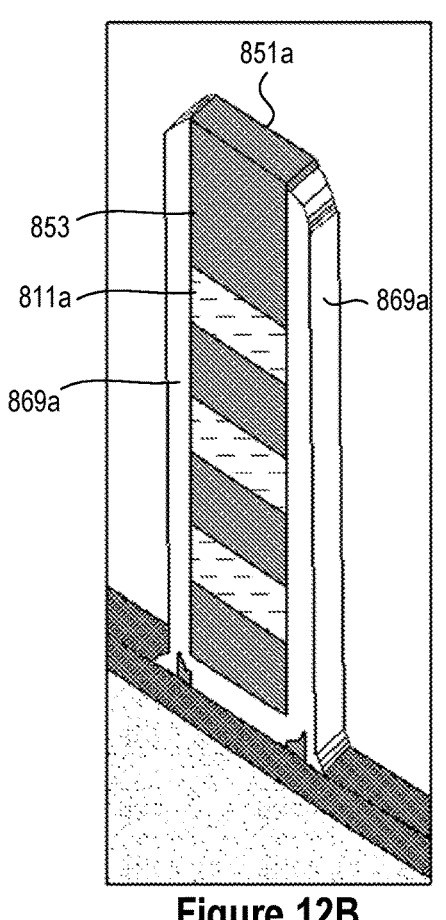

In FIGS. 12 and 12B, the top constraints 868 of the constraint material 867 are removed to uncover the fin structures 851 in future S/D regions while the sidewall constraints 869 are kept at opposing ends of the first channel structures 811. As a result, each pair of the sidewall constraints (e.g. 869*a*) laterally bounds a respective future S/D region at a respective end of the first channel structures (e.g. 811*a*).

In some embodiments, the low-k spacer material (e.g. 867) can be opened to reveal the tops of the silicon/silicon germanium FIN structures (e.g. 851). As an anisotropic etch process is used to open the low-k gate spacer material (e.g. 867), no lateral consumption of the low-k gate spacer (e.g. 867) is encountered; thus the low-k spacer thickness is set to maximize overall power/performance/area through the reduction of capacitance between metal gate and metal interconnects while minimizing the standard cell size to maintain needed contacted poly pitch (CPP) dimensions for needed area scaling.

In FIGS. 13 and 13B, exposed portions of the fin structures 851 between each pair of the sidewall constraints (e.g. 869*a*) are removed to open future S/D regions. In some embodiments, the silicon/silicon germanium FIN (e.g. 851) can be removed by an anisotropic etch process. The etch process should be very selective to the low-k gate spacer material (e.g. 867) such that the low-k gate spacer (e.g. 867) leaves behind a preserved "shoulder" (e.g. 869) which will later be used for the confined source and drain contact formation.

In FIGS. 14 and 14B, recesses are formed in the second semiconductor material 853. For example, in the case of silicon nanosheets (e.g. 811) being used, the silicon germanium (e.g. 853) can be selectively recessed with great precision to form the physical gate length of the transistor. It is noted here that also disclosed herein is constructing silicon germanium nanosheets in which the initial FIN composition is no longer silicon and silicon germanium, but instead composed of two silicon germanium materials with significantly different components of germanium. Hence, a silicon germanium nanosheet of 15-25% of germanium can be formed through the selective etching of silicon germanium of much higher germanium content such as 40% or greater. Of course, the limitations to the amount of germanium composition in the FIN structure (e.g. 851) may be limited by pseudomorphic stress limits where the subsequent epitaxy layers will begin to relax which may not be desirable, so care may need to be taken to define these stacks precisely based on maintaining the strain of the epitaxy stacks and the available etch selectivity in defining the actual nanosheet patterning as well as the desired hole mobility required for PMOS devices.

In FIGS. 15 and 15B, inner spacers 862 are formed in the recesses. In some embodiments, the recessed silicon germanium (e.g. 853) needs to be filled in with an inner spacer dielectric material, which may or may not be the same as the low-k gate spacer material (e.g. 867). Conventional means of doing a cavity fill deposition can be used but might be detrimental to the preservation of the low-k gate spacer dielectric shoulder (e.g. 869) which is required for the subsequent confined source and drain contact growth. Likewise, cavity filling of the recessed silicon germanium space will likewise lead to seaming within the inner-spacer region which is not desired. An alternative approach is to incorporate a selective deposition process to form the inner spacers 862. In this example, the inner spacer material is the same as the low-k gate spacer (e.g. 867) (both being SiOC), however multiple materials can be used for both materials, provided the dielectric constant of the different materials is adequate.

In a non-limiting selective deposition process, native oxide (not shown) can be allowed to form on both the exposed silicon nanosheet (e.g. 811) as well as the recessed silicon germanium (e.g. 853). From here, selectively remove the SiGeO without disturbing the native oxide on the silicon nanosheets (e.g. 811). After the selective removal of the SiGeO, deposit a self-aligned monolayer (SAM) material which will bind selectively to dielectric materials such as (a) the native oxide over the silicon nanosheet (e.g. 811), (b) the low-k gate spacer material (e.g. 867), and (c) the bonding dielectric and bonding dielectric liner materials (e.g. 805*a* and 803) on the floor. With the SAM in place covering the dielectric faces, but not on the cleaned silicon germanium material (e.g. 853), the inner spacer material can be deposited selectively onto the face of the silicon germanium (e.g. 853), thus fully enclosing the recessed areas as well as not depositing onto the surface of the low-k gate spacer or the low-k gate spacer shoulder (e.g. 869) which is necessary for the confined source and drain growth. It should be understood that other selective deposition processes can also be used here.

In FIG. 16, end portions 811$i$ (or ends, or opposing ends) of the first channel structures 811 are optionally recessed. For example, after the inner spacer (e.g. 862) is fully formed and the SAM removed through a thermal process, the silicon nanosheet (e.g. 811) is then slightly recessed into the low-k gate spacer (e.g. 867) or inner spacers (e.g. 862) to form a desired extension area of the device.

In FIG. 17, first S/D structures 813 (for example as shown by 813$a$, 813$b$ and 813$c$) are formed on the end portions 811$i$ of the first channel structures 811 by epitaxially growing a third semiconductor material between the sidewall constraints 869 that laterally confine the third semiconductor material.

For example, in the case of PMOS device being on the bottom tier of the device, the boron-doped silicon germanium source and drain (e.g. 813) can then be grown in which the low-k gate spacer dielectric shoulders (e.g. 869) will confine the shape of the contacts (e.g. 813) to be laterally the width of the nanosheets (e.g. 811) themselves, thus preserving significant room for the placement of complimentary vias which will be needed to connect upper-tier devices to back-side power.

Preferably, the uppermost portion of the source and drain contact (e.g. 813) does not protrude much beyond the top of the low-k gate spacer dielectric shoulder (e.g. 869), as the uppermost portion of the source and drain contact (e.g. 813) would have a tendency to form a very wide diamond shaped profile which would take away critical space needed for the placement of complimentary vias connecting upper-tier devices to backside power. It is to be noted that in the initial low-k gate spacer open process used to reveal the initial silicon/silicon germanium FIN structures (e.g. 851) which are subsequently anisotropically etched away, that some height reduction will be seen with the preserved dielectric shoulders (e.g. 869). A method to avoid the formation of the diamond shaped epitaxy at the top of the contact (e.g. 813) is through extending the uppermost silicon germanium film height at the very top of the initial silicon/silicon germanium FIN structure (e.g. 851) to compensate for the expected vertical erosion of the preserved dielectric shoulder (e.g. 869) such that the epitaxy growth of the contact (e.g. 813) will not exceed the total height of the shoulder (e.g. 869).

In FIG. 18, the sidewall constraints 869 are removed. In some embodiments, after the bottom-tier source and drain contacts (e.g. 813) are formed, the low-k gate spacer shoulder (e.g. 869) is anisotropically removed. This spacer cannot be removed isotropically as it would remove the low-k gate spacer (e.g. 867) covering the amorphous silicon dummy gate (e.g. 863), which is needed to be preserved. The low-k gate spacer shoulder (e.g. 869) can be anisotropically etched away, which will simultaneously anisotropically remove the same height of the low-k gate spacer (e.g. 867) from the sidewall of the replacement gate (e.g. 863). By establishing the height of the initial dummy gate hardmask cap (e.g. 865), it can be assured that the anisotropic etch used to remove the low-k gate spacer (e.g. 867) will not recess the low-k gate spacer (e.g. 867) below the point at which the amorphous silicon dummy gate (e.g. 863) will be exposed. Thus, the selection of the initial silicon nitride cap (e.g. 865) over the replacement gate cap (e.g. 863) in this example is set to a relatively high aspect ratio to ensure that the shoulder (e.g. 869) is removed.

It can be argued that the low-k spacer shoulder (e.g. 869) could be preserved and etched away during subsequent interconnect trench etch processes. In this particular example, however, a novel wrap-around contact process is used. Therefore, the shoulder (e.g. 869) is removed, and the full lateral surface area of the contact (e.g. 839) is exposed for this process.

It is noteworthy that the selection of the dielectric bonding material (e.g. 805$a$) and bonding liner (e.g. 803) is also important for this process to maintain a good/sufficient dielectric floor after the low-k spacer shoulder (e.g. 869) is removed. Hence, selection for the bonding dielectric liner (e.g. 803) is important and there is an option of having multiple liner stacks to provide whatever needed etch selectivity to prevent the silicon oxide (e.g. 805$a$) from being etched in this process.

In FIG. 19, a sacrificial film 871 can be optionally formed around the first S/D structures 813 by epitaxially growing a fourth semiconductor material that is etch selective to the third semiconductor material (e.g. 813). A contact etch stop layer (CESL) film 872 may be optionally formed around the sacrificial film 871.

In the approach for wrap-around contact, the exposed source and drain contact (e.g. 813) can be selectively deposited with a semiconductor material such as through a low-temperature CVD epitaxy process, where, for example, a silicon germanium film (e.g. 871) with a different germanium content relative to the PMOS boron-doped silicon germanium contact (e.g. 813) can be grown on the surface of the source and drain contact (e.g. 813). For a CVD epitaxy process, this will be selective in nature. For other material choices for this initial sacrificial wrap-around film, a selective deposition process can be used in which the contact is cleaned of any native oxide before deposition of a SAM material which would selectively attach to dielectrics and not to the surface of the cleaned contact (e.g. 813), then an etch-selective film (e.g. 871) can be deposited selectively over the surface of the contact structure (e.g. 813).

After the conformal, selective semiconductor liner (e.g. 871) is grown or deposited over the contact structure (e.g. 813), it will be necessary to likewise conformally deposit a CESL (e.g. 872) over the contact structure (e.g. 813) as well. This film (e.g. 872) can likewise be formed using a selective deposition process, but to form a high quality CESL film (e.g. 872) that would require plasma and high temperatures which would be detrimental to the SAM, and thus not preferred.

In FIG. 20, an interlayer dielectric (ILD) film 873 is formed and optionally planarized to fill space. A via opening 878$a$ is formed in the ILD film 873 to uncover the first bulk semiconductor material 801$a$. The via opening 878$a$ is partially filled with a filler material 874 to protect at least the first bonding dielectric layer 805$a$.

Again, the wrap-around-contact (WAC) (e.g. 871) is optional. Nevertheless, to provide for maximum power/performance/area scaling, it may be necessary to ensure that contact resistance is minimized as much as possible as the interfacial surface area between the contact (e.g. 813) and the eventual metal interconnect will be much lower with a confined contact structure compared to the diamond-shaped contact structure.

Additionally, the benefit of the confined contact structure (e.g. 813) is that using a WAC process will also enable the interconnect to extend down vertically along the sidewall of the contact structure (e.g. 813) to maximize interfacial surface area connection. In contrast, for diamond-shaped contact structures, the connection between contact and interconnect metal is limited to just the uppermost portions of the diamond-shaped contact as the rest of the contact structure below the maximum lateral width is thus shadowed by geometry of the diamond-shaped contact.

After the wrap-around-contact (WAC) structure (e.g. 871) is formed, a dielectric film (e.g. 872) can then be deposited to fill the contact regions with some type of interlayer dielectric (e.g. 873) such as silicon nitride.

After the formation of the ILD film 873, a hardmask stack 876a is deposited on top of the planarized ILD film (e.g. 873) to memorize the eventual interconnect structure. Once the interconnect pattern has been memorized into the hardmask stack 876a, the vias which will connect the bottom device tier to backside power will be patterned and transferred through the ILD oxide (e.g. 873) selective to the CESL (e.g. 872) and semiconductor liner (e.g. 872) over the contact (e.g. 813).

Note that at this point in the integration, a decision may be made to progress on the transistor formation first and then return later to the silicide and interconnect metal formation of the source and drain contact structures. In this example, the source and drain silicidation and interconnect formation and metallization are executed first to show how this process would be done, with the understanding that there are options to at this point continue with the replacement metal gate module first as no metal at this point has yet to be introduced to the wafer processing.

In this integration example, the via opening 878a connects down to backside power down past the bonding dielectric liner (e.g. 803) and into the bonding dielectric itself (e.g. 805a), with the etch terminating on the bottommost silicon substrate (bulk silicon) (e.g. 801a). To preserve the integrity of the via structure (e.g. 878a), a gap-fill of a spin-on material (e.g. 874) such as spin-on organic (SoC) is deposited into the formed via opening (e.g. 878a), and the gap-fill material (e.g. 874) is recess-etched such that the bottom most silicon substrate (e.g. 801a) is fully covered. The sidewalls of the CESL liner (e.g. 872) protecting the contact structure (e.g. 813c) can be covered by the SoC (e.g. 874) as well.

In FIG. 21, local interconnect (LI) openings 879 (for example as shown by 879a, 879b and 879c) are formed in the ILD film 873 to uncover the CESL film 872. In other words, the interconnect trenches (e.g. 879) can then be transferred into the ILD oxide film material (e.g. 873). Note that an LI opening 879c can connect with or overlap with the via opening 878a.

In FIGS. 22 and 22B, the CESL film 872 is removed to uncover the sacrificial film 871, and then the sacrificial film 871 is removed to uncover the first S/D structures 813. For example, the CESL liner (e.g. 872) covering the contact (e.g. 813) can be removed to reveal the surface of the conformal semiconductor liner (e.g. 871) covering the contact structure (e.g. 813). Then, the semiconductor liner (e.g. 871) covering the contact (e.g. 813) can be selectively etched away using an isotropic etch process such as the Tokyo Electron CERTAS etch process, without damaging the contact structure (e.g. 813) or surface itself. The isotropic removal of the conformal semiconductor liner (e.g. 871) will provide for an opening in the subsequent interconnect trench (e.g. 879) the width of the original conformal semiconductor liner thickness, thus allowing for the silicide formation and metallization to fully wrap around the full contact structure (e.g. 813).

In FIG. 23, a silicide material 814 (for example as shown by 814a, 814b and 814c) is formed all around the first S/D structures 813. For example, after the conformal semiconductor liner (e.g. 871) is removed, the source and drain contact (e.g. 813) is then cleaned and available to have a suitable silicide material (e.g. 814) formed on its exposed surface, along with any metal capping material (e.g. 814), such as TiN, over the silicide which can be formed through a subsequent plasma termination process. The benefit of either sequential or monolithic CFET processing is that a suitable silicide material can be selected individually for NMOS and PMOS source and drain contacts. Because the initial semiconductor liner material (e.g. 871) encapsulating the source and drain contact (e.g. 813) is now removed, this leaves a "tunnel" in which the majority of the source and drain contact (e.g. 813) is now revealed and able to go through a silicide formation and subsequent metallization step.

In FIG. 24, the filler material 874 is removed from the via opening 878a. Subsequently, a via 831d and LI structures 819 (for example as shown by 819a, 819b and 819c) are formed in the via opening 878a and LI openings 879.

For example, the gap-fill spin-on-carbon film (e.g. 874) can be ashed away prior to interconnect metallization. The SoC (e.g. 874) was maintained during the silicide formation process to prevent any silicide formation on the bottom substrate wafer (e.g. 801a). Note that the bottom bonding dielectric liner material choice can be made that it also serves as a suitable etch-stop layer for the initial via pattern transfer through the ILD silicon oxide dielectric (e.g. 873) as well as the silicon oxide bonding dielectric (e.g. 805a).

The interconnect trenches (e.g. 879a, 879b and 879c) and elongated via (e.g. 878a) can then be filled with highly conductive metal. This process can be done through a conventional metal fill followed by a metal polish step and subsequent etch-back recess selective only to the metal, or through a bottom-fill metal deposition process which removes the necessity of the metal CMP (chemical mechanical polishing/planarization) processing step. It is to be noted that in this example where metallization of the interconnect structures is executed before the replacement metal gate processing, recess etch of the metal selective to the ILD silicon oxide (e.g. 873) will be within a high aspect ratio trench. If the replacement metal gate processing was executed first, then the large silicon nitride cap over the transistor structure will be significantly smaller than what is drawn here, so the metal recess in this alternate integration would require a very small metal selective recess.

In FIGS. 25 and 25B, the LI structures 819 are recessed, and capping layers 833 are formed over the LI structures 819. In this example integration, the metal (e.g. 819) is recessed selective to the dielectric materials exposed such as the ILD silicon oxide (e.g. 873), the low-k gate spacer (e.g. 867), and the silicon nitride cap (e.g. 865) over the dummy gate (e.g. 863). As noted above, if executing this process following replacement metal gate formation, the high aspect ratio silicon nitride dummy gate cap would be replaced by a much smaller silicon nitride cap over the actual transistor.

To enable some type of self-alignment for subsequent processing steps, an etch-selective dielectric capping material (e.g. 833) can be deposited either (a) selectively on top of the metal interconnect structure (e.g. 819), or (b) formed through a sequential deposition/polish/etch recess method. For the sake of this integration example, a material such as SiCN where the nitride component is reduced to provide for etch selectivity among the other dielectric materials present, such as the low-k gate spacer (SiOC) (e.g. 867), the ILD dielectric (silicon oxide) (e.g. 873), and the dummy gate cap (silicon nitride) (e.g. 865), or if the alternate integration is used where the replacement metal gate integration is done first, the metal gate cap (which would also be silicon nitride).

In FIG. 26, the ILD film 873 is deposited to fill space before an etching, polishing and/or planarization process is executed to remove the hardmask material 865 down to a level of the dummy gate 863. That is, the contact region can be filled with ILD dielectric (e.g. 873) such as silicon oxide, and then the wafer (e.g. 800) can be polished down to the dummy gate amorphous silicon (e.g. 863).

FIGS. 26 and 27 can show the semiconductor device 800 at the same step at different cross-sections. For example, FIG. 26 can show a perspective of a cross-section taken along S/D structures while FIG. 27 can show a perspective of a cross-section taken along transistors (e.g. channel structures and gate structures). In FIG. 27, the amorphous silicon dummy gate (e.g. 863) is now shown.

In FIG. 28, the dummy gate 863 is removed to uncover the protective film 861 covering the fin structures 851. For example, the dummy gate amorphous silicon (e.g. 863) can then be removed with great selectivity relative to the surrounding dielectric materials as well as to the chemical oxide liner (e.g. 861) which is protecting the silicon/silicon germanium FIN structures (e.g. 851).

In FIG. 29, the protective film 861 is removed to uncover the fin structures 851. For example, after removal of the amorphous silicon (e.g. 863), the chemical oxide liner (e.g. 861) protecting the silicon/silicon germanium FIN structures (e.g. 851) can then be removed. Herein, the choice of material for the low-k gate spacer (e.g. 867) is important as to have some selectivity to the removal of the chemical oxide liner (e.g. 861) protecting the FIN structures (e.g. 851). In such cases, other suitable low-k dielectric materials may be used which have greater selectivity to the chemical oxide.

In FIGS. 30 and 30B, the second semiconductor material 853 is selectively removed relative to the first channel structures 811. For instance, after the chemical oxide liner (e.g. 861) protecting the silicon/silicon germanium FIN structures (e.g. 851) have been removed, the silicon germanium (e.g. 853) can be etched with great selectivity to the silicon (e.g. 811), thus producing the silicon nanosheet structures (e.g. 811). For the case of silicon germanium nanosheet processing, the initial FIN structure (e.g. 851) would be composed of two discrete germanium content of silicon germanium, where the larger germanium content could be etched with great selectivity relative to the lower content silicon germanium material, thus releasing a set of stacked silicon germanium nanosheets.

In FIGS. 31 and 31B, the first channel structures 811 are shrunk with rectangular edges of the nanosheets being rounded in the process, for example by an isotropic etch process. Particularly, middle portions 811ii of the first channel structures 811, which are exposed, are shrunk whereas the end portions 811i of the first channel structures 811, which are covered, are not etched. As a result, when viewed from a current direction (e.g. the X direction) in the first channel structures 811, the middle portions 811ii have a smaller circumference than the end portions 811i.

For example in the case of PMOS silicon nanosheets, the removal of the bulk substrate (e.g. 801a) directly underneath the active area will have significant strain reduction on the silicon nanosheets (e.g. 811), thus negatively impacting hole mobility in the PMOS silicon channel (e.g. 811). The hole mobility can be increased through multiple methods as stated in a previous section such as: utilization of a different crystal orientation of the bulk silicon wafer for the PMOS device and transistor tier to have more preferential silicon crystal structure along the channel (e.g. 811); incorporation of a dual silicon germanium FIN structure in which silicon germanium nanosheets can be formed which will have greater hole mobility compared to silicon; incorporation of a silicon germanium cladding process around a trimmed silicon nanosheet in which the benefit is in the formation of a binary silicon germanium/silicon channel as well as providing a strain along the channel due to the lattice mismatch between the silicon and silicon germanium. Any combination of the above can also be done to incrementally improve the hole mobility for the PMOS device. In this example, the silicon germanium cladding process is done on the silicon channel (e.g. 811) for illustrative purposes. The first step is to isotropically trim the silicon channel (e.g. 811).

In FIGS. 32 and 32B, shell structures 812 are formed all around the middle portions 811ii of the first channel structures 811. The shell structures 812 are formed of a fifth semiconductor material that has lattice mismatch with the first channel structures 811. For example, after the channels (e.g. 811) are trimmed to a desired width, a CVD epitaxy growth of silicon germanium (e.g. 812) can be done on the silicon surface (e.g. 811) to form the strained PMOS channel.

In FIGS. 33 and 33B, an interlayer layer 816 of silicon oxide or silicon germanium oxide can be optionally formed around the shell structures 812. Then, at least one gate dielectric 817 can be formed around the interlayer layer 816. A capping material 875 can be optionally formed around the at least one gate dielectric 817.

For example, after formation of the PMOS channel, the conventional replacement metal gate processing can be done where the interlayer layer 816 of silicon oxide or silicon germanium oxide is grown from the channel (e.g. 811), followed by conformal or selective deposition of a high-k dielectric film (e.g. 817) such as HfO$_2$, followed by a choice capping material (e.g. 875) deposition such as TiN or amorphous silicon, followed by a given reliability anneal process, followed by removal of the capping material, and finally followed by deposition of the work function metals such as TiN.

It is important to note that due to the high processing temperatures associated with the reliability anneal, this would in fact favor the integrations where the replacement metal gate is done before the silicide formation around the source and drain contacts and metallization of the interconnects.

The expectation is that such reliability anneals can be done incorporating higher pressure and lower temperature processes in the future, or done using very rapid annealing steps to prevent any phase change to the formed silicide around the source and drain contacts.

The benefit of sequential CFET processing can be seen relative to conventional gate-all-around (GAA) integrations due to the fact that the stacking of the transistors allows for discrete work function metallization to be used across both NMOS and PMOS transistors. For conventional GAA HKMG processing, the typical process is (a) deposition of PMOS WFM on both NMOS and PMOS followed by (b) removal of PMOS WFM from NMOS channel, followed by (c) deposition of NMOS work function metals on both NMOS and PMOS channels, where the PMOS channel already has the PMOS WFM as the primary metal interfaced with the high-k dielectric. By allowing for discreet NMOS and PMOS work function metals for only the respective channels, this provides a means by which the WFM thickness around the channels can be significantly reduced, whereas the channels can now be placed closer together in the vertical orientation to reduce the heights of the metal gate and metal interconnects, thus providing a mechanism for improving power and performance of the device through a reduction the gate-to-drain capacitance.

In FIG. 34, at least one gate metal 818 is formed around the at least one gate dielectric 817. For example, after the PMOS work function metal stack has been conformally deposited around the channel, the replacement metal gate is then filled with a high conductive metal such as tungsten and polished or etch-recessed down to form the metal gate.

In FIG. 35, the at least one gate metal 818 is patterned and divided into gate metals 818*a*, 818*b* and 818*c* which are separated by a dielectric material 877. Consequently, gate structures 815 (for example as shown by 815*a*) are formed, and a first tier 810 of transistor is formed. In the example of FIG. 35, a first transistor includes first channel structures 811*a*, shell structures 812*a* and a gate structure 815*a* which includes at least one gate dielectric 817*a* and at least one gate metal 818*a*.

In some embodiments, after the PMOS metal gate (e.g. 818) has been formed, a masking process is executed to form the HKMG cut, which is transferred down into the HKMG stack and then filled with dielectric (e.g. 877) of choice such as silicon nitride, or a combination of silicon nitride and silicon oxide, which will separate the standard cells in the north-south orientation (e.g. the Y direction) from one another.

Figure 36:
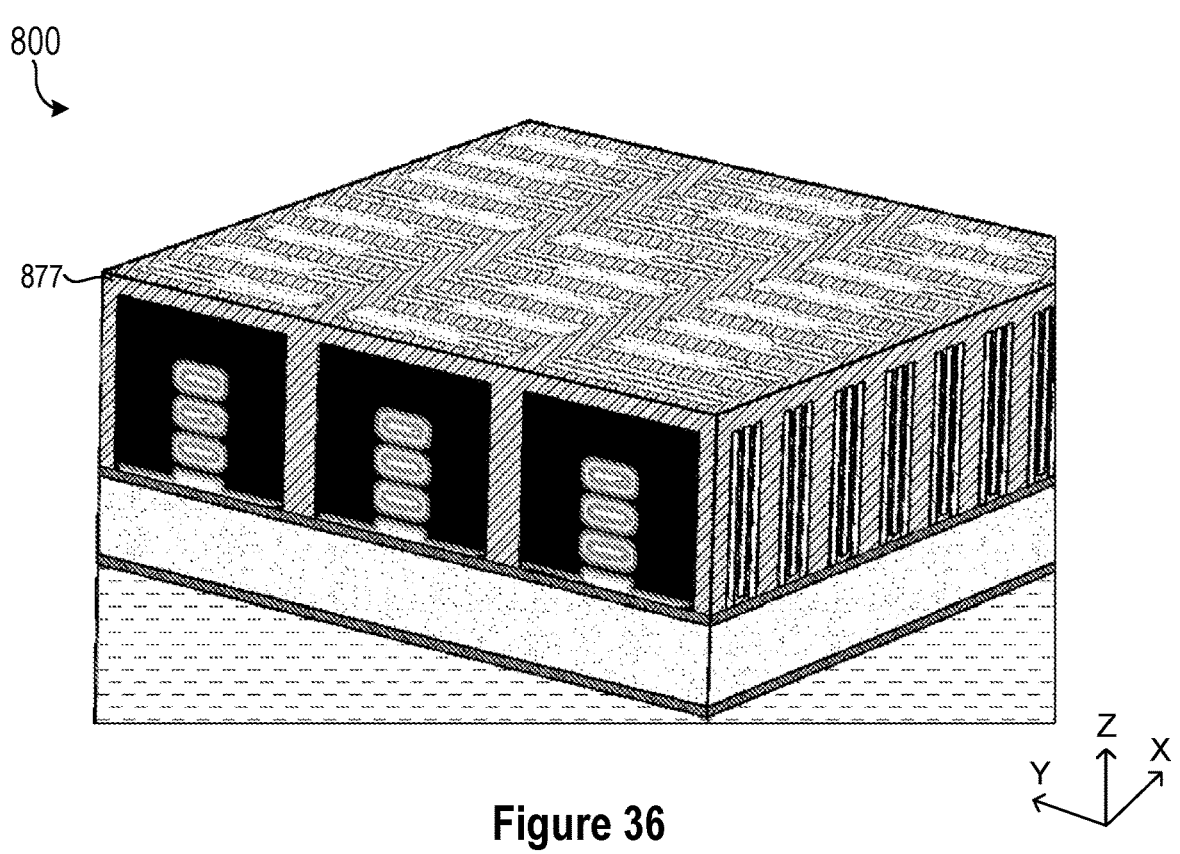

In FIG. 36, the dielectric material 877 is formed over the first tier 810 of transistors. For instance, following the formation of the HKMG cut, the replacement metal gate metal stack (e.g. 815) is then vertically recessed down to form a dielectric cap (e.g. 877) over the metal gate (e.g. 815). Typically, such capping materials are similar to that used for the HKMG cut, such as silicon nitride. The metal gate cap material (e.g. 877) should be etch-selective to both the low-k gate spacer (e.g. 867) as well as to the dielectric cap (e.g. 833) overtop the metal interconnect (e.g. 819) within the source and drain region.

Figure 37:
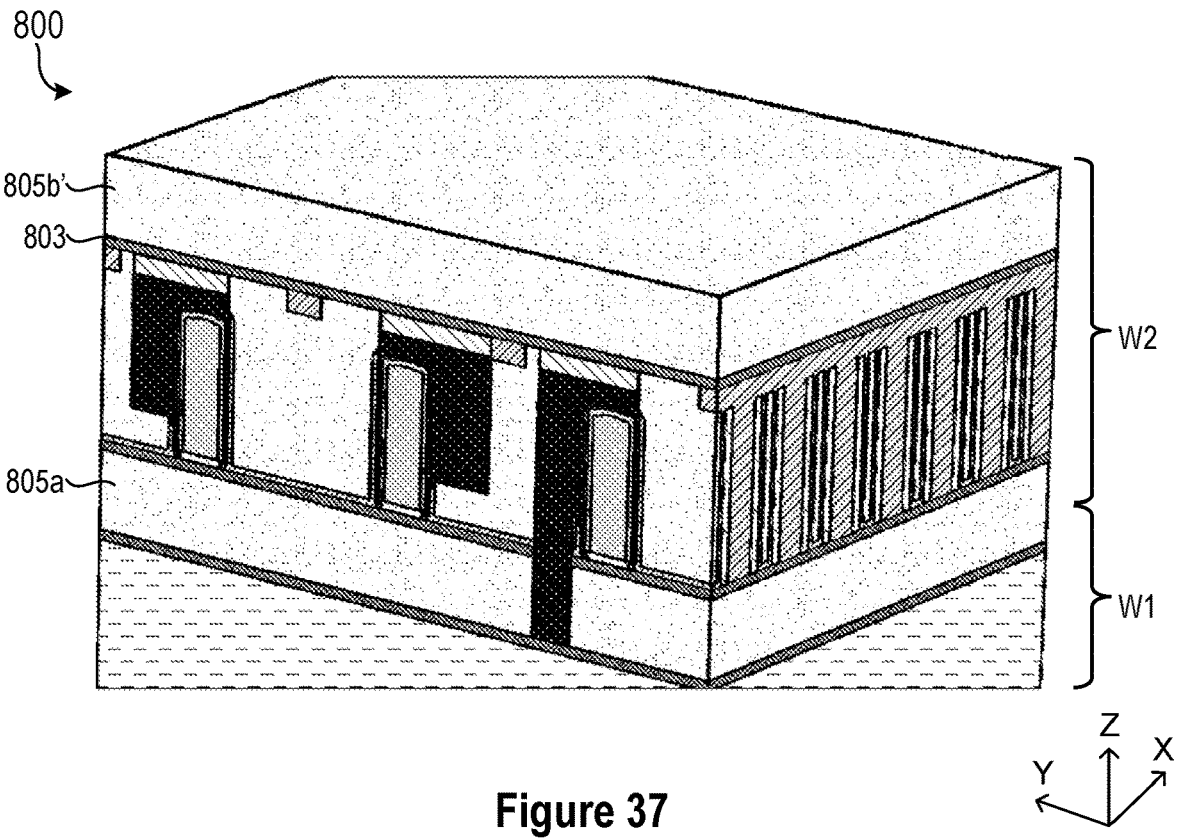

FIG. 37 shows a perspective view along the S/D structures. In FIG. 37, a bonding material 805*b*' can be formed over the first tier 810 of transistors. For example, the PMOS transistor and source and drain/interconnect are fully formed. A bonding liner (e.g. 803) can be deposited overtop of the wafer (e.g. W2) at this point which can also serve as an etch stop layer later in the integration. A bonding dielectric (e.g. 805*b*') is then deposited overtop the wafer (e.g. W2) in preparation for the next wafer bonding step in which the NMOS active stack will be placed overtop the bottom transistor/device tier.

Figure 38:
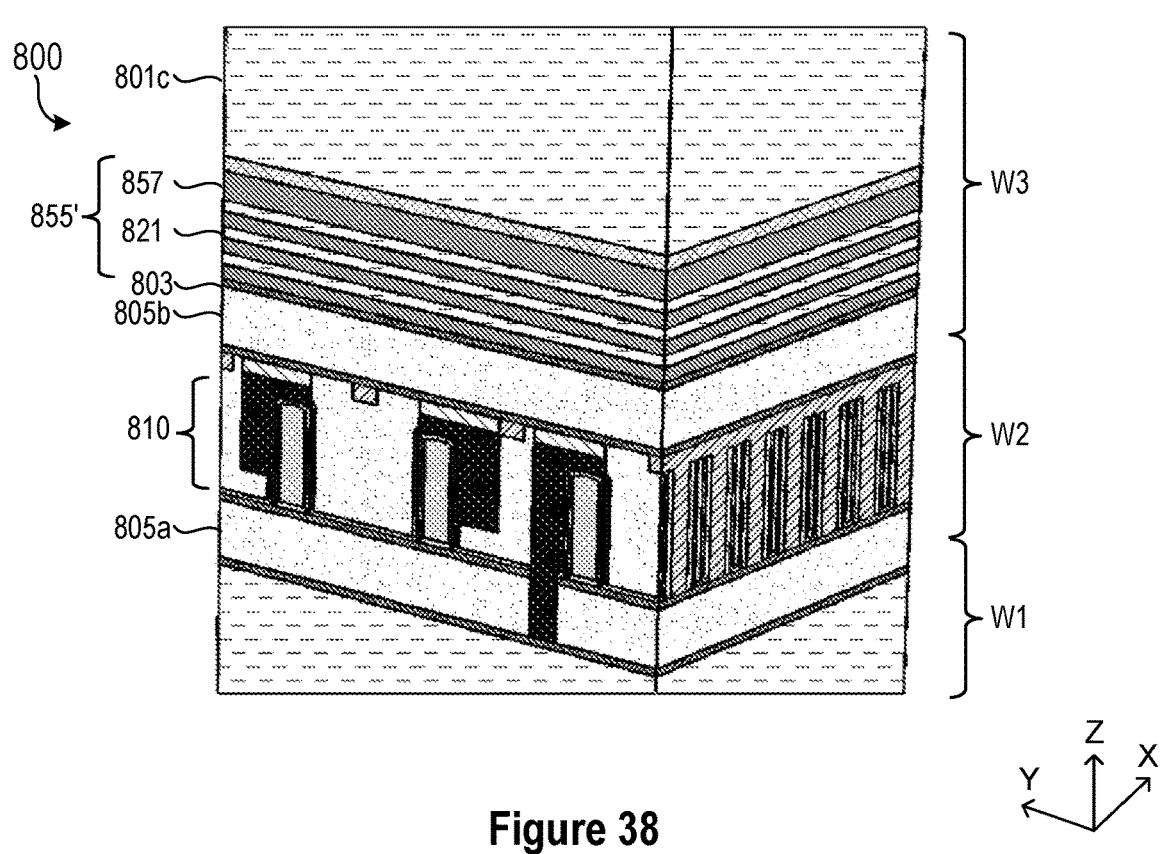

In FIG. 38, a third wafer W3 is bonded to the second wafer W2 via a second bonding dielectric layer 805*b*. The third wafer W3 includes a second stack 855' of alternating layers of epitaxially grown semiconductor layers (e.g. 821 and 857) formed over a third bulk semiconductor material 801*c*.

For example, an NMOS active stack (e.g. 855') can be grown on a separate wafer (e.g. W3) in which the silicon/silicon germanium device stack with a subsequent deposition of a bonding liner (e.g. 803) and bonding dielectric (e.g. 805*b*'). This wafer (e.g. W3) is then flipped over on its axis and then bonded to the initial wafer (e.g. W1 and W2) with the PMOS transistor (e.g. 810) and device.

Figure 39:
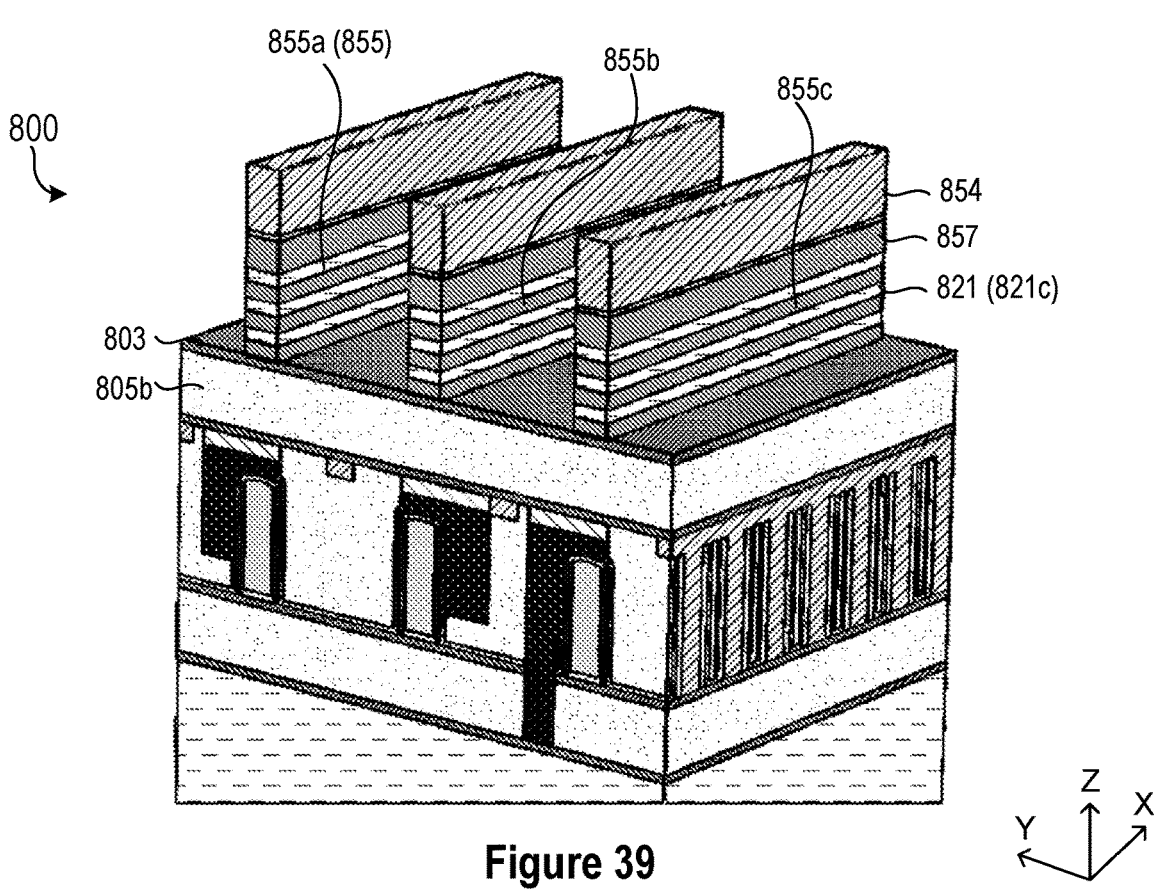

In FIG. 39, the third bulk semiconductor material 801*c* is removed to uncover the second stack 855', which is then patterned to form independent fin structures 855 (for example as shown by 855*a*, 855*b* and 855*c*). Therefore, the fin structures 855 include a sixth semiconductor material 821 and a seventh semiconductor material 857 stacked alternatingly over each other in the Z direction. Note that the sixth semiconductor material 821 may be the same as or different from the first semiconductor material 811. The seventh semiconductor material 857 may be the same as or different from the second semiconductor material 853. The sixth semiconductor material 821 will also be referred to as second channel structures 821.

In some embodiments, the substrate (e.g. 801*c*) of the NMOS device stack wafer (e.g. W3) is then grinded/polished/etched to reveal the NMOS silicon germanium/silicon device stack (e.g. 855'). In other words, the bulk silicon (e.g. 801*c*) is removed, leaving a stack of epitaxially grown layers (nano sheet stack) (e.g. 855').

The integration of the previous steps used to form the PMOS device and transistor (e.g. 810) can be repeated for the upper NMOS transistor and device tier, with some exceptions to make tier-to-tier connections between the source and drain contacts as well as to form common gate structures, and additionally to form cross-couples between the two complimentary device tiers.

As with the formation of the silicon germanium/silicon FIN structures in the PMOS tier, a similar approach is taken to form the NMOS device tier as well, where the bonding dielectric (e.g. 805*b*) and liner (e.g. 803) serve as suitable etch stops for the termination of the FIN etching processing, thus preventing the retention of any silicon FIN residual under the upper active device, much as what was done for the bottom tier (e.g. in FIG. 9) when the PMOS active stack was created through a fusion bonding process to prevent any silicon FIN residual or substrate residual from being retained under the active device. This is necessary later in the backside power distribution network formation where the power lines and any backside signal lines can be formed without interference from any residual FIN structure or residual substrate which would limit the placement of said backside wires.

Figure 40:
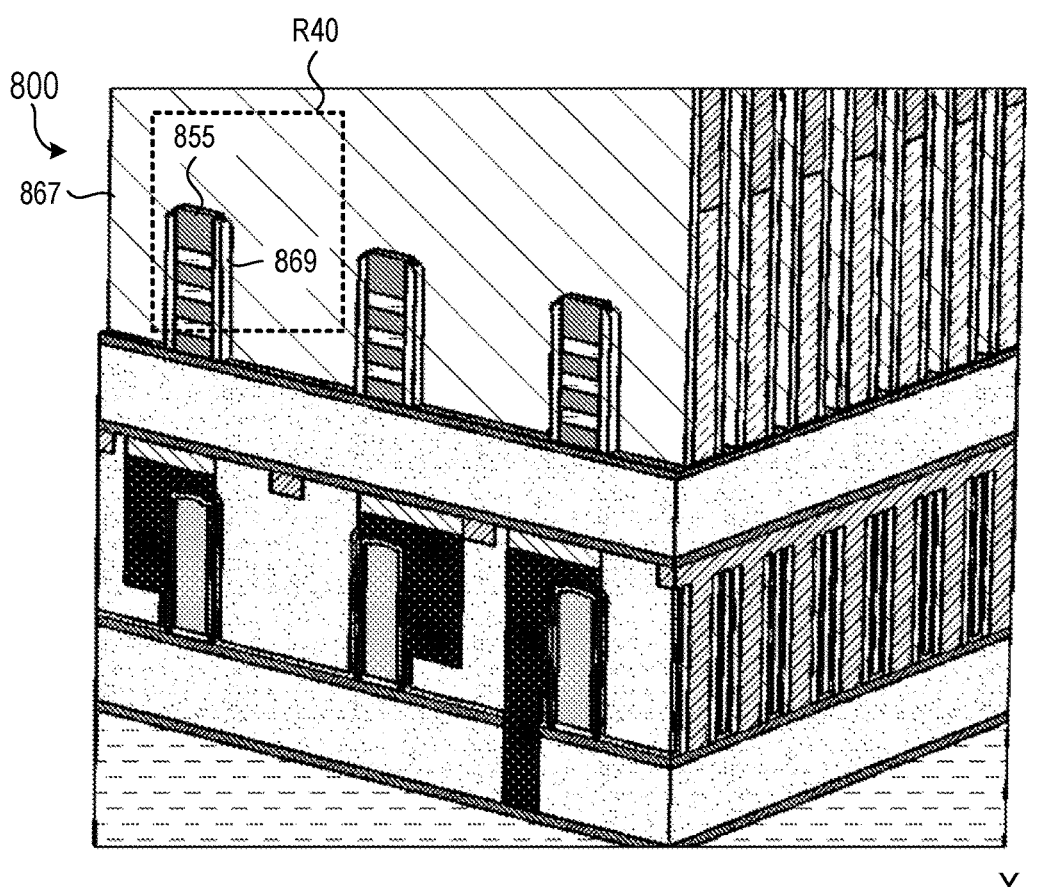
FIG. 40B shows an expanded view of Rectangle R40 in FIG. 40, in accordance with one embodiment of the present disclosure.
Figure 40B:
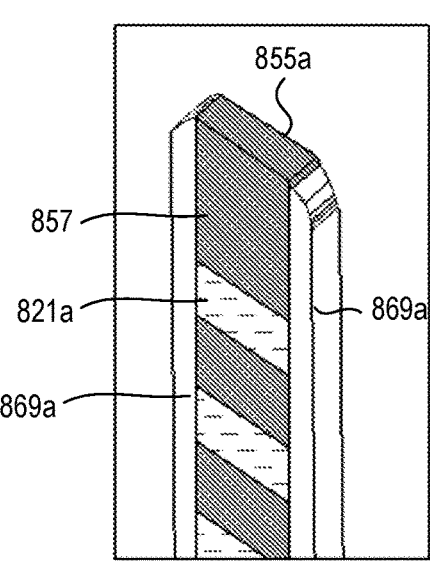

In FIGS. 40 and 40B, the semiconductor device 800 can go through processes similar to what is shown in FIGS. 10, 11, 12 and 12B, e.g. forming a protective film over the fin structures 855, forming a dummy gate over the protective film, forming a hardmask material over the dummy gate, patterning the hardmask material and the dummy gate, forming the constraint material 867 to cover the fin structures 855, removing the top constraints 868 of the constraint material 867 to uncover the fin structures 855 in future S/D regions while the sidewall constraints 869 are kept at opposing ends of the second channel structures 821. As a result, each pair of the sidewall constraints (e.g. 869*a*) laterally bounds a respective future S/D region at a respective end of the second channel structures (e.g. 821*a*).

In some embodiments, an NMOS dummy gate is formed, similar to the PMOS dummy gate earlier in the process integration. A similar approach to the low-k gate spacer formation process is done for the NMOS transistor, where the conformal deposition also covers the protruding silicon/silicon germanium FIN structure (e.g. 855). The low-k gate spacer (e.g. 867) is opened using an anisotropic etch process to reveal the protruding silicon/silicon germanium FIN stack (e.g. 855) without causing any lateral etching of the low-k gate spacer.

In FIGS. 41 and 41B, exposed portions of the fin structures 855 between each pair of the sidewall constraints (e.g. 869a) are removed to open future S/D regions, similar to FIGS. 13 and 13B.

In FIG. 42, recesses are formed in the seventh semiconductor material 857 before inner spacers 862 are formed in the recesses, similar to FIGS. 14, 14B, 15 and 15B.

For example, the silicon germanium (e.g. 857) can then be laterally recessed to define the physical gate length for the NMOS transistor. As with the case of the PMOS inner spacer formation, the NMOS inner spacer (e.g. 862) can be formed in a similar manner in which the native SiGeO is removed selective to the native oxide on the silicon nanosheet, a SAM material is then deposited which will selectively attach to the dielectric materials (native oxide on silicon nanosheet, low-k gate spacer such as SiOC or SiCBN, as well as bonding dielectric material such as silicon oxide, and bonding dielectric liner, such as silicon nitride or SiCN). The SAM will not deposit on the silicon germanium surface (e.g. 857) which will allow of the selective deposition of the inner spacer directly within the recessed areas without causing any disturbance or additive deposition to low-k gate spacer shoulder (e.g. 869). As with the case of the PMOS device, the inner spacer material (e.g. 862) can be different compared to that of the low-k gate spacer material (e.g. 867), providing that the dielectric constant of the material is within a desired range.

In FIG. 43, end portions of the second channel structures 821 are optionally recessed, second S/D structures 823 (for example as shown by 823a, 823b and 823c) are formed on the end portions of the second channel structures 821 by epitaxially growing a eighth semiconductor material between the sidewall constraints 869 that laterally confine the eighth semiconductor material, similar to FIGS. 16 and 17.

In some embodiments, the NMOS phosphorous or arsenic doped silicon epitaxy source and drain contact (e.g. 823) is then grown within the confinement of the low-k gate spacer shoulder (e.g. 869), such that the source and drain width is effectively the same as the nanosheet width, without any protruding diamond-shaped growth from either the sides or the top of the source and drain contact (e.g. 823). As was done in the PMOS source and drain contact formation, the uppermost layer of silicon germanium within the active initial FIN structure can optionally be set to a thickness which ensures that the source and drain contact makes full connection to the uppermost nanosheet while not extending over the tops of the low-k gate spacer shoulder where the CVD epitaxy would generate a larger diamond shape which would be detrimental to the formation of inter-tier vias which will later be formed to connect either bottom-tier PMOS devices upward to signal of upper-tier NMOS devices downward to backside power.

In FIG. 44, the sidewall constraints 869 are removed, a sacrificial film 871 is formed around the second S/D structures 823 by epitaxially growing a ninth semiconductor material that is etch selective to the eighth semiconductor material, and a contact etch stop layer (CESL) film 872 may be formed around the sacrificial film 871, similar to FIGS. 18 and 19.

In some embodiments, the low-k gate spacer shoulders (e.g. 869) are removed through an anisotropic etch process in which the lateral width of the low-k gate spacer covering the dummy gate will not be etched. The anisotropic etching process will consume the low-k gate spacer in the vertical direction, which is why a high aspect ratio silicon nitride cap is placed overtop of the amorphous silicon dummy gate structure such that the vertical recess of the low-k gate spacer will not reveal any amorphous silicon following the etch process. Likewise, the bonding dielectric liner material selection will be co-optimized with the low-k gate spacer material such that the bonding dielectric liner material can be used as an effective etch-stop layer for this process, and the removal of the low-k gate spacer shoulders (e.g. 869) will not cause any damage to the bonding dielectric material (e.g. 805b) which will be used as isolation between both complimentary devices and transistors.

A wrap-around process integration can likewise be applied to the NMOS source and drain contact, similarly to how this was accomplished for the PMOS source and drain contact through the growth or deposition of an etch-selective semiconductor layer (e.g. 871) overtop of the source and drain contact (e.g. 823) with the expectation that this conformal semiconductor material (e.g. 871) will later be able to be removed selective to the source and drain contact (e.g. 823). A contact etch stop layer (CESL) (e.g. 872) can then be either conformally or selectively deposited overtop of the source and drain contact (e.g. 823).

In FIG. 45, the ILD film 873 is formed and optionally planarized to fill space. Via openings 878b and 878c are formed to uncover the first bulk semiconductor material 801a. The via openings 878b and 878c extend through the second bonding dielectric layer 805b, the first tier 810 of transistors and the first bonding dielectric layer 805a.

At this point in the integration, the preference may be to focus on the replacement metal gate module and to build the transistor prior to formation of the metal interconnect for the source and drain contact. In this example flow, the decision to do the interconnect module first is purely arbitrary and is done for illustrative purposes; the module is already accessible in the integration modelling flow. It is important to note that the replacement metal gate (RMG) module may be more likely to start at this phase after the CESL liner has been deposited overtop of the contact.

This illustrative example continues with the local interconnect processing for the upper-tier NMOS device. Although this will look very similar to what was done for the bottom-tier PMOS device, some changes are made to account for the need for complimentary source and drain connections, as would be done for an inverter, as well as the need to pass through a bonding dielectric layer as well as through its associated bonding dielectric liner materials to make tier-to-tier connections.

At this step, the source and drain region has been filled with an ILD material (e.g. 873) such as silicon oxide, and the expected NMOS interconnect trenches have been formed which have been memorized in some type of hardmask which deposited overtop the ILD (e.g. 873).

After the upper NMOS interconnect trench pattern has been memorized into some hardmask material, the via connections which will connect the upper NMOS interconnect to back-side power will be patterned, and then transferred through the ILD oxide (e.g. 873), through the bonding dielectric oxide (e.g. 805b) and its associated liners (e.g. 803), through the bottom tier ILD oxide (e.g. 873), and finally through the bottom bonding dielectric (e.g. 805a) and its associated liners (e.g. 803). As can be seen in the image below, the etch selective cap (e.g. 833) that has been deposited overtop of the bottom interconnect metal (e.g. 819) will prevent any unwanted connection to the bottom-tier PMOS source and drain contact (e.g. 811), and acts as a means of self-alignment to prevent any shorting between complimentary devices.

U.S. Pat. No. 10,770,479 provides an additional means by which this etch selective dielectric cap width can be extended through the initial recess of the ILD oxide (e.g. 873) to below the top of the metal interconnect (e.g. 819), such that any conformal or selective deposition of the etch-selective cap will effectively partially wrap-around the upper top of the interconnect metal. The extension of the cap width will thus be a function of the intended thickness of the dielectric cap. The benefit that this provides is to further maintain not only proper self-alignment to prevent shorting between complimentary devices in a CFET device, but to also define the minimum separation between vias of a discreet device coming into close proximity to its complimentary device; thus, preventing any potential for reliability failures such TDDB. Additionally, the ability to force any minimum separation between vias and complimentary devices will also allow for optimization of placement of vias to optimize for capacitance.

As with the case of the vias connecting bottom-tier PMOS interconnects to backside power, the vias connecting the upper-tier NMOS devices to backside power can be sized much wider to provide for improved parasitic resistance. The self-alignment capability of the integration outlined above allows for the increase in width of the vias.

In FIG. 46, the via openings 878*b* and 878*c* are filled, for example with the filler material 874. A via opening 878*d* is formed to uncover the LI structure 819*a*.

In some embodiments, after the vias (e.g. 878*b* and 878*c*) connecting the upper tier NMOS interconnects to backside power have been formed, they (e.g. 878*b* and 878*c*) will then be gap-filled with a material (e.g. 874) such as spin-on-organic (SoC) which will protect the vias (e.g. 878*b* and 878*c*) from any additional etching when additional vias (e.g. 878*d*) are patterned and transferred into the ILD dielectrics (e.g. 873).

In this next case, the vias making connections between complimentary devices is patterned and transferred into the upper ILD dielectric (e.g. 873), through the bonding dielectric (e.g. 805*b*) and dielectric liner materials (e.g. 803) separating the complimentary device tiers, terminating on the etch selective dielectric cap (e.g. 833) over the bottom PMOS interconnect (e.g. 819*a*). The etch selective cap (e.g. 833) can then be opened through a separate etch step with selectivity to the surrounding dielectric materials to open the bottom-tier PMOS interconnect metal (e.g. 819*a*).

In FIG. 47, the filler material 874 can be formed in the via opening 878*d* and recessed in the via openings 878*b*, 878*c* and 878*d*, for example to a bonding liner 803 over the second bonding dielectric layer 805*b*. As a result, the second bonding dielectric layer 805*b* is protected by the filler material 874 during subsequent etching and deposition.

In some embodiments, after the formation and transfer of the vias through the ILD (e.g. 873) and bonding dielectric films (e.g. 805*a* and 805*b*), the vias (e.g. 878*b*, 878*c* and 878*d*) are then filled with a gap-filling material (e.g. 874) such as spin-on-organic to cover the exposed metal surfaces of the opened bottom tier interconnect metal (e.g. 819*a*) as well as to prevent any unwanted further etching of the vias in later processing. The gap-fill will be recessed to some extent such that the memorized interconnect trench pattern in the memorization hardmask film is fully exposed.

In FIG. 48, LI openings 879*d*, 879*e* and 879*f* are formed to uncover the CESL film 872. The LI openings 879*d*, 879*e* and 879*f* respectively connect with via openings 878*d*, 878*b* and 878*c*. For example, after the gap-fill (e.g. 874) is in place and recessed down to protect the necessary components (e.g. 805*b*, 819*a* and 810) in the devices below, the upper-tier NMOS interconnect trenches (e.g. 879*d*, 879*e* and 8790 can then be transferred from the memorizing hardmask (e.g. 876*b*) down into the ILD oxide film (e.g. 873).

In FIG. 49, the semiconductor device 800 can go through processes similar to what is shown in FIGS. 22, 22B, 23, 24, 25, 25B and 26. For example, the CESL film 872 is removed to uncover the sacrificial film 871, and then the sacrificial film 871 is removed to uncover the second S/D structures 823. A silicide material 824 (for example as shown by 824*a*, 824*b* and 824*c*) is formed all around the second S/D structures 823. The filler material 874 is removed. Subsequently, vias 831*a*, 831*b* and 831*e* and LI structures 829 (for example as shown by 829*a*, 829*b* and 829*c*) are formed in via opening 878*d*, 878*b* and 878*c* and LI openings 879*d*, 879*e* and 879*f*. The vias 831*a*, 831*b* and 831*e* and LI structures 829 are recessed, and capping layers 833 are formed over the LI structures 829. The ILD film 873 is deposited to fill space before an etching, polishing and/or planarization process is executed to remove the hardmask material down to a level of the dummy gate.

In some embodiments, the contact etch stop layer (CESL) (e.g. 872) is then selectively removed with respect to the surrounding dielectric materials. This is then followed by the removal of the conformal semiconductor liner (e.g. 871) providing for the wrap-around contact. The removal of the conformal semiconductor liner material (e.g. 871) will leave behind a tunnel within the ILD dielectric (e.g. 873) which effectively wraps around the entire source and drain contact (e.g. 823).

A silicide (e.g. 824) can then be formed over the exposed NMOS source and drain contact (e.g. 823). The choice of silicide material in this case can be optimized for NMOS and does not necessarily need to be the same as the silicide material (e.g. 814) used for the PMOS contact (e.g. 813).

The gap-fill material (e.g. 874) is then ashed away with great selectivity to the surrounding dielectric materials as well as to the silicide (e.g. 824) formed overtop of the NMOS source and drain contact (e.g. 823).

The vias (e.g. 878*d*, 878*b* and 878*c*) and interconnect trenches (879*d*, 879*e* and 8790 are then metallized with a high conductive metal such as ruthenium, cobalt, or tungsten. The metal filling process can be either through a conventional method such as complete filling with subsequent metal CMP and recess etch, or the metal filling can be done through a bottom-up approach.

After metallization of the upper-tier NMOS interconnect (e.g. 829), an etch selective cap (e.g. 833) is then deposited (either conventionally or through a selective deposition process) overtop the metal interconnect (e.g. 829) to provide for some etch selectivity in subsequent etch processes in which connections to either device tier to BEOL signal can be done without risk of shorting to the complimentary device.

Note that as the interconnect trenches (879*d*, 879*e* and 8790 are patterned, the intended via structures (e.g. 878*d*, 878*b* and 878*c*) can be likewise patterned which will make connections between lower-tier PMOS interconnects (e.g. 819) and the BEOL signal wiring. This technique will allow for complete self-alignment and fixed separation between the discrete vias of one device and its complimentary device, effectively controlling reliability such as TDDB and allowing for optimization of the capacitance between vias and their complimentary devices. While not shown here, this technique can be understood by one skilled in the art.

After the deposition of the etch selective cap (e.g. 833) over the upper-tier NMOS device, the source and drain region can be filled with ILD oxide (e.g. 873) and then polished down to the gate cap by CMP.

Figure 50:
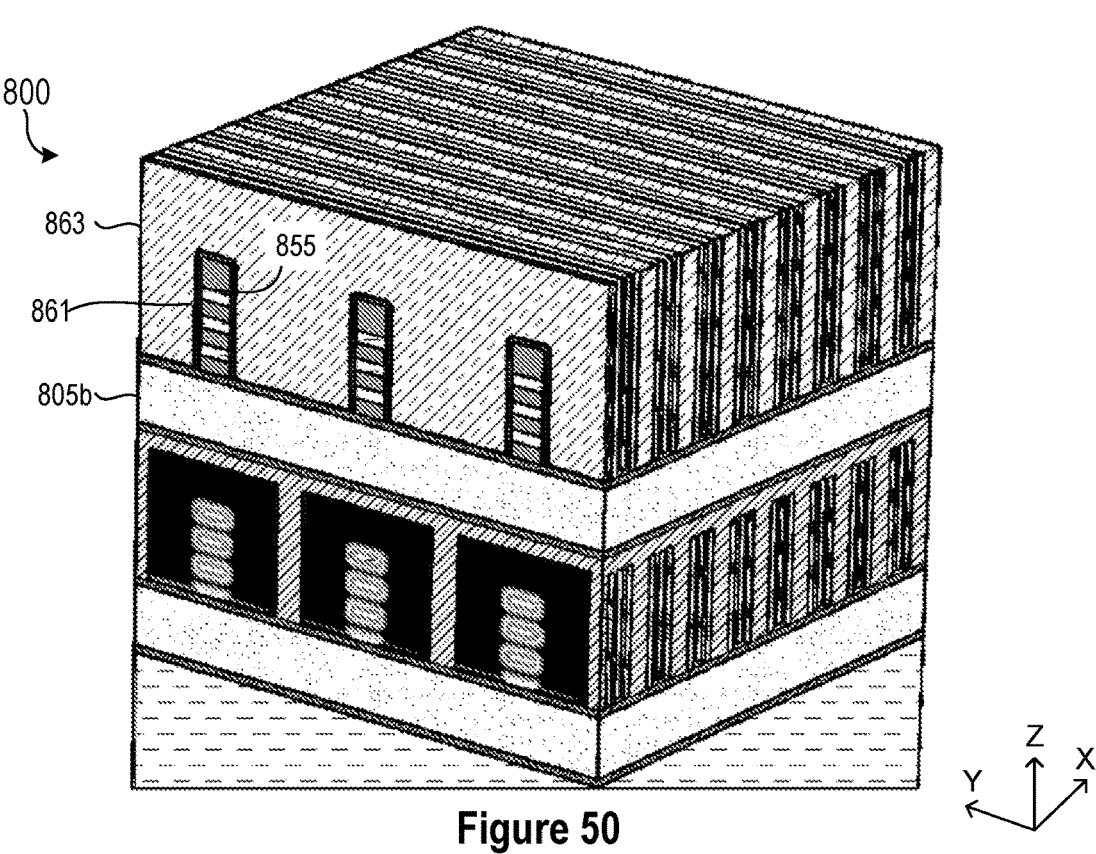

FIGS. 49 and 50 can show the semiconductor device 800 at different cross-sections. For example, FIG. 49 can show a perspective of a cross-section taken along S/D structures while FIG. 50 can show a perspective of a cross-section taken along gate structures. FIG. 50 shows the dummy gate 863 and the fin structures 855. For example, the wafer (e.g. 800) can be planarized by CMP down to reveal the dummy gate amorphous silicon (e.g. 863). If the replacement metal gate (RMG) was done ahead of the formation of the upper-tier interconnects (e.g. 829), then this CMP step would have been done earlier in the process integration.

Figure 51:
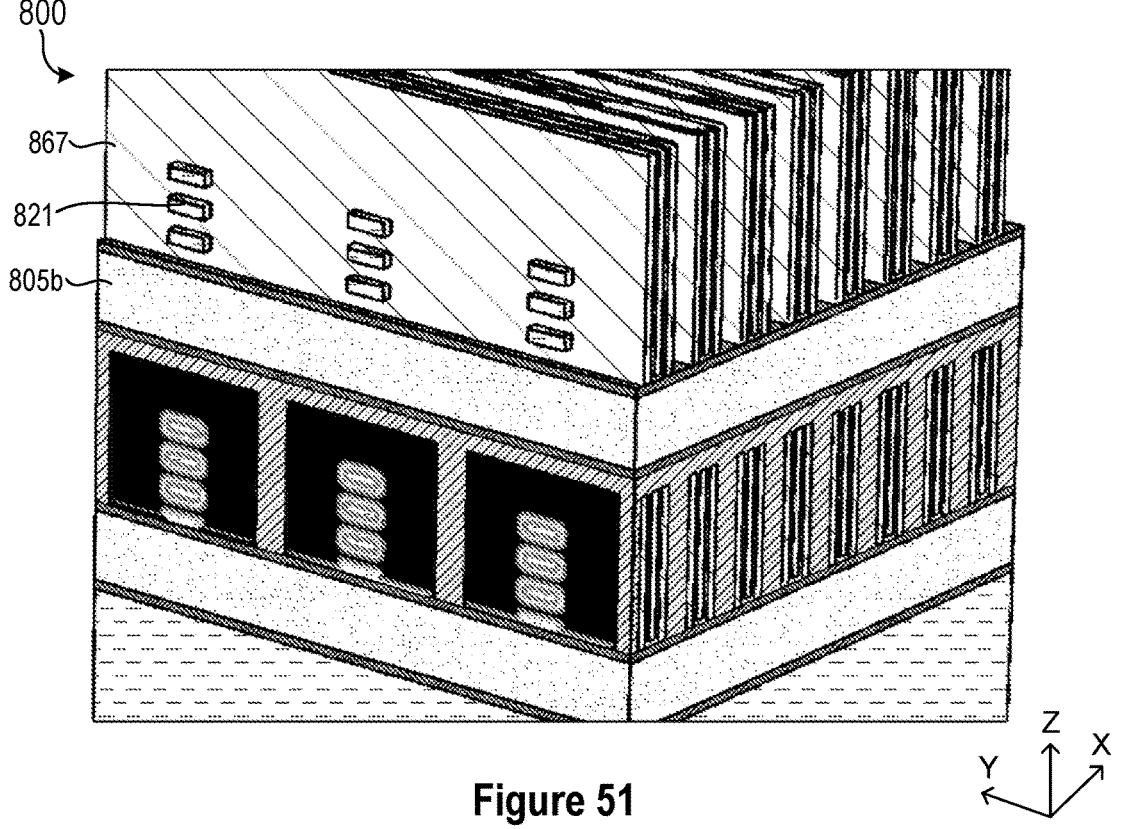

In FIG. 51, the semiconductor device 800 can go through processes similar to what is shown in FIGS. 28, 29, 30 and 30B. For example, the dummy gate 863 can be removed to uncover the protective film 861 covering the fin structures 855. The protective film 861 is removed to uncover the fin structures 851. The seventh semiconductor material 857 is selectively removed relative to the second channel structures 821.

In some embodiments, the amorphous silicon (e.g. 863) is removed from the upper dummy gate area, leaving the silicon/silicon germanium FIN stack (e.g. 855) revealed. The silicon germanium (e.g. 857) is then selectively etched with respect to the silicon nanosheet (e.g. 821). The silicon nanosheet (e.g. 821) can be optionally trimmed to round the corners of the nanosheet structures; but does not need to be trimmed to the amount of the PMOS nanosheets (e.g. 811) for the case where silicon germanium cladding (e.g. 812) was used to enhanced PMOS channel mobility.

In FIGS. 52 and 52B, an interlayer layer 826 of silicon oxide or silicon germanium oxide can be optionally formed around the second channel structures 821. Then, at least one gate dielectric 827 can be formed around the interlayer layer 826. A capping material 875 can be optionally formed around the at least one gate dielectric 827.

In some embodiments, after formation of the NMOS channel (e.g. 821), the conventional replacement metal gate processing can be done where the interlayer layer 826 of silicon oxide is grown from the channel (e.g. 821), followed by conformal or selective deposition of a high-k dielectric film (e.g. 827) such as HfO$_2$, followed by some type of capping material (e.g. 875) deposition such as TiN or amorphous silicon, followed by some type of reliability anneal process, followed by removal of the capping material (e.g. 875), and finally followed by deposition of the work function metals such as TiAlN, TiAl, and TiAlC.

It is important to note that due to the high processing temperatures associated with the reliability anneal, that this would in fact favor the integrations where the replacement metal gate (e.g. 863) is done before the silicide (e.g. 824) formation around the source and drain contacts (e.g. 823) and metallization of the interconnects (e.g. 829).

Such reliability anneals can be done incorporating higher pressure and lower temperature processes in the future, or done using very rapid annealing steps to prevent any phase change to the formed silicide (e.g. 814 and 824) around source and drain contacts (e.g. 813 and 823).

Figure 53:
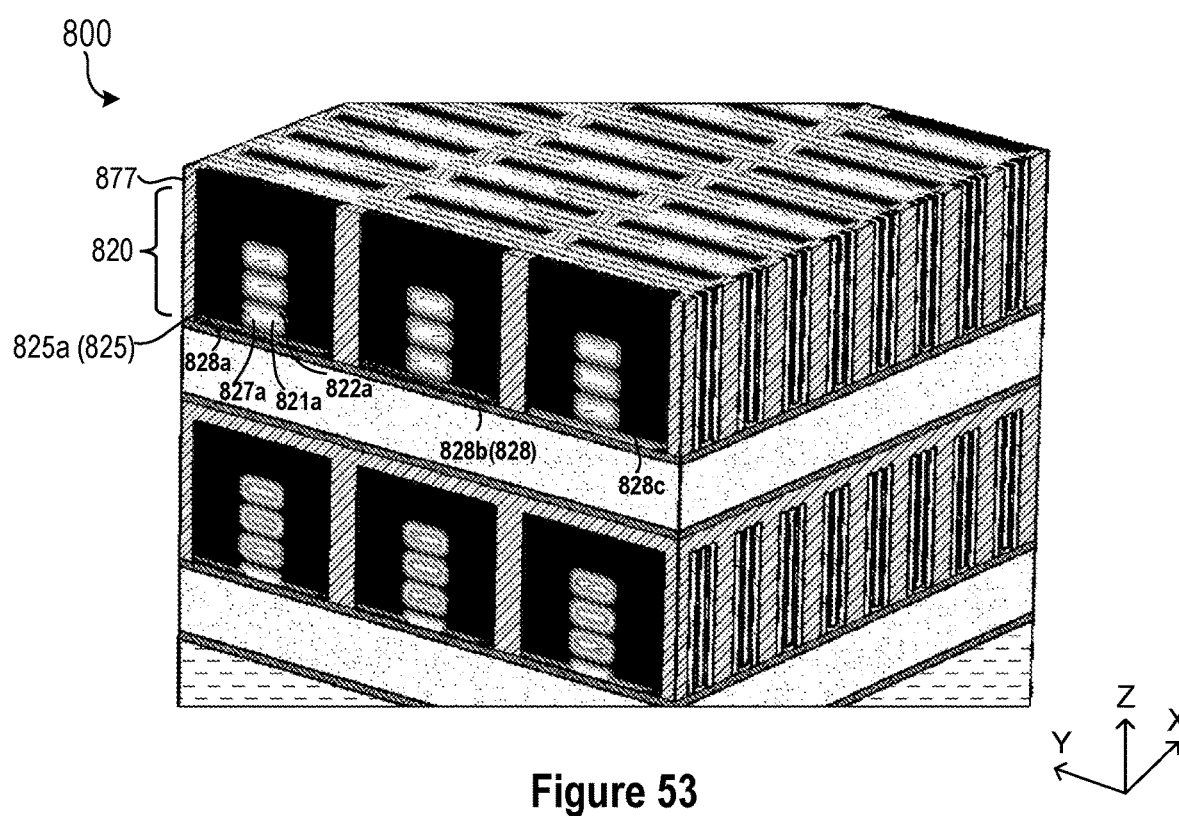

In FIG. 53, a second tier 820 of transistor is formed, similar to FIGS. 34 and 35. For example, at least one gate metal 828 (for example as shown by 828a, 828b and 828c) can be formed around the at least one gate dielectric 827. The at least one gate metal 818 can then be patterned and divided into gate metals 818a, 818b and 818c which are separated by the dielectric material 877. Consequently, gate structures 825 (for example as shown by 825a) are formed.

In some embodiments, after the NMOS work function metal stack has been conformally deposited around the channel (e.g. 821), the replacement metal gate is then filled with a high conductive metal such as tungsten and polished or etch-recessed down to form the metal gate. After the NMOS metal gate (e.g. 825a) has been formed, a masking process to form the HKMG cut is transferred down into the HKMG stack and the filled with some type of dielectric (e.g. 877) such as silicon nitride which will separate the standard cells in the north-south orientation (e.g. the Y direction) from one another.

Figure 54:
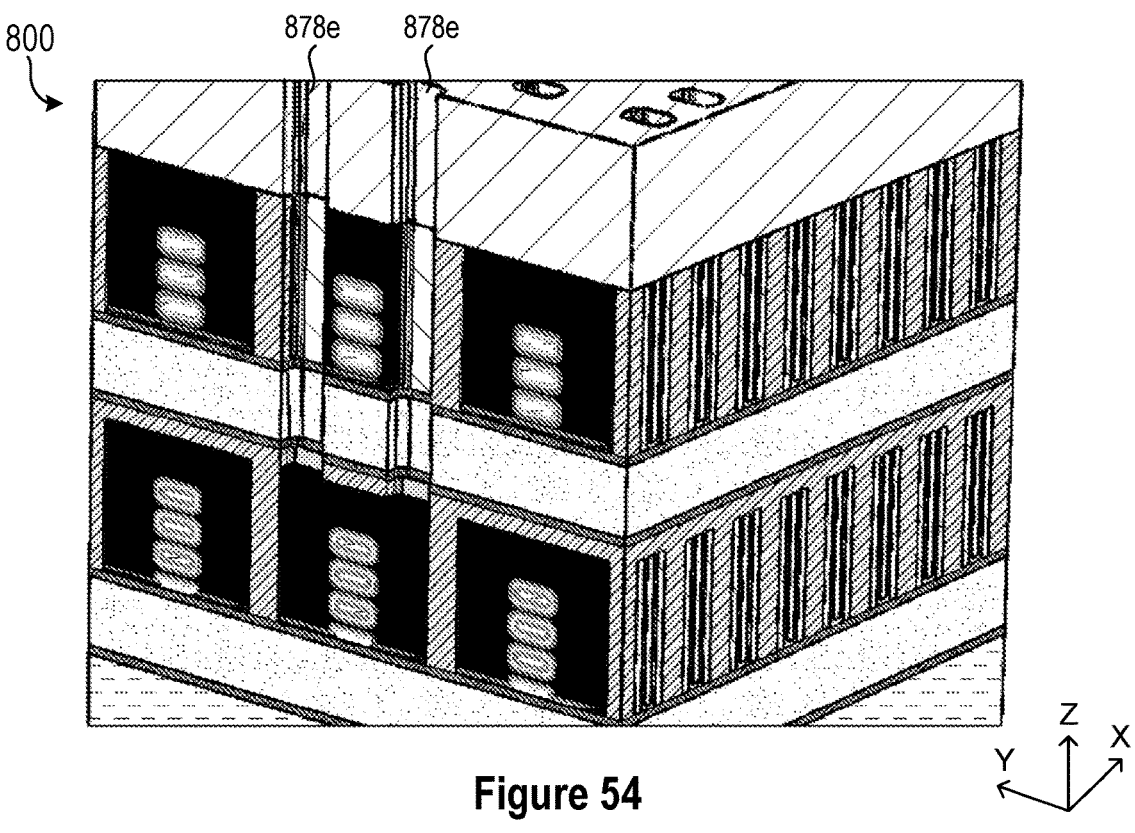

In FIG. 54, via openings 878e are formed. In some embodiments, for common NMOS/PMOS gate connections, some type of inter-gate via (e.g. 878e) needs to be patterned and transferred through the upper transistor metal (e.g. 828) and then transferred down past the dielectric bonding oxide (e.g. 805b) and its associated liner materials (e.g. 803), and finally through the silicon nitride cap (e.g. 877) placed overtop the bottom PMOS transistor. A self-aligned gate contact (SAGC) or contact-over-active-gate (COAG) process may be employed to ensure that the inter-gate via is only etching through the transistor region and not into the low-k gate spacer (e.g. 867) or ILD oxide (e.g. 873) in the source and drain region. What can be done is that the initial ILD film (e.g. 873) in the source and drain contact region can be partially recessed along with the low-k gate spacer (e.g. 867) and this recessed gap filled with a material with great etch selectivity to both the metal and wafer bonding dielectric materials to ensure that this etch process will not extend into the device region and cause any type of unwanted shorting.

Figure 55:
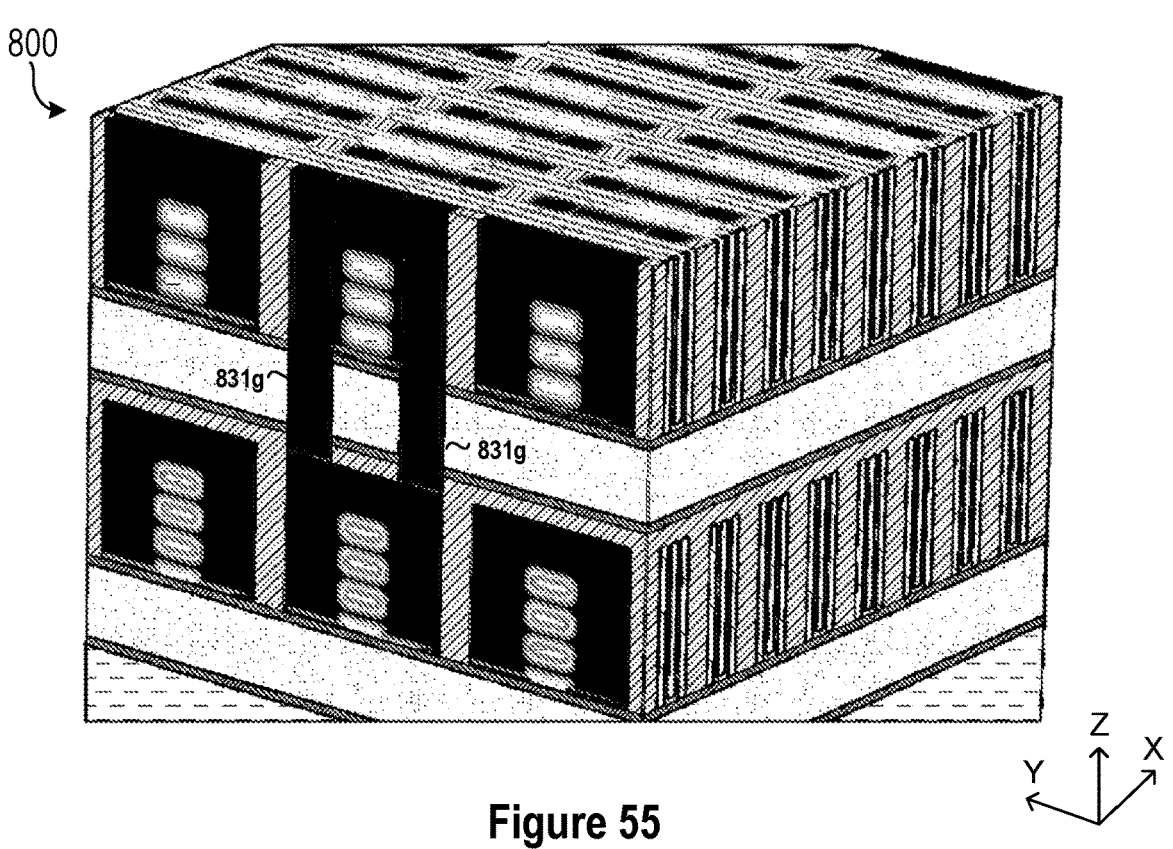

In FIG. 55, vias 831g are formed. For example, after the inter-gate vias (e.g. 878e) have been transferred to form the desired common gates, the vias (e.g. 878e) are metallized with some type of liner material followed by the filling with a gate metal such as tungsten.

Figure 56:
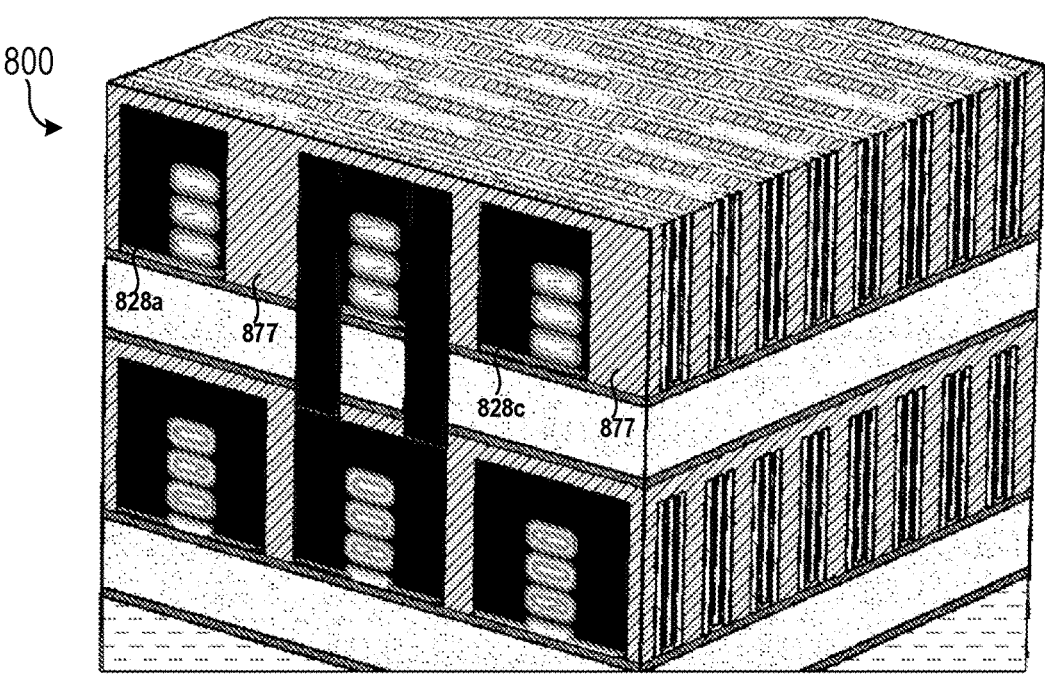

In FIG. 56, gate metals 828a and 828c are partially removed and filled with the dielectric material 877. As a result, the gate metals 828a and 828c have reduced dimensions in the Y direction, and more space is available for future metal hookup.

In some embodiments, after the formation and metallization of the inter-gate vias (e.g. 878e), a second HKMG cut process is done to reduce the size of the upper-tier NMOS transistors (e.g. 820) so that an eventual input connection can be made to connect down to the bottom-tier PMOS transistor (e.g. 810) from the BEOL metal wiring stack. This cut structure will likewise be filled with some type of dielectric such as silicon nitride, with the objective to form some type of stair-case profile within the stacked gate structures as what exists with the stacked metal interconnects on the source and drain plane.

The gate metals and HKMG stack can then be selectively recessed with respect to the surrounding dielectric materials to make room for the eventual upper-tier gate cap. Once the recess is completed, a dielectric material (e.g. 877) which will have etch selectivity to the cap (e.g. 833) overtop of the upper-tier NMOS interconnect structures (e.g. 829) as well as to the low-k gate spacer (e.g. 867) will be deposited within the recess areas to form the gate cap.

FIG. 57 shows a perspective view along the S/D structures. In FIG. 57, a via opening 878f is formed to uncover an LI structure 819b.

In some embodiments, the vias (e.g. 8780 which will be used to connect BEOL signal down to the bottom tier interconnect (e.g. 819b) are patterned and transferred down thorough the upper ILD oxide film (e.g. 873), as well as through the bonding dielectric (e.g. 805*b*) and its associated liner films (e.g. 803), and finally opening the etch-selective cap (e.g. 833) over the bottom PMOS metal interconnect (e.g. 819*b*).

It is important to note that the bulk of this via (e.g. 8780 passing through the upper ILD oxide (e.g. 873) and wafer bonding dielectric (e.g. 805*b*) could have been formed in a patterning process during the initial upper-tier interconnect trench etch transfer process (e.g. FIG. 48) to ensure that a minimum dielectric difference exists between any vias and their complimentary interconnect structure to minimize capacitance and maximize reliability performance. In this particular example, the via (e.g. 8780 is done as a separate patterning step for illustrative purposes.

It is also important to note that the vias (e.g. 8780 will have a much wider dimension relative to the MO trench pattern, and this can be accomplished through incorporating a single damascene process in which the vias will be formed and metallized prior to the actual MO patterns. This allows for the larger width of the vias connecting through multiple device tiers (e.g. 810 and 820), which will offset the parasitic resistance penalty created by the larger depth of the vias, due to the vias needing to pass through a bonding dielectric (e.g. 805*a* and 805*b*) and associated liner stack (e.g. 803), which would not be necessary in a monolithic implementation of CFET. The vias (e.g. 8780 connecting signal to interconnect (e.g. 819*b*) can be self-aligned to just the contact region by means of the SAGC or COAG process mentioned earlier.

In FIG. 58, the via opening 878*f* can be filled with the filler material 874, and a via opening 879*g* is formed to uncover an IL structure 829*a*.

In some embodiments, after the vias (e.g. 8780 connecting BEOL signal to the lower-tier PMOS interconnects (e.g. 819*b*) are formed, a gap-filling material (e.g. 874) such as spin-on-carbon will be filled into the formed vias (e.g. 8780 to protect the interconnect metal (e.g. 819*b*) from any subsequent down-stream etch processing associated with the formation of vias connecting to upper-tier interconnects or to transistors.

Figure 59:
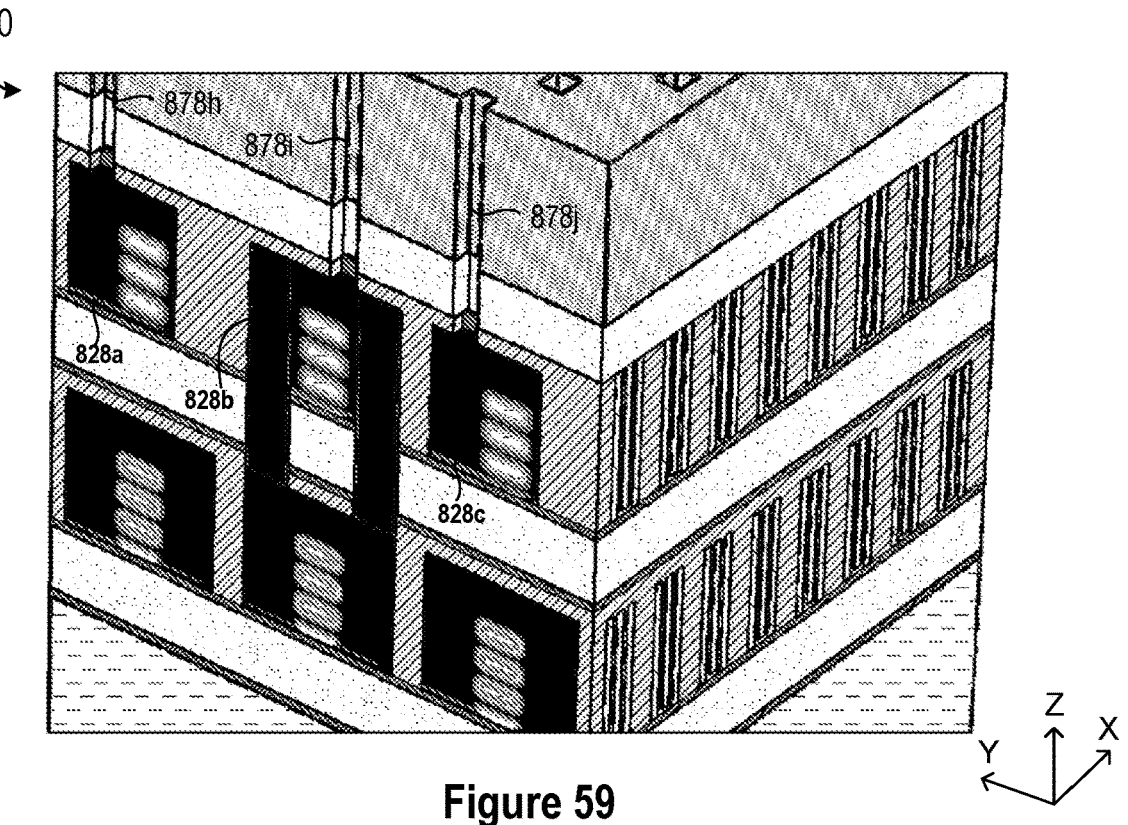

FIG. 59 shows a perspective view along the gate structures. In FIG. 59, via openings 878*h*, 878*i* and 878*j* are formed to uncover gate metals 828*a*, 828*b* and 828*c*. For example, the input vias (e.g. 878*h*, 878*i* and 878*j*) connecting the upper-tier NMOS transistors (e.g. 820) can be patterned and transferred through the gate cap material (e.g. 877) to make connection to the BEOL. At this time, the vias (e.g. 878*f* and 878*g*) connecting BEOL signal to the interconnects (e.g. 819*b* and 829*a*) have all been filled with the gap-fill spin-on-carbon material (e.g. 874) so these are protected during this etch transfer process.

Figure 60:
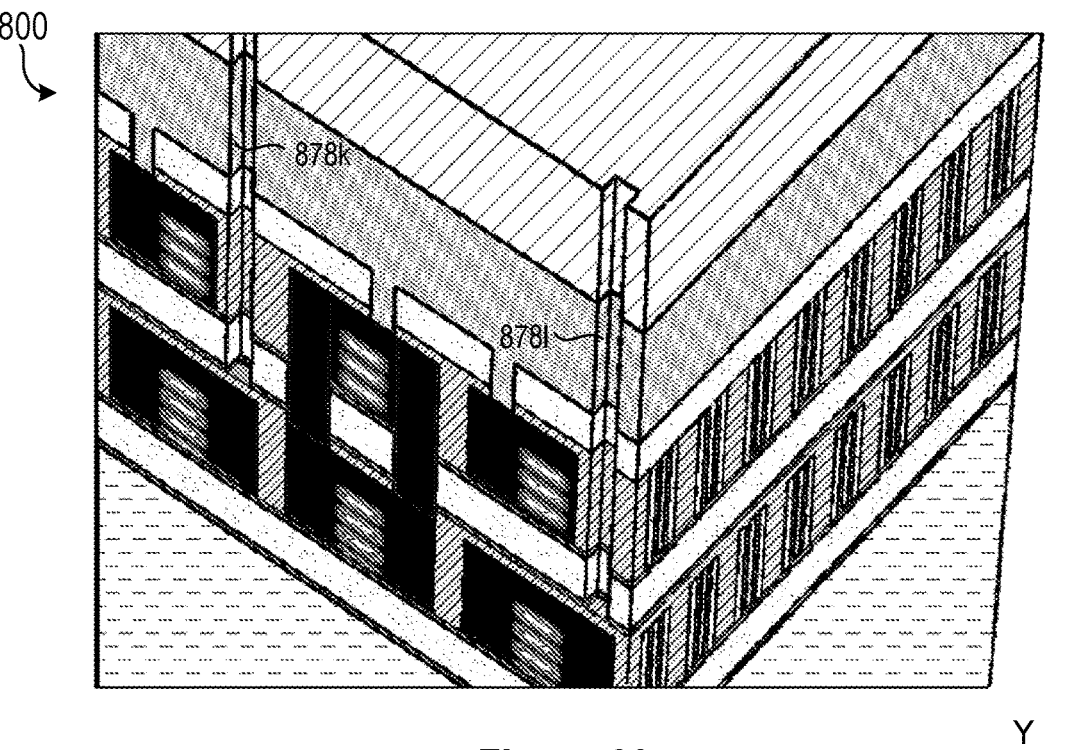

In FIG. 60, the via openings 878*h*, 878*i* and 878*j* are filled with the filler material 874. Via openings 878*k* and 878*l* are formed to uncover gate metals 818*a* and 818*c*. For example, patterning of the input vias (e.g. 878*k* and 878*l*) connecting BEOL to the lower-tier PMOS transistors (e.g. 810) will need to pass through the dielectric stair-case formation created in the replacement gate module. These vias (e.g. 878*k* and 878*l*) will likewise need to pass through the stair-case dielectric within the upper gate tier (e.g. 825) as well as through the wafer bonding dielectric (e.g. 805*b*) and its associated liner films (e.g. 803) and finally through the gate cap (e.g. 877) of the lower-tier PMOS gate (e.g. 815), while maintaining selectivity to the surrounding dielectric caps over the ILD oxide (e.g. 873) and interconnect metals (e.g. 819 and 829) provided by the SAGC or COAG process.

Figure 61:
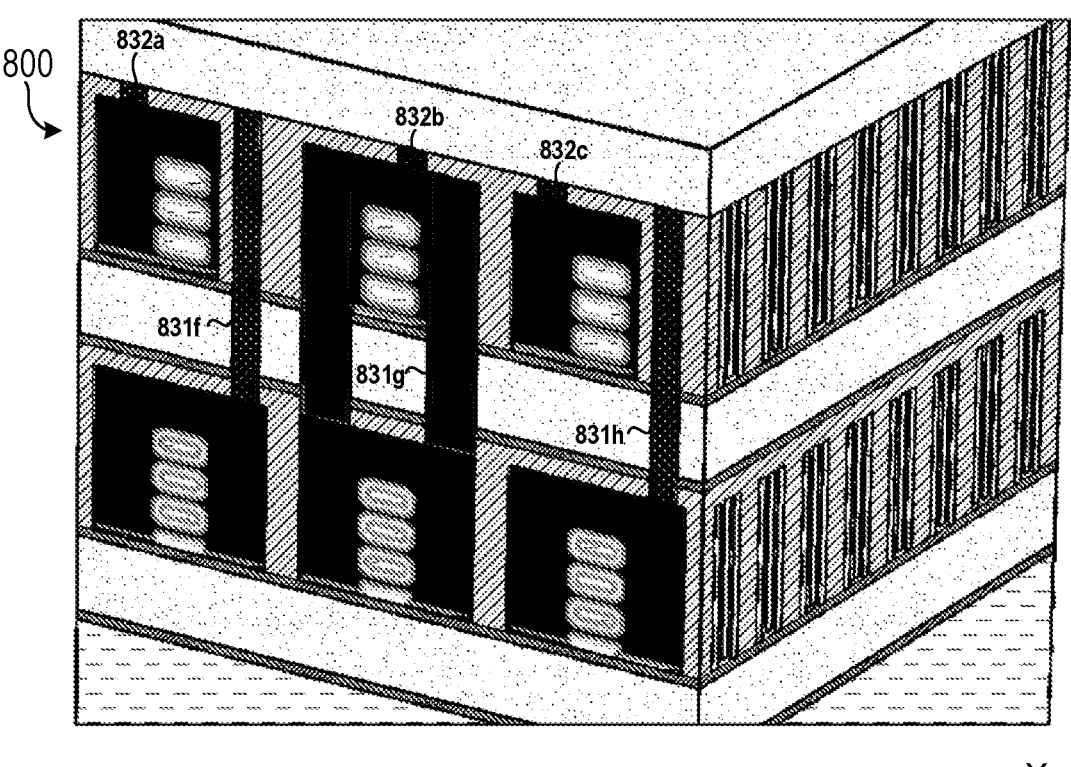

In FIG. 61, the filler material 874 is removed from via openings 878*h*, 878*i*, 878*j*, 878*k* and 878*l* before vias 831*f*,

831*h*, 832*a*, 832*b* and 832*c* are formed. For example, the gap-fill spin-on-carbon material (e.g. 874) can be ashed away from within the via structures (e.g. 878*h*, 878*i*, 878*j*, 878*k* and 878*l*). The input-to-gate (e.g. 832*a*, 832*b* and 832*c*) and signal-to-interconnect (e.g. 831*f* and 831*h*) vias can then be metallized at the same time with a highly conductive metal such as ruthenium, cobalt, tungsten, or other suitable metal.

Figure 62:
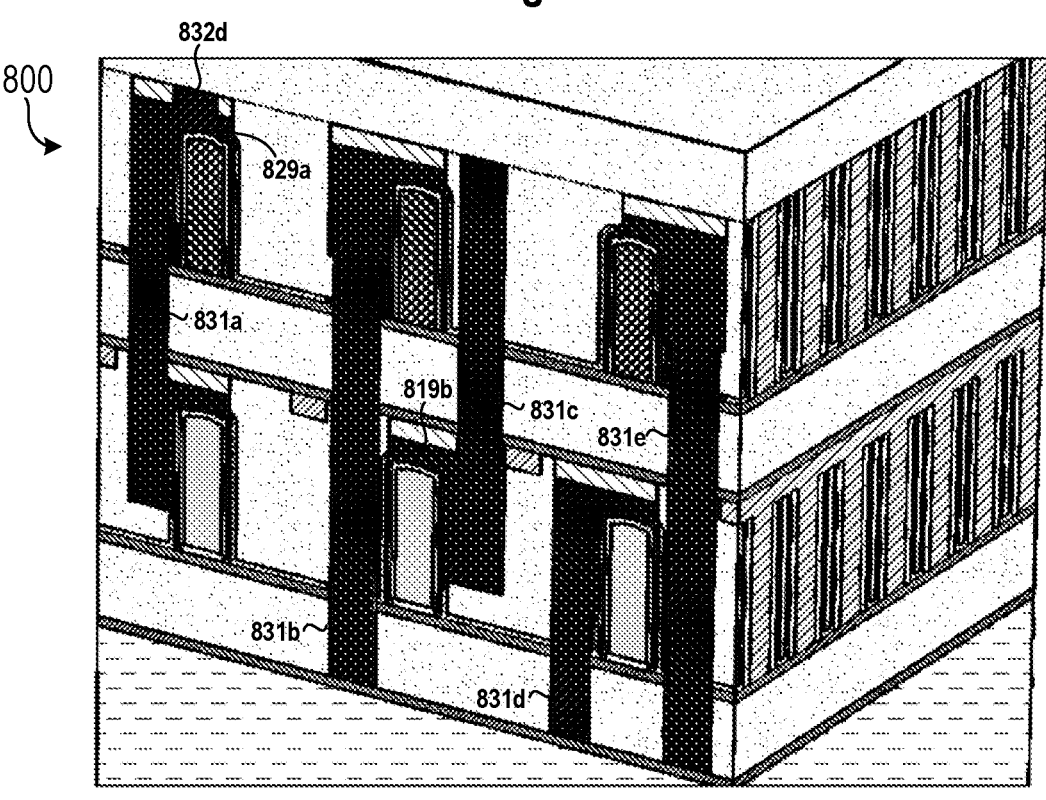

FIG. 62 shows a perspective view along the S/D structures. In FIG. 62, the filler material 874 is removed from via openings 878*f* and 878*g* before vias 831*c* and 832*d* are formed. For example, FIG. 62 can show the vias (e.g. 831*c* and 832*d*) connecting the interconnect metals (e.g. 819*b* and 829*a*) to BEOL signal to be fully metallized.

Note that FIGS. 61 and 62 can show the semiconductor device 800 at the same processing step. That is, the filler material 874 can be removed from via openings 878*f*, 878*g*, 878*h*, 878*i*, 878*j*, 878*k* and 878*l* by a common etching process. Vias 831*c*, 832*d*, 831*f*, 831*h*, 832*a*, 832*b* and 832*c* can be formed simultaneously.

In FIG. 63, a signal wiring layer 807 is formed over the second tier 820 of transistors, and a mask layer 809 is formed over the signal wiring layer 807. Note that the signal wiring layer 807 includes a dielectric material at this step, and signal lines 808 can be formed in the signal wiring layer 807 in FIG. 64.

For example, in a single damascene process, the initial BEOL signal wiring layer (e.g. 807) is then patterned and transferred down through the low-k oxide (e.g. 807) to make contact to the wide gate vias (e.g. 832*a*, 832*b*, 832*c*, 831*f* and 831*h*) and contact vias (e.g. 832*d* and 831*c*). The etch selective cap (e.g. 833) over the metal interconnect (e.g. 829) will self-align the landing of the initial metal etch process to only land on exposed metal (e.g. 832*d* and 831*c*) and not inadvertently short to any device. The initial metal tracks (e.g. 808) are then metalized with a highly conductive material such as ruthenium or cobalt.

In this example, only a single BEOL metal layer (e.g. 807) is shown, but it is understood that a plurality of metal layers (e.g. 16 additional metal layers) can be formed over the initial metal layer in the BEOL. A single metal layer (e.g. 807) is shown here for simplicity's sake and illustrative purposes.

In FIG. 65, a fourth bulk semiconductor material 801*d* can be formed over the second tier 820 of transistors.

In one embodiment, after the final metal (e.g. 808) and/or pad is formed in the BEOL, a dielectric bonding layer (e.g. 805*c*) and its associated liners (e.g. 803) are deposited at the top of the wafer (e.g. W3), as well as on a separate carrier wafer (e.g. W4) which includes the fourth bulk semiconductor material 801*d*. This carrier wafer (W4) is then fusion bonded to the top-surface of the existing device wafer (e.g. W3).

In another embodiment, an etch stop layer (e.g. 805*c*) can be formed over the signal wiring layer 807, and the fourth bulk semiconductor material 801*d* can be deposited over the etch stop layer (e.g. 805*c*).

In FIG. 66, the semiconductor device 800 is flipped, and the first bulk semiconductor material 801*a* is removed to uncover the first bonding dielectric layer 805*a* and vias 831.

In some embodiments, the device (e.g. 800) is then flipped on its axis (e.g. along the Z axis) such that the bottom (e.g. 801*a*) of the device wafer (e.g. 800) is now exposed. The silicon substrate (e.g. 801*a*) can be removed through a back-grinding process followed by optional CMP and etch removal processes to expose the bottom dielectric bonding liner material (e.g. 803) which can be used as an etch-stop layer for the substrate removal process. Removal of this bonding dielectric liner (e.g. 803) will reveal the wafer bonding dielectric (e.g. 805*a*) itself along with the metallized vias (e.g. 831) which are connecting interconnects down to backside power distribution network.

In FIGS. 67 and 68, backside power rails 841 are patterned and formed. The backside power rails are separated from each other by a dielectric material 842. A liner or barrier 844 may be disposed on top of and on sidewalls of the backside power rails 841.

In some embodiments, an etch stop layer (e.g. 846) can be deposited over the exposed metal vias (e.g. 831) after the exposed metal vias (e.g. 831) have been cleaned, and then a low-k or silicon oxide film (e.g. 842) deposited overtop which will allow for the eventual etch transfer of the first backside power lines (e.g. 841). The backside power lines (e.g. 841), which can also be considered as backside VDD and VSS power can be patterned.

The benefit of this backside approach is that there is no longer any residual silicon FIN emanating from the base of the lower-tier PMOS source and drain contacts (e.g. 813) which can conflict with the sizing and placement of the backside metal lines (e.g. 841). Additionally, the lack of any residual FIN or residual silicon substrate extending into the wafer backside also allow for the use of not only backside power lines, but also the inclusion of backside signal lines which may connect to either source and drain contacts, or even directly to the gate metals themselves. For example, a cross-couple can now be formed on the backside of the wafer in between intended power lines; or a local wiring track can also be placed on the wafer backside in between power tracks.

The backside power lines can then be transferred through the silicon oxide or low-k dielectric film (e.g. 842) with stop on the etch stop layer (e.g. 846), which can also be formed of a dielectric material.

The etch stop layer (e.g. 846) is then opened to reveal the vias (e.g. 831) connecting to the backside power (e.g. 841). The benefit of this process is that no nano-TSV or micro-TSV (through-silicon vias) are required, and the connectivity is done directly between the vias (e.g. 831) and the initial backside metal lines (e.g. 841).

The backside power lines (e.g. 841) now have the flexibility to be much larger in width compared to the initial buried power rails described in U.S. Pat. No. 10,586,765, based on the absence of any residual silicon FIN as the backside power region has been made through a wafer fusion bonding process. Therefore, the VDD and VSS lines (e.g. 841) can be now metallized with any suitable metal, which would have otherwise not have been able to be introduced through a buried power rail concept which is often formed and metallized in the FEOL where severe restrictions are placed on which metal can be present prior to replacement metal gate (RMG) module.

In this example, a ruthenium-based barrier (e.g. 844), which is the same proposed metal as the vias 831 to be connected to, is formed followed by plating or filling of copper (e.g. 841). At the wider dimensions used for VDD and VSS in this application, it is to note that copper will actually have superior IR drop compared to filling these lines in with ruthenium or other high refractive metals, which would have been necessary for the case of buried power rail approach incorporating a FEOL integration.

In FIG. 69, a fifth bulk semiconductor material 847 can be formed over the backside power rails 841. In one embodiment, after all backside power metal layers (e.g. 841) have been formed, an addition carrier wafer can be bonded to the finished wafer backside via a third bonding dielectric layer 845, optionally with a bonding liner 843, similar to FIG. 65. In another embodiment, the fourth bulk semiconductor material 801*d* can be deposited over the backside power rails 841.

In FIG. 70, the semiconductor device 800 is flipped, and the fourth bulk semiconductor material 801*d* is removed. For example, this wafer device (e.g. 800) can then be flipped to expose the BEOL of the full device wafer. The initial carrier wafer substrate (e.g. 801*d*), and optionally a dielectric bonding layer 805*c*, can then be removed to expose the full BEOL (e.g. 808).

As can be appreciated, various embodiments can be contemplated herein. Below are additional example embodiments and advantages.

1. A backside power distribution network (BSPDN) that is formed incorporating a wafer hybrid bonding process before any of the active devices are formed on the wafer. This can be achieved through taking a silicon substrate and depositing a suitable dielectric bonding material such as silicon oxide, silicon nitride, or other suitable dielectric materials overtop. Taking a second silicon substrate wafer and epitaxially growing an alternating stack of semiconductor device materials such as silicon, silicon germanium, germanium, or combinations thereof, and depositing a suitable bonding dielectric material overtop. Taking the second wafer and flipping it such that the silicon/silicon germanium/germanium epitaxy stack is now facing down-ward. Bonding the second wafer onto the first wafer such that both dielectric bonding materials interface with one another. Removing the substrate from the backside of the second wafer such that only the intended semiconductor material stacks are present after grinding, CMP, etch processing. Forming an initial FIN structure comprising of only the semiconductor materials from second wafer in which the bonding dielectric will now form the termination of the FIN structure such that there is no residual FIN structure under the intended device. For complimentary FET (CFET) device, this process can be repeated to form additional device tiers.

2. The embodiment of #1 where the integration method allows for the complete removal of any residual silicon substrate or residual silicon FIN structure in the region between the source and drain contacts and the backside power delivery network.

3. The embodiment of #2 where the lack of residual substrate or residual silicon FIN structures allows for the up-sizing of the dimensions initial backside power distribution network in order to optimize IR drop as well as to allow for the placement of any connections being made to source and drain contacts to minimize total resistance, which would have otherwise been constrained by the presence of any residual substrate or residual silicon FIN structures.

4. The embodiment of #2, where the lack of residual substrate or residual silicon FIN structures allows for the placement of not only backside power delivery network metal lines, but allows for the easy placement of backside signal metal wiring, which would have otherwise been constrained by the presence of any residual substrate or residual silicon FIN structures.

5. The embodiment of #2 where the lack of residual substrate or residual silicon FIN structures allows for the connection between backside power and any source and drain contact to be done without the need to have micro or nano-sized through-silicon vias (TSV) processing; instead the integration allows for these connections between power and source-and-drain contacts to be done through conventional dielectric etching processes.

6. The embodiment of #3 where the larger available size of the backside power distribution lines now allows for the up-sizing of the vias connecting the source and drain contacts to the back-side power in order to minimize total parasitic resistance.

7. The embodiment of #6 in which said up-sized vias for a 3D complimentary FET (CFET) device can be patterned, formed, and metallized, at the same time where the interconnect to the complimentary source and drain contact is formed; thus, allowing for extremely small and fully self-aligned separation between complimentary metal source-and-drain interconnect metal and the any adjacent metal via connecting to the complimentary device.

8. The embodiment of #6 where the via can be up-sized through the confined epitaxy growth of both source-and-drain contacts which is necessary to reduce available space within the confined cell height.

9. The embodiment of #8 where the initial bonding dielectric used to form the bottom termination of the initial nanosheet FIN stack can be used as a suitable etch stop layer for the confined source and drain growth process and subsequent removal of the dielectric confinement shoulder.

10. The claim of #8 where contact resistance can be improved through the incorporation of a wrap-around-contact to off-set the smaller size of the source and drain contact.

11. The embodiment of #10 where the wrap-around contact can be formed through the deposition or epitaxial growth of an etch-selective semiconductor material over the formed source and drain contact structure.

12. The embodiment of #10 in which an etch selective process can be used to selectively remove the semiconductor material surrounding the source and drain contact from the actual contact structure in order to leave a "tunnel" wrapping around the source and drain contact structures, which can be subsequently exposed to a silicide growth and metallization process which likewise encapsulates the source and drain contact.

13. The embodiment of #1 where the semiconductor nanosheet stack can be replaced by a suitable two-dimensional channel material such as tungsten di-sulfide, molybdenum di-sulfide, phosphorene, graphene, or any other suitable 2D channel material and transition metal dichalcogenide (TMD).

14. The embodiment of #8 where said confined source and drain formation process can be achieved in an integration in which the inner-spacer formed is done through selective deposition of the inner-spacer material onto the recessed silicon germanium.

15. The embodiment of #14 where said process is used to prevent the removal or any distortion of the dielectric sidewall spacer which is necessary for the formation of the confined growth source and drain contact.

16. The embodiment of #14 where the selectively deposited inner spacer material can be of different composition as the low-k gate spacer which is also the material used for the dielectric sidewall spacer used to confine the source and drain epitaxy growth.

17. The embodiment of #14 where said inner spacer formation process is done through a selective deposition process in which native oxide on the surface of the recess silicon germanium can be removed selective to the native oxide over the silicon, such that self-aligned monolayer (SAM) materials can be selectively attached to dielectrics including the native oxide on the silicon and not onto the cleaned silicon germanium surface, thus allowing for the deposition of the inner spacer material only on the recessed surfaces of the silicon germanium.

18. The embodiment of #1 where a bottom dielectric isolation (BDI) integration is no longer required as the transistor formation in this integration will effectively terminate on the bonding dielectric, and no residual substrate or residual FIN structure will be present which would necessitate a BDI integration.

19. The embodiment of #1 where gate tie-downs can now be easily obtained to backside power in which vias can be formed during the high-k metal gate (HKMG) processing step in which direct connection between transistors and complimentary power can be done in order to provide for tie-downs of the transistors down to backside power.

20. The embodiment of #1 where having the bulk substrate removed will have negative strain influence on the PMOS channel which can be compensated for across multiple methods including (a) incorporation of silicon germanium channel, (b) silicon germanium cladding around the silicon PMOS channel, and (c) utilization of a different crystal orientation of the bulk silicon wafer for of the silicon or silicon germanium PMOS channel for the mobility of holes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate", "wafer" or "bulk semiconductor material" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of manufacturing a semiconductor device, the method comprising:

bonding a first wafer to a second wafer via a first bonding dielectric layer, the first wafer including a first bulk semiconductor material, the second wafer including a first stack of alternating layers of epitaxially grown semiconductor layers formed over a second bulk semiconductor material;

removing the second bulk semiconductor material to uncover the first stack;

forming a first tier of transistors from the first stack;

bonding a third wafer to the second wafer via a second bonding dielectric layer, the third wafer including a second stack of alternating layers of epitaxially grown semiconductor layers formed over a third bulk semiconductor material;

removing the third bulk semiconductor material;

forming a second tier of transistors from the second stack;

removing the first bulk semiconductor material to uncover the first bonding dielectric layer; and forming a power delivery network in contact with the first bonding dielectric layer, the power delivery network including backside power rails in contact with vias that extend through the first bonding dielectric layer.

2. The method of claim 1, further comprising:

forming the backside power rails after forming the first tier of transistors and the second tier of transistors.

3. The method of claim 1, before bonding the third wafer to the second wafer, the method further comprising:

forming local interconnect (LI) structures connected to source/drain (S/D) structures of the first tier of transistors; and forming at least one via that connects to a respective LI structure and extends through the first bonding dielectric layer.

4. The method of claim 3, further comprising:

forming a respective backside power rail in contact with the at least one via.

5. The method of claim 3, further comprising:

forming at least one via opening to uncover the first bulk semiconductor material;

partially filling the at least one via opening with a filler material;

forming LI openings including a respective LI opening which connects to the at least one via opening;

removing the filler material; and filling the LI openings and the at least one via opening with a conductive material to form the LI structures and the at least one via.

6. The method of claim 1, after bonding the third wafer to the second wafer, the method further comprising:

forming LI structures connected to S/D structures of the second tier of transistors; and forming at least one via that connects to a respective LI structure and extends through the second bonding dielectric layer and the first bonding dielectric layer.

7. The method of claim 6, further comprising:

forming a respective backside power rail in contact with the at least one via.

8. The method of claim 6, further comprising:

forming at least one via opening to uncover the first bulk semiconductor material;

partially filling the at least one via opening with a filler material;

forming LI openings including a respective LI opening which connects to the at least one via opening;

removing the filler material; and filling the LI openings and the at least one via opening with a conductive material to form the LI structures and the at least one via.

9. The method of claim 1, further comprising:

forming at least one via that extends through the second bonding dielectric layer and is configured to electrically connect a first S/D structure of the first tier of transistors to a second S/D structure of the second tier of transistors.

10. The method of claim 1, further comprising:

forming a signal wiring layer over the second tier of transistors.

11. The method of claim 10, further comprising:

forming vias that connect the signal wiring layer to the first tier of transistors and the second tier of transistors.

12. The method of claim 1, before removing the first bulk semiconductor material to uncover the first bonding dielectric layer, the method further comprising:

bonding a carrier wafer to the third wafer.

13. The method of claim 1, after forming the power delivery network, the method further comprising:

bonding a carrier wafer to the backside power rails or forming a fourth bulk semiconductor material to cover the backside power rails.

* * * * *